US008471143B2

(12) United States Patent
Kawasaki et al.

(10) Patent No.: US 8,471,143 B2
(45) Date of Patent: *Jun. 25, 2013

(54) PHOTOELECTRIC CONVERSION ELEMENT AND SOLAR CELL

(75) Inventors: Hidekazu Kawasaki, Tokyo (JP); Akihiko Itami, Tokyo (JP); Kazuya Isobe, Tokyo (JP); Hideya Miwa, Tokyo (JP); Kazukuni Nishimura, Tokyo (JP); Mayuko Ushiro, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 451 days.

This patent is subject to a terminal disclaimer.

(21) Appl. No.: 12/766,493

(22) Filed: Apr. 23, 2010

(65) Prior Publication Data

US 2010/0282322 A1 Nov. 11, 2010

(30) Foreign Application Priority Data

Apr. 28, 2009 (JP) .................................. 2009108952

(51) Int. Cl.
*H01L 31/00* (2006.01)

(52) U.S. Cl.
USPC ........... 136/263; 136/261; 136/252; 252/500; 252/501.1

(58) Field of Classification Search
USPC ................ 136/263, 261, 252; 252/500, 501.1
See application file for complete search history.

(56) References Cited

U.S. PATENT DOCUMENTS

| | | | | |
|---|---|---|---|---|
| 4,684,537 | A | 8/1987 | Graetzel et al. | |
| 4,927,721 | A | 5/1990 | Gratzel et al. | |
| 5,061,569 | A | 10/1991 | VanSlyke et al. | |
| 5,084,365 | A | 1/1992 | Gratzel et al. | |
| 5,350,644 | A | 9/1994 | Graetzel et al. | |
| 5,463,057 | A | 10/1995 | Graetzel et al. | |
| 5,525,440 | A | 6/1996 | Kay et al. | |
| 6,911,595 | B2 * | 6/2005 | Yoshikawa et al. | 136/263 |
| 7,943,848 | B2 * | 5/2011 | Nishimura et al. | 136/263 |
| 8,247,687 | B2 * | 8/2012 | Miwa et al. | 136/263 |
| 2008/0115826 | A1 * | 5/2008 | Nishimura et al. | 136/252 |
| 2008/0296564 | A1 * | 12/2008 | Nishimura et al. | 257/40 |
| 2010/0263726 | A1 * | 10/2010 | Kawasaki et al. | 136/261 |
| 2010/0275988 | A1 * | 11/2010 | Kawasaki et al. | 136/256 |
| 2010/0288360 | A1 * | 11/2010 | Kawasaki et al. | 136/261 |
| 2012/0085411 | A1 * | 4/2012 | Isobe et al. | 136/263 |
| 2012/0152356 | A1 * | 6/2012 | Ishikawa et al. | 136/263 |
| 2012/0247562 | A1 * | 10/2012 | Nishimura et al. | 136/263 |

FOREIGN PATENT DOCUMENTS

| | | |
|---|---|---|
| JP | 04-308688 | 10/1992 |
| JP | 07-005706 | 1/1995 |
| JP | 07-005709 | 1/1995 |
| JP | 07-249790 | 9/1995 |
| JP | 2000-015007 | 1/2000 |
| JP | 2001-160427 | 6/2001 |
| JP | 2005063833 A * | 3/2005 |
| JP | 2005-123033 | 5/2005 |
| JP | 2005123033 | 5/2005 |
| JP | 2009-108952 | 5/2009 |

OTHER PUBLICATIONS

Citation Sheet from EP 2 246 916 A2.
Nature, 1991, vol. 353, 737.
Chem. Commun, 1999, 15-16.
Hyomen Kagaku, 2000 (5), 288.

* cited by examiner

*Primary Examiner* — Douglas McGinty
(74) *Attorney, Agent, or Firm* — Lucas & Mercanti, LLP

(57) ABSTRACT

Provided is a photoelectric conversion element containing a pair of opposite electrodes having therebetween: a semiconductor layer containing a sensitizing dye which is supported by a semiconductor; and a charge transport layer, wherein the sensitizing dye is a compound represented by Formula (1), Formula (1)

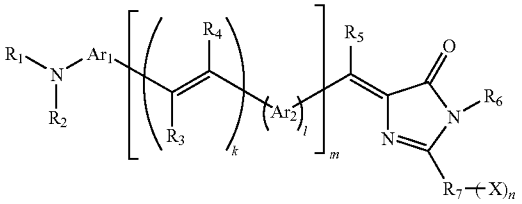

8 Claims, 1 Drawing Sheet

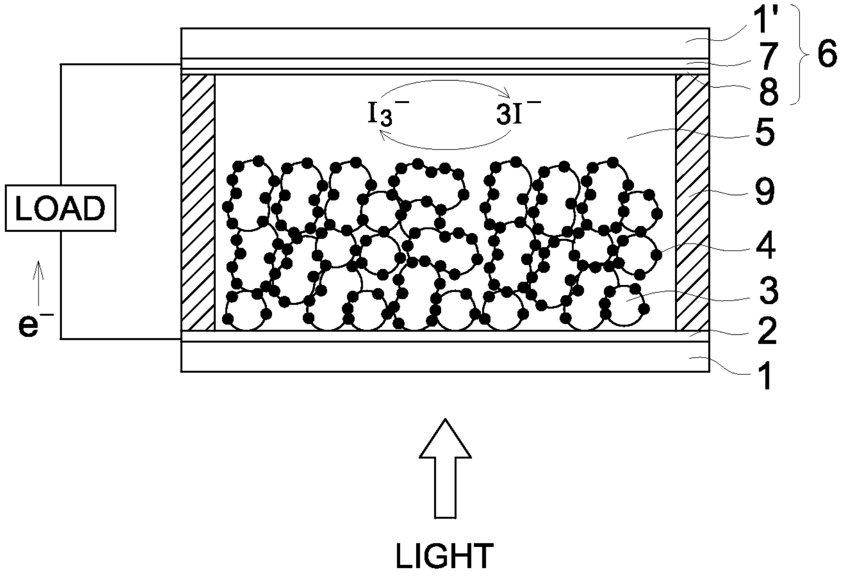
1'
7
8
6
$I_3^-$
$3I^-$
5
9
LOAD
4
3
$e^-$
2
1
LIGHT

PHOTOELECTRIC CONVERSION ELEMENT AND SOLAR CELL

CROSS REFERENCE TO RELATED APPLICATIONS

This application is based on Japanese Patent Application Nos. 2009-108952 filed on Apr. 28, 2009 with Japan Patent Office, the entire content of which is hereby incorporated by reference.

TECHNICAL FIELD

The present invention relates to a photoelectric conversion element using a new photosensitizing dye and a solar cell provided with the photoelectric conversion element.

BACKGROUND

In recent years, there has been actively studied application of solar light which is infinite and produces no harmful substances. Examples of the practical application of sunlight which is a clean energy source, at present, include inorganic solar cells for a residential application such as single crystalline silicon, polycrystalline silicon, amorphous silicon, cadmium telluride and indium-copper selenide.

However, one of the disadvantages of these inorganic solar cells is that, for example, in the case of a silicon solar cell, very high purity silicon is required, in which, naturally, the purification process is complicated and numerous processes are included, resulting in a high manufacturing cost.

On the other hand, many solar cells utilizing an organic material have also been proposed. Examples of an organic solar cell include: a Schottky-type photoelectric conversion element in which a p-type organic semiconductor and a metal having a small work function are connected; and a hetero-connection type photoelectric conversion element, in which a p-type organic semiconductor and an n-type inorganic semiconductor are connected or a p-type organic semiconductor and an electron accepting organic compound are connected. Organic semiconductors utilized in such an organic solar cell include, for example, a synthetic dye or a pigment such as chlorophyll and perylene; and a conductive polymer material such as polyacetylene, and complex materials thereof. These materials are made into thin film, by such as a vacuum evaporation method, a casting method or a dipping method, which constitutes a battery material. The organic material has advantages, for example, a low cost and easy application to a larger area; however, there are also problems, for example, conversion efficiency as low as not more than 1% in many materials; and poor durability.

In such a situation, a solar cell exhibiting excellent characteristics has been reported by Dr. Grätzel et al., in Switzerland (for example, refer to Non-Patent Document 1). The proposed cell is a dye sensitized solar cell, and is a wet type solar cell utilizing titanium oxide porous thin film, which is spectrally sensitized by a ruthenium complex, as a working electrode. Advantages of this method are that: a low priced oxide semiconductor such as titanium oxide can be used and the purification up to a high purity of this material is not required, resulting in attaining a low cost; and that usable light covers a broad visible light region, which enables efficient conversion of sunlight to electricity, since sunlight is rich in a visible light component.

On the contrary, since a ruthenium complex having a resource limitation is utilized, supply of a ruthenium complex is uncertain when this solar cell is utilized in practice. Further, this ruthenium complex is expensive and has a problem of stability in aging, however, this problem will be overcome if the material can be changed into a low priced and stable organic dye.

It has been disclosed that an element having high photoelectric conversion efficiency can be obtained when a compound having an amine of a rhodanine structure is utilized (for example, refer to Patent Document 1). However, these dyes have a problem of low photoelectric conversion efficiency compared with the element containing a ruthenium complex. There is required a sensitizing dye exhibiting a higher photoelectric conversion efficiency.

Patent Document 1: Japanese Patent Application Publication Open to Public Inspection No. 2005-123033 (hereinafter, referred to as JP-A No.)

Non-Patent Document 1: B. O'Regan, M. Gratzel, Nature, 353, 737 (1991)

SUMMARY

The present invention was achieved to resolve the above-described problems. An object of the present invention is to provide a photoelectric conversion element using a new photosensitizing dye having a long light absorption wavelength and exhibiting high photoelectric conversion efficiency, and to provide a solar cell using the aforesaid photoelectric conversion element.

The above-described problems of the present invention can be achieved by the following embodiments.

1. One of the embodiments of the present invention is a photoelectric conversion element comprising a pair of opposite electrodes having therebetween:

a semiconductor layer containing a sensitizing dye which is supported by a semiconductor, and a charge transport layer, wherein the sensitizing dye is a compound represented by Formula (1).

Formula (1)

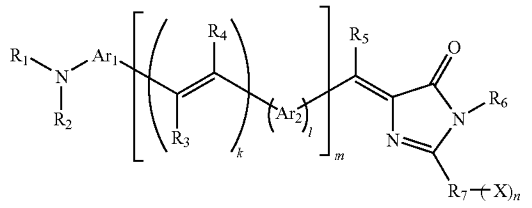

In Formula (1), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that $k+l \geqq 1$, and that when at least one of k and l is 2 or more, a plurality of $R_3$s, $R_4$s and $Ar_2$s may be the same or different;

m is an integer of 1 or more, and when m≧2, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; $R_7$ is a group substituted with X, and $R_7$ is derived from an alkyl, alkenyl, alkynyl, alkoxy, alkylthio, alkylseleno, amino, aryl or heterocyclic group, provided that $R_7$ may have a substituent other than X; X is an acid group; n is an integer of 1 or more, provided that when n≧2; and a plurality of Xs may be the same or different, provided that a cis form and a trans form with respect to a carbon to carbon double bond are included in Formula (1). A pair of $R_3$ and $R_4$, and a pair of $R_5$ and N in an imidazolone ring may be a cis position or a trans position.

2. Another embodiment of the present invention is a photoelectric conversion element of the above-described item 1, wherein the compound represented by Formula (1) is further represented by Formula (2).

Formula (2)

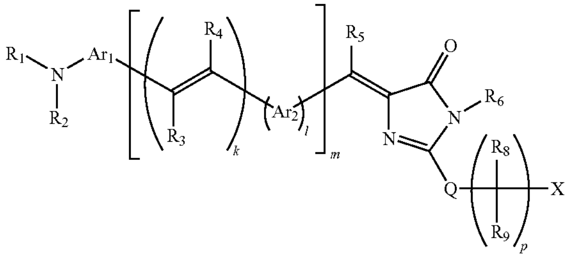

In Formula (2), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring, $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that k+l≧1, and that when at least one of k and l is 2 or more, a plurality of $R_3$s, $R_4$s and $Ar_2$s may be the same or different; m is an integer of 1 or more, and when m≧2, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; Q is a sulfur atom, an oxygen atom or a selenium atom; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when p≧2, a plurality of $R_8$s and $R_9$s may be the same or different; and X is an acid group, provided that a cis form and a trans form with respect to a carbon to carbon double bond are included in Formula (2). A pair of $R_3$ and $R_4$, and a pair of $R_5$ and N in an imidazolone ring may be a cis position or a trans position.

3. Another embodiment of the present invention is a photoelectric conversion element of the above-described item 2, wherein the compound represented by Formula (2) is further represented by Formula (3), in which Q in Formula (2) is a sulfur atom.

Formula (3)

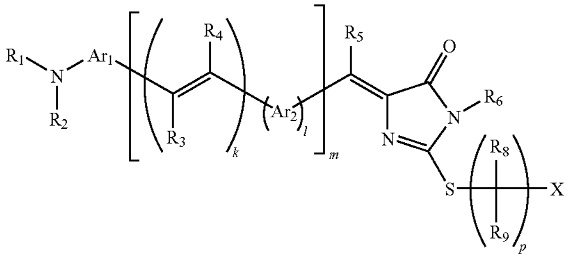

In Formula (3), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that k+l≧1, and that when at least one of k and l is 2 or more, a plurality of $R_3$s, $R_4$s and $Ar_2$s may be the same or different; m is an integer of 1 or more, and when m≧2, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when p≧2, a plurality of $R_8$s and $R_9$s may be the same or different; and X is an acid group, provided that a cis form and a trans form with respect to a carbon to carbon double bond are included in Formula (3). A pair of $R_3$ and $R_4$, and a pair of $R_5$ and N in an imidazolone ring may be a cis position or a trans position.

4. Another embodiment of the present invention is a photoelectric conversion element of the above-described item 3, wherein the compound represented by Formula (3) is further represented by Formula (4), in which $R_6$ in Formula (3) is a hydrogen atom.

Formula (4)

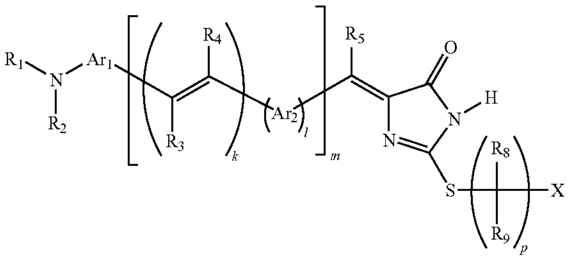

In Formula (4), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that k+l≧1, and that when at least one of k and l is 2 or more, a plurality of $R_3$s, $R_4$s and $Ar_2$s may be the same or different; m is an integer of 1 or more, and when m≧2, a plurality of $R_3$s, $R_4$s and $Ar_3$s may be the same or different; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when p≧2, a plurality of $R_8$s and $R_9$s may be the same or different; and X is an acid group, provided that a cis form and a trans form with respect to a carbon to carbon double bond are included in Formula (4). A pair of $R_3$ and $R_4$, and a pair of $R_5$ and N in an imidazolone ring may be a cis position or a trans position.

5. Another embodiment of the present invention is a photoelectric conversion element of the above-described item 4, wherein the compound represented by Formula (4) is further represented by Formula (5).

Formula (5)

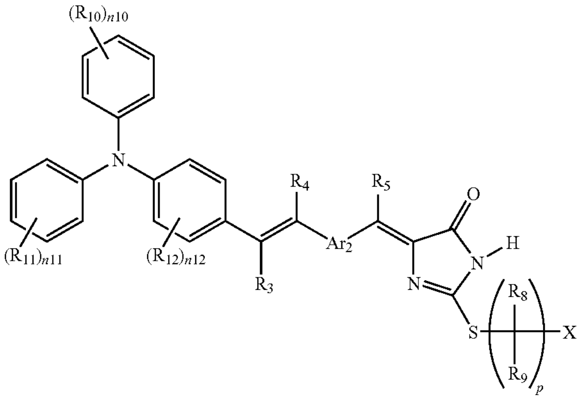

In Formula (5), $R_{10}$, $R_{11}$ and $R_{12}$ are each independently a hydrogen atom, a halogen atom, a substituted or unsubstituted alkyl, alkenyl, alkynyl, alkoxy, alkylthio, alkylseleno, amino, aryl or heterocyclic group; n10 and n11 are each independently an integer of 1 to 5, and n12 is an integer of 1 to 4, provided that when n10≧2, n11≧2, and n12≧2, a plurality of $R_{10}$s, $R_{11}$s and $R_{12}$s may be the same or different; $Ar_2$ is a substituted or unsubstituted arylene or heterocyclic group; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when p≧2, a plurality of $R_8$s and $R_9$s may be the same or different; and X is an acid group, provided that a cis form and a trans form with respect to a carbon to carbon double bond are included in Formula (1). A pair of $R_3$ and $R_4$, and a pair of $R_5$ and N in an imidazolone ring may be a cis position or a trans position.

6. Another embodiment of the present invention is a photoelectric conversion element of any one of the above-described items 1 to 5, wherein the semiconductor layer contains a plurality of compounds represented by Formulas (1) to (5).

7. Another embodiment of the present invention is a photoelectric conversion element of any one of the above-described items 1 to 6, wherein the semiconductor contained in the semiconductor layer is titanium oxide.

8. Another embodiment of the present invention is a solar cell comprising the photoelectric conversion element of any one of the above-described items 1 to 7.

It was achieved by the present invention to provide a photoelectric conversion element using a new photosensitizing dye having a long light absorption wavelength and exhibiting high photoelectric conversion efficiency, and to provide a solar cell using the aforesaid photoelectric conversion element.

BRIEF DESCRIPTION OF THE DRAWINGS

FIG. 1 is a schematic cross-sectional view showing an example of a photoelectric conversion element of the present invention.

DESCRIPTION OF THE PREFERRED EMBODIMENTS

As described above, in the past, although the compound having a triphenylamine structure has been known as a dye exhibiting high photoelectric conversion efficiency, its photoelectric conversion efficiency is inferior to the above-mentioned ruthenium complex dye. Therefore, the thither improvement of the photoelectric conversion efficiency has been requested.

As a result of the study of the present inventors, it was supposed that when the molar extinction coefficient of the compound is increased, a light can be incorporated broadly to result in improving the photoelectric conversion efficiency. Then, when a new type of compound having a triphenylamine structure exhibiting a high molar extinction coefficient was examined, it was revealed that the photoelectric conversion element using this compound exhibited high photoelectric conversion efficiency. This new dye has a large molar extinction coefficient, and its light absorption wavelength is longer than the triphenylamine compounds having a conventionally known structure. As a result, this compound can take in the light of long wavelength efficiently, and it was presumed that the photoelectric conversion efficiency was improved. Moreover, this new dye has a high LUMO electron density at an oxygen atom in the carbonyl group which exists on the $4^{th}$ position of the imidazole ring. As a result, it is presumed that efficient electron injection to a semiconductor is realized by this dye.

Hereafter, the present invention will be further described in details.

[Photoelectric Conversion Element]

The photoelectric conversion element of the present invention will be described with reference to the FIGURE.

FIG. 1 is a schematic cross-sectional view showing an example of a photoelectric conversion element of the present invention.

As shown in FIG. 1, the photoelectric conversion element possesses substrate 1, substrate 1', transparent conductive film 2, transparent conductive film 7, semiconductor 3, sensitizing dye 4, charge transport layer 5, partition wall 9

The photoelectric transducer of the present invention has a semiconductor layer having pores formed via sintering of particles of semiconductor 3 provided on substrate 1 (it is also called as a conductive support) on which transparent conductive film 2 is placed, and sensitizing dye 4 is adsorbed on the semiconductor surface.

As opposite electrode 6 which forms a pair of opposite electrodes, the electrode prepared as follows is used: transparent conductive layer 7 is formed on substrate 1'; and platinum 8 is deposited thereon via evaporation. Between the opposite electrodes, there is provided a charge transport layer formed by filling electrolyte 5. Terminals are attached to the transparent conducting films 2 and 7, and a photocurrent is taken out.

The present invention relates to a new photosensitizing dye, and a photoelectric conversion element using the new photosensitizing dye and further a solar cell provided with the photoelectric conversion element.

<<Compound Represented by Formula (1)>>

The compound represented by Formula (1) will be described below. In Formula (1), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that $k+l \geqq 1$, and that when at least one of k and is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; $R_7$ is a group substituted with X, and $R_7$ is derived from an alkyl, alkenyl, alkynyl, alkoxy, alkylthio, alkylseleno, amino, aryl or heterocyclic group, provided that $R_7$ may have a substituent other than X; X is an acid group; n is an integer of 1 or more, provided that when $n \geqq 2$, a plurality of Xs may be the same or different; and $R_3$ and $R_4$ may be in a cis or a trans position with respect to a carbon to carbon double bond.

As an arylene group represented by $Ar_1$ and $Ar_2$, a phenylene group and a tolylene group are cited; and as a heterocyclic, a furanyl group, a thienyl group, an imidazolyl group, a thiazolyl group and a morphonyl group are cited.

As an alkyl group represented by $R_1$ and $R_2$, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group and a cyclohexyl group are cited; as an alkenyl group, a vinyl group, 1-propenyl group, 2-propenyl group, 2-butenyl group and an allyl group are cited; as an alkynyl group, a propargyl group and 3-pentynyl group are cited; as an aryl group, a phenyl group, a naphthyl group and an anthracenyl group are cited; as a heterocyclic group, a furanyl group, a thienyl group, an imidazolyl group, a thiazolyl group and a morphonyl group are cited.

As a halogen atom represented by $R_3$, $R_4$ and $R_5$, a chlorine atom, a bromine atom and a fluorine atom are cited; as an alkoxy group, a methoxy group, an ethoxy group, a propoxy group and a butoxy group are cited; as an amino group, an amino group, an ethylamino group, a dimethylamino group, a butylamino group and a cyclopenthylamino group are cited.

As an alkoxy group represented by $R_7$, a methoxy group, an ethoxy group, a propoxy group and a butoxy group are cited; as an alkylthio group, a methylthio group, an ethylthio group, a propylthio group, an isopropylthio group, a butylthio group, a tert-butylthio group and a hexylthio group are cited; as an alkylseleno group, a methylseleno group, an ethylseleno group, a propylseleno group, a butylseleno group and a hexylseleno group are cited; and as an amino group, an amino group, an ethylamino group, a dimethylamino group, a butylamino group and a cyclopenthylamino group are cited. X is substituted on the above-described alkyl group, alkenyl group, alkynyl group, alkoxy group, alkylthio group, alkylseleno group, amino group, aryl group and heterocylic group.

A substituted or unsubstituted alkyl, alkenyl, alkynyl, alkoxy, aryl, and heterocyclic group represented by $R_3$ to $R_7$ are synonymous with the groups cited for $R_1$ and $R_2$.

X is an acid group. Examples thereof are: a carboxyl group, a sulfo group, a sulfino group, a sulfinyl group, a phosphoryl group, a phosphinyl group, a phosphono group, a phosphonyl group, sulfonyl groups and those salts. Among them, a carboxyl group and a sulfonyl group are preferable.

As a substituent for the above-mentioned groups, there are cited as follows: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group, a pentadecyl group, a cyclopentyl group and a cyclohexyl group); alkenyl groups (for example, a vinyl group, 1-propenyl group, 2-propenyl group, 2-butenyl group and an allyl group); aryl groups (for example, a phenyl group, a naphthyl group and an anthracenyl group); a hydroxyl group, an amino group, a thiol group, a cyano group; halogen atoms (for example, a chlorine atom, a bromine atom and a fluorine atom); and heterocyclic groups (for example, a pyrrolidyl group, an imidazolydyl group, the morpholyl group, the oxazolydyl group, 2-tetrahydro furanyl group, 2-tetrahydro thienyl group, 2-tetrahydropyranyl group and 3-tetrahydro pyranyl group). Moreover, a plurality of these substituents may be combined to form a ring.

<<Compound Represented by Formula (2)>>

Among the compounds represented by Formula (1), the compounds represented by Formula (2) are preferable since they exhibit high photoelectric conversion efficiency.

In Formula (2), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, $k+l \geqq 1$, and that when at least one of k and l is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; Q is a sulfur atom, an oxygen atom or a selenium atom; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_5$s and $R_9$s may be the same or different; X is an acid group; provided that a cis form and a trans form with respect to a carbon to carbon double bond are included in Formula (2). A pair of $R_3$ and $R_4$, and a pair of $R_5$ and N in an imidazolone ring may be a cis position or a trans position.

As a halogen atom represented by $R_8$ and $R_9$, a chlorine atom, a bromine atom and a fluorine atom are cited; as a substituted or unsubstituted alkyl, alkenyl, alkynyl, alkoxy, amino, aryl and heterocyclic group, they are the same as cited for alkyl, alkenyl, alkynyl, alkoxy, amino, aryl and heterocyclic group represented by $R_3$ in Formula (1).

In Formula (2), $Ar_1$, $Ar_2$, $R_1$ to $R_6$ and X are synonymous with $Ar_1$, $Ar_2$, $R_1$ to $R_6$ and X in Formula (1).

<<Compound Represented by Formula (3)>>

The compounds represented by Formula (3), which correspond to the compounds represented by Formula (2) having a sulfur atom as Q, are preferable since they exhibit high photoelectric conversion efficiency.

In Formula (3), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, $k+l \geqq 1$, and that when at least one of k and l is 2 or more, a plurality of $R_a$s, $R_4$s and $Ar_2$s may be the same or different; m is an integer of 1 or more, and when $m \geqq 2$, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different; X is an acid group; provided that a cis form and a trans form with respect to a carbon to carbon double bond are included in Formula (3). A pair of $R_3$ and $R_4$, and a pair of $R_5$ and N in an imidazolone ring may be a cis position or a trans position.

In Formula (3), $Ar_1$, $Ar_2$, $R_1$ to $R_6$, $R_8$, $R_9$ and X are synonymous with $Ar_1$, $Ar_2$, $R_1$ to $R_6$, $R_8$, $R_9$ and X in Formula (2).

<<Compound Represented by Formula (4)>>

The compounds represented by Formula (4), which correspond to the compounds represented by Formula (3) having a hydrogen atom as $R_6$, are preferable since they exhibit high photoelectric conversion efficiency.

In Formula (4), $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, $k+l \geqq 1$, and that when at least one of k and l is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different X is an acid group; provided that a cis form and a trans form with respect to a carbon to carbon double bond are included in Formula (4). A pair of $R_3$ and $R_4$, and a pair of $R_5$ and N in an imidazolone ring may be a cis position or a trans position.

In Formula (4), $Ar_1$, $Ar_2$, $R_1$ to $R_5$, $R_8$, $R_9$ and X are synonymous with $Ar_1$, $Ar_2$, $R_1$ to $R_5$, $R_8$, $R_9$ and X in Formula (3).

<<Compound Represented by Formula (5)>>

It is preferable that the compounds represented by Formula (4) are the compounds represented by Formula (5).

In Formula (5), $R_{10}$, $R_{11}$ and $R_{12}$ are each independently a hydrogen atom, a halogen atom, a substituted or unsubstituted alkyl, alkenyl, alkynyl, alkoxy, alkylthio, alkylseleno, amino, aryl or heterocyclic group; n10 and n11 are each independently an integer of 1 to 5, and n12 is an integer of 1 to 4, provided that when $n10 \geqq 2$, $n11 \geqq 2$, and $n12 \geqq 2$, a plurality of $R_{10}$s, $R_{11}$s and $R_{12}$s may be the same or different; $Ar_2$ is a substituted or unsubstituted arylene or heterocyclic group; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different; X is an acid group; provided that a cis form and a trans form with respect to a carbon to carbon double bond are included in Formula (1). A pair of $R_3$ and $R_4$, and a pair of $R_5$ and N in an imidazolone ring may be a cis position or a trans position.

As an alkylthio group represented by $R_{10}$, $R_{11}$ and $R_{12}$, a methylthio group, an ethylthio group, a propylthio group, an isopropylthio group, a butylthio group, a tert-butylthio group and a hexylthio group are cited; and as an alkylseleno group, a methylseleno group, an ethylseleno group, a propylseleno group, a butylseleno group and a hexylseleno group are cited.

A halogen atom, a substituted or unsubstituted alkyl, alkenyl, alkynyl, alkoxy, alkylthio, alkylseleno, amino, aryl and heterocyclic group represented by $R_{10}$, $R_{11}$ and $R_{12}$ are synonymous with a halogen atom, a substituted or unsubstituted alkyl, alkenyl, alkynyl, alkoxy, alkylthio, alkylseleno, amino, aryl and heterocyclic group represented by $R_3$ in Formula (1).

In Formula (5), $Ar_2$, $R_3$ to $R_5$, $R_8$, $R_9$ and X are synonymous with $Ar_2$, $R_3$ to $R_5$, $R_8$, $R_9$ and X in Formula (4).

Specific example compounds represented by Formulas (1) to (5) are shown below, however, the present invention is not limited to these. In the table, the partial structure in which a wavy line is shown indicates the linking site of in Formulas (1) to (5).

| | $R_3$ | $R_4$ | k | $Ar_2$ | l | m |
|---|---|---|---|---|---|---|
| Z1 | H | H | 1 | 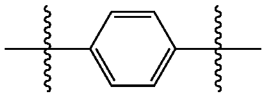 | 1 | 1 |
| Z2 | H | H | 1 | 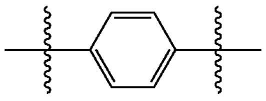 [SMILES: *c1ccc(*)cc1] | 1 | 2 |
| Z3 | H | H | 1 | 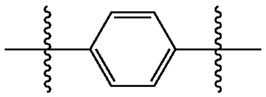 | 1 | 3 |
| Z4 | H | H | 2 | 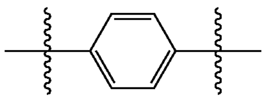 | 1 | 1 |

-continued
| | $R_3$ | $R_4$ | k | $Ar_2$ | l | m |
|---|---|---|---|---|---|---|
| Z5 | H | Br | 1 | 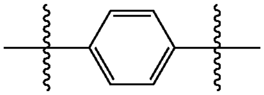 [SMILES: *c1ccc(*)cc1] | 1 | 1 |
| Z6 | Me | H | 1 | — | 0 | 1 |
| Z7 | — | — | 0 | 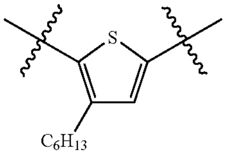 | 1 | 4 |
| Z8 | — | — | 0 | 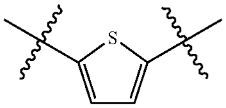 [SMILES: *c1ccc(*)s1] | 1 | 1 |
-continued
| | $R_3$ | $R_4$ | k | $Ar_2$ | l | m |
|---|---|---|---|---|---|---|
| Z9 | H | CN | 1 | 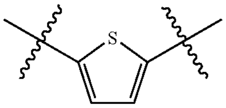 | 2 | 1 |
| Z10 | H | H | 1 | 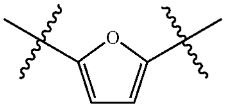 | 1 | 1 |
 : indicates a linking position

| Compound | $R_1$ | $R_2$ | $Ar_1$ | Z | $R_5$ | $R_6$ | $-R_7-(X)_n$ |
|---|---|---|---|---|---|---|---|
| 1 | 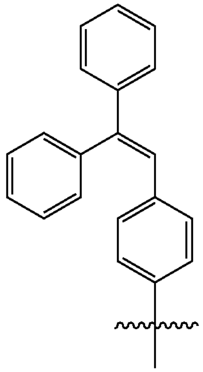 [SMILES: *c1ccc(C=C(c2ccccc2)c2ccccc2)cc1] | 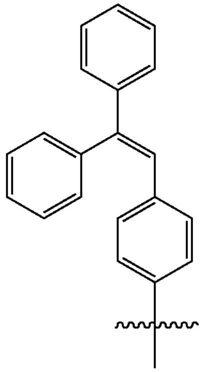 [SMILES: *c1ccc(C=C(c2ccccc2)c2ccccc2)cc1] | 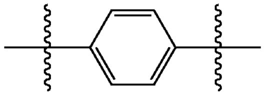 [SMILES: *c1ccc(*)cc1] | Z1 | H | H | 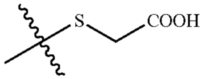 [SMILES: *SCC(=O)O] |
| 2 | 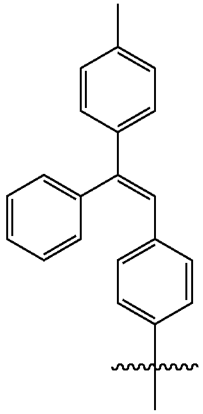 | 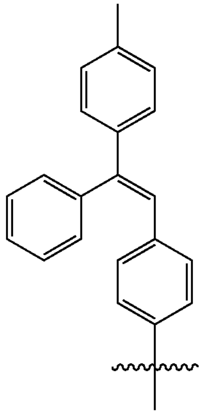 | 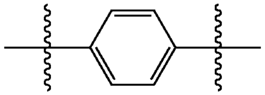 [SMILES: *c1ccc(*)cc1] | Z1 | H | H | 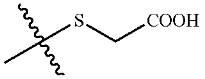 [SMILES: *SCC(=O)O] |

-continued
| | | | | | | | |
|---|---|---|---|---|---|---|---|
| 3 | 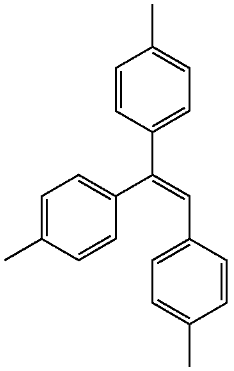 | 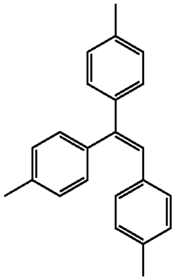 | 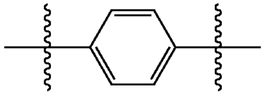 [SMILES: *c1ccc(*)cc1] | Z1 | H | H | 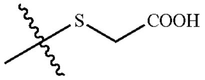 [SMILES: *SCC(=O)O] |
| 4 | 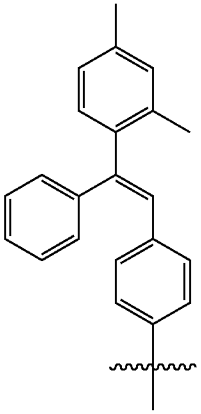 [SMILES: *c1ccc(/C=C(\c2ccccc2)c2ccc(C)cc2C)cc1] | 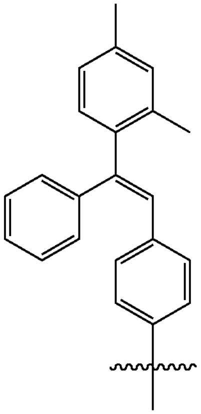 | 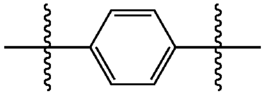 [SMILES: *c1ccc(*)cc1] | Z1 | H | H | 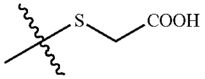 |

-continued
| | | | | | | | |
|---|---|---|---|---|---|---|---|
| 5 | 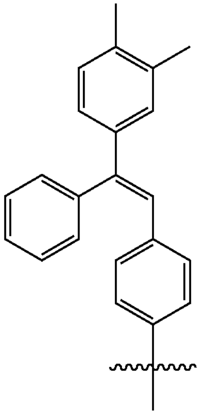 [SMILES: *c1ccc(/C=C(\c2ccccc2)c2ccc(C)c(C)c2)cc1] | 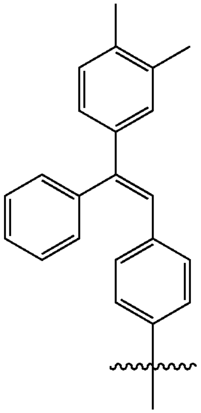 [SMILES: *c1ccc(/C=C(\c2ccccc2)c2ccc(C)c(C)c2)cc1] | 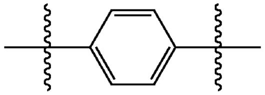 [SMILES: *c1ccc(*)cc1] | Z1 | H | H | 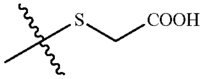 |
| 6 | 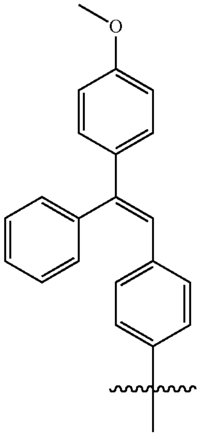 [SMILES: *c1ccc(/C=C(\c2ccccc2)c2ccc(OC)cc2)cc1] | 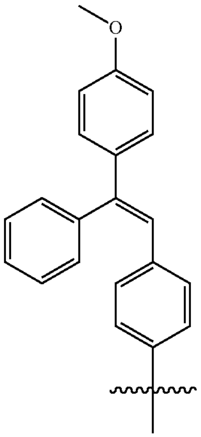 [SMILES: *c1ccc(/C=C(\c2ccccc2)c2ccc(OC)cc2)cc1] | 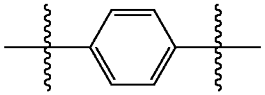 | Z1 | H | H | 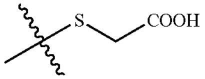 |

-continued
| | | | | | | | |
|---|---|---|---|---|---|---|---|
| 7 | 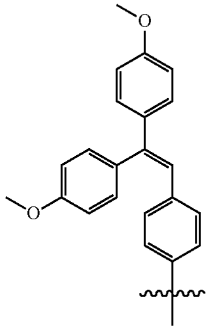 [SMILES: *c1ccc(C=C(c2ccc(OC)cc2)c2ccc(OC)cc2)cc1] | 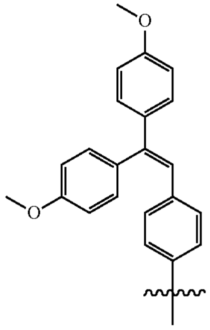 [SMILES: *c1ccc(C=C(c2ccc(OC)cc2)c2ccc(OC)cc2)cc1] | 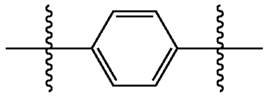 | Z1 | H | H | 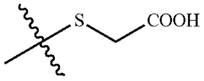 |
| 8 | 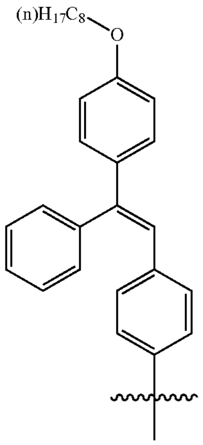 | 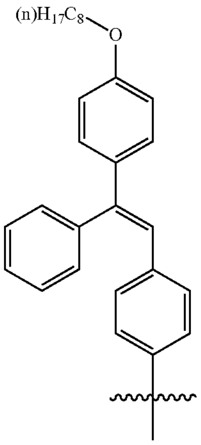 | 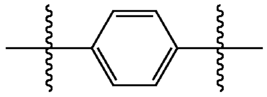 [SMILES: *c1ccc(*)cc1] | Z1 | H | H | 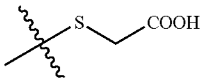 |

-continued
| | | | | | | | |
|---|---|---|---|---|---|---|---|
| 9 | 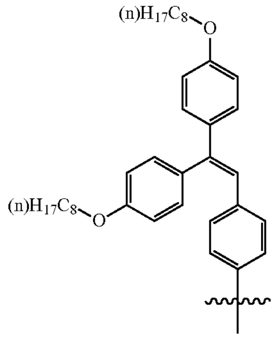 | 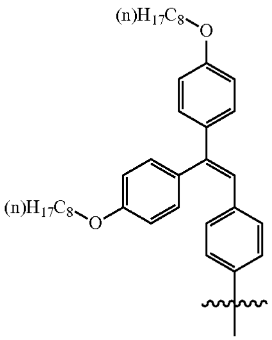 | 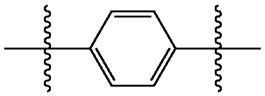 [SMILES: *c1ccc(*)cc1] | Z1 | H | H | 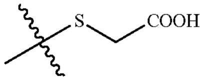 [SMILES: *SCC(=O)O] |
| 10 | 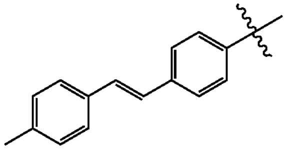 [SMILES: *c1ccc(/C=C/c2ccc(C)cc2)cc1] | 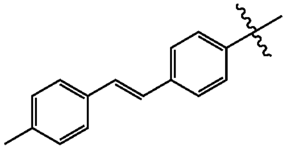 [SMILES: *c1ccc(/C=C/c2ccc(C)cc2)cc1] | 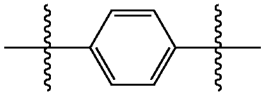 | Z1 | H | H | 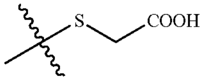 |
| 11 | 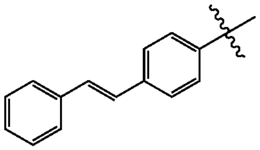 [SMILES: *c1ccc(/C=C/c2ccccc2)cc1] | 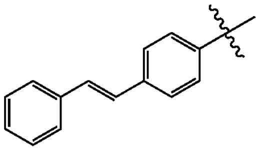 [SMILES: *c1ccc(/C=C/c2ccccc2)cc1] | 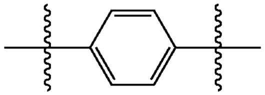 [SMILES: *c1ccc(*)cc1] | Z1 | H | H | 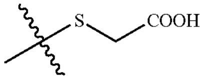 |
| 12 | 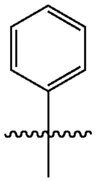 [SMILES: *c1ccccc1] | 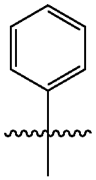 | 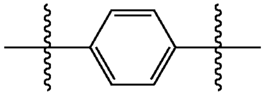 | Z1 | H | H | 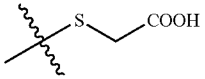 |
| 13 | 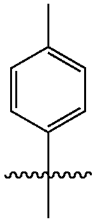 [SMILES: *c1ccc(C)cc1] | 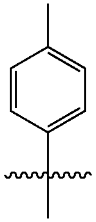 [SMILES: *c1ccc(C)cc1] | 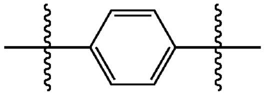 [SMILES: *c1ccc(*)cc1] | Z1 | H | H | 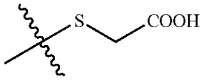 |

-continued
| | | | | | | | |
|---|---|---|---|---|---|---|---|
| 14 | 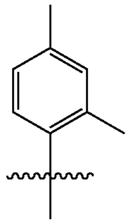 [SMILES: *c1ccc(C)cc1C] | 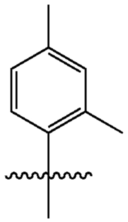 [SMILES: *c1ccc(C)cc1C] | 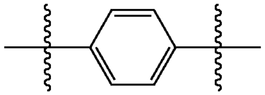 | Z1 | H | H | 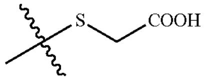 |
| 15 | 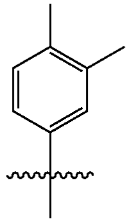 [SMILES: *c1ccc(C)c(C)c1] | 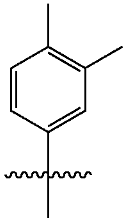 [SMILES: *c1ccc(C)c(C)c1] | 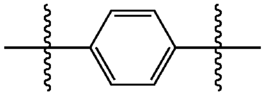 [SMILES: *c1ccc(*)cc1] | Z1 | H | H | 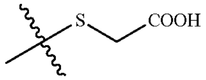 |
| 16 | 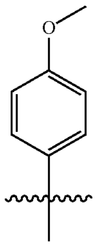 [SMILES: *c1ccc(OC)cc1] | 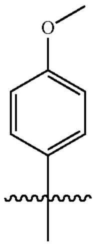 | 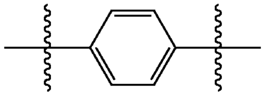 [SMILES: *c1ccc(*)cc1] | Z1 | H | H | 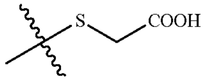 |
| 17 | 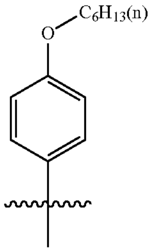 | 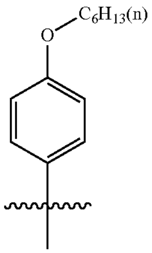 | 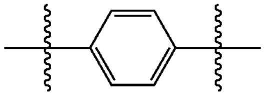 [SMILES: *c1ccc(*)cc1] | Z1 | H | H | 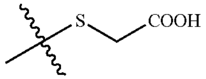 [SMILES: *SCC(=O)O] |

-continued
| | | | | | | | |
|---|---|---|---|---|---|---|---|
| 18 | 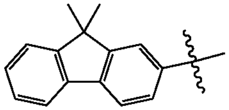 [SMILES: *c1ccc2c(c1)C(C)(C)c1ccccc1-2] | 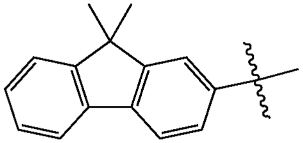 [SMILES: *c1ccc2c(c1)C(C)(C)c1ccccc1-2] | 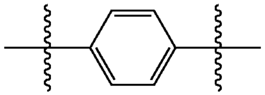 [SMILES: *c1ccc(*)cc1] | Z1 | H | H | 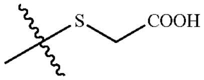 |
| 19 | 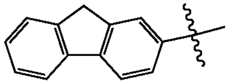 | 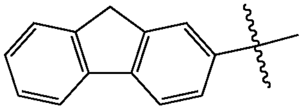 [SMILES: *c1ccc2c(c1)Cc1ccccc1-2] | 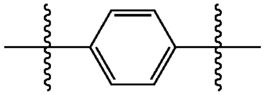 [SMILES: *c1ccc(*)cc1] | Z1 | H | H | 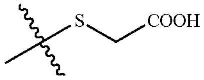 |
| 20 | 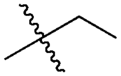 [SMILES: *CC] | 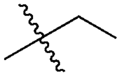 [SMILES: *CC] | 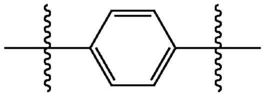 [SMILES: *c1ccc(*)cc1] | Z1 | H | H | 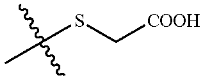 [SMILES: *SCC(=O)O] |
| 21 | 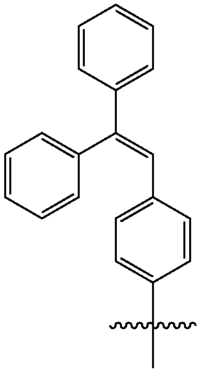 [SMILES: *c1ccc(C=C(c2ccccc2)c2ccccc2)cc1] | 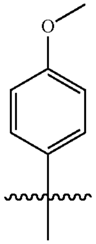 [SMILES: *c1ccc(OC)cc1] | 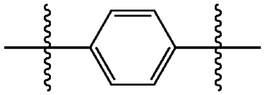 [SMILES: *c1ccc(*)cc1] | Z1 | H | H | 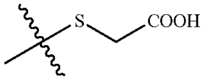 [SMILES: *SCC(=O)O] |

-continued
| | | | | | | | |
|---|---|---|---|---|---|---|---|
| 22 | 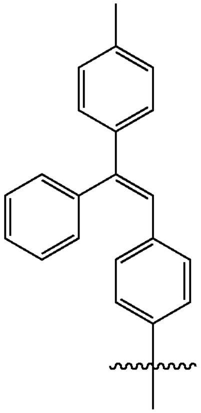 | 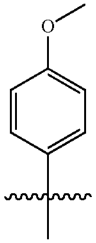 [SMILES: *c1ccc(OC)cc1] | 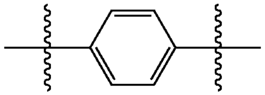 [SMILES: *c1ccc(*)cc1] | Z1 | H | H | 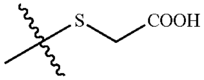 |
| 23 | 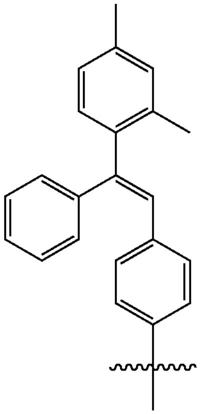 [SMILES: *c1ccc(/C=C(\c2ccccc2)c2ccc(C)cc2C)cc1] | 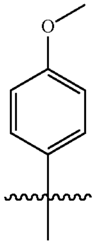 [SMILES: *c1ccc(OC)cc1] | 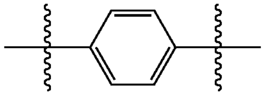 [SMILES: *c1ccc(*)cc1] | Z1 | H | H | 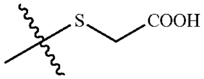 |

-continued
| | | | | | | | |
|---|---|---|---|---|---|---|---|
| 24 | 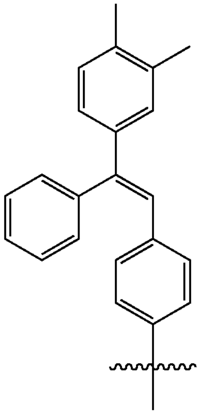 [SMILES: *c1ccc(/C=C(\c2ccccc2)c2ccc(C)c(C)c2)cc1] | 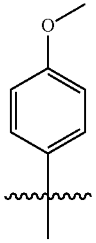 [SMILES: *c1ccc(OC)cc1] | 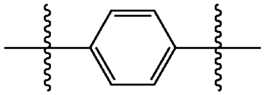 [SMILES: *c1ccc(*)cc1] | Z1 | H | H | 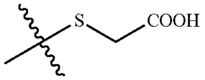 [SMILES: *SCC(=O)O] |
| 25 | 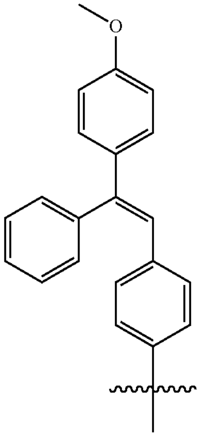 [SMILES: *c1ccc(/C=C(\c2ccccc2)c2ccc(OC)cc2)cc1] | 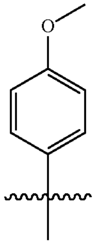 [SMILES: *c1ccc(OC)cc1] | 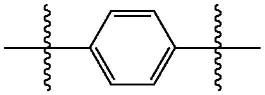 [SMILES: *c1ccc(*)cc1] | Z1 | H | H | 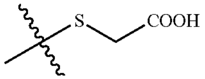 |

-continued
| | | | | | | | |
|---|---|---|---|---|---|---|---|
| 26 | 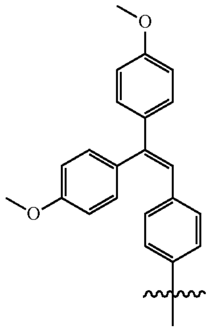 [SMILES: *c1ccc(C=C(c2ccc(OC)cc2)c2ccc(OC)cc2)cc1] | 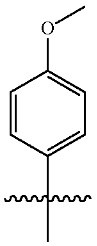 [SMILES: *c1ccc(OC)cc1] | 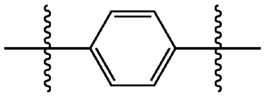 [SMILES: *c1ccc(*)cc1] | Z1 | H | H | 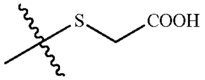 |
| 27 | 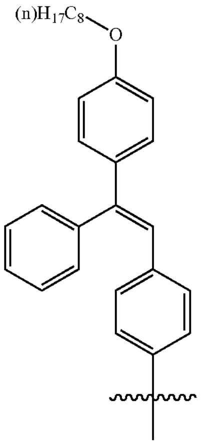 | 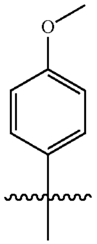 [SMILES: *c1ccc(OC)cc1] | 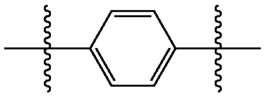 | Z1 | H | H | 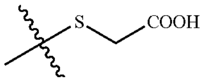 |
| 28 | 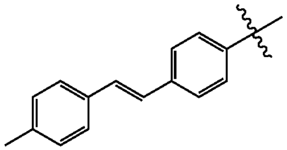 [SMILES: *c1ccc(/C=C/c2ccc(C)cc2)cc1] | 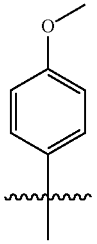 | 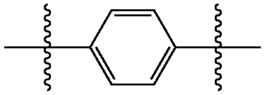 [SMILES: *c1ccc(*)cc1] | Z1 | H | H | 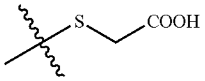 |

-continued
| | | | | | | | |
|---|---|---|---|---|---|---|---|
| 29 | 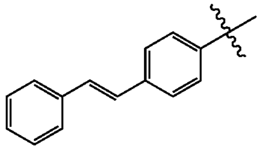 [SMILES: *c1ccc(/C=C/c2ccccc2)cc1] | 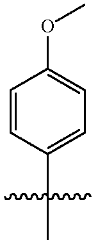 [SMILES: *c1ccc(OC)cc1] | 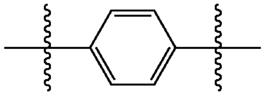 [SMILES: *c1ccc(*)cc1] | Z1 | H | H | 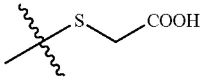 |
| 30 | 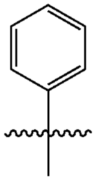 [SMILES: *c1ccccc1] | 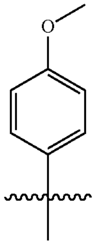 [SMILES: *c1ccc(OC)cc1] | 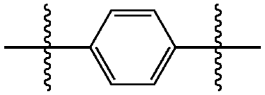 [SMILES: *c1ccc(*)cc1] | Z1 | H | H | 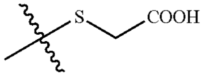 |
| 31 | 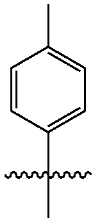 [SMILES: *c1ccc(C)cc1] | 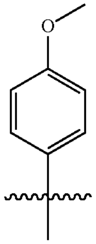 [SMILES: *c1ccc(OC)cc1] | 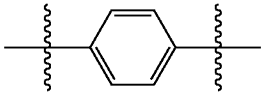 [SMILES: *c1ccc(*)cc1] | Z1 | H | H | 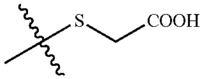 |
| 32 | 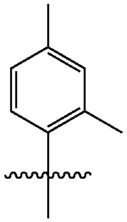 [SMILES: *c1ccc(C)cc1C] | 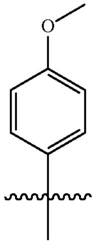 | 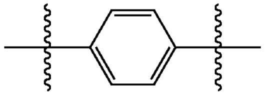 [SMILES: *c1ccc(*)cc1] | Z1 | H | H | 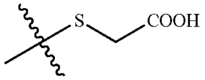 |

-continued
| | | | | | | | |
|---|---|---|---|---|---|---|---|
| 33 | 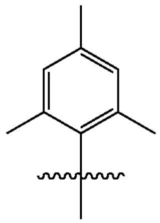 | 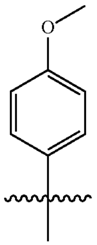 [SMILES: *c1ccc(OC)cc1] | 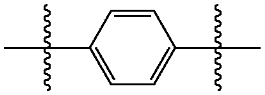 [SMILES: *c1ccc(*)cc1] | Z1 | H | H | 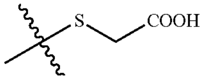 |
| 34 | 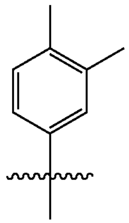 [SMILES: *c1ccc(C)c(C)c1] | 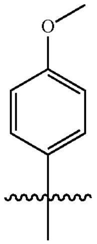 | 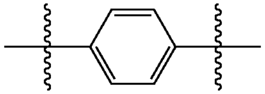 [SMILES: *c1ccc(*)cc1] | Z1 | H | H | 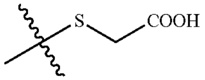 |
| 35 | 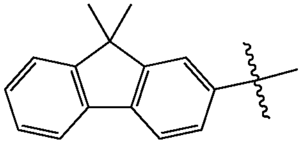 [SMILES: *c1ccc2c(c1)C(C)(C)c1ccccc1-2] | 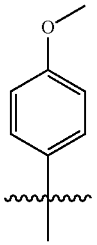 [SMILES: *c1ccc(OC)cc1] | 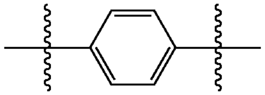 | Z1 | H | H | 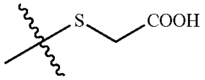 [SMILES: *SCC(=O)O] |
| 36 | 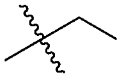 [SMILES: *CC] | 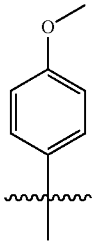 [SMILES: *c1ccc(OC)cc1] | 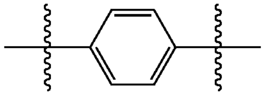 [SMILES: *c1ccc(*)cc1] | Z1 | H | H | 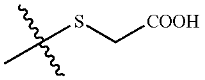 [SMILES: *SCC(=O)O] |

-continued
| | | | | | | | |
|---|---|---|---|---|---|---|---|
| 37 | 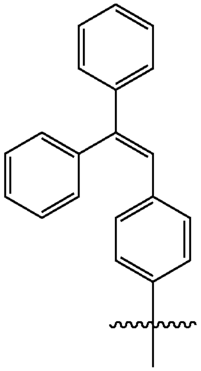 [SMILES: *c1ccc(C=C(c2ccccc2)c2ccccc2)cc1] | 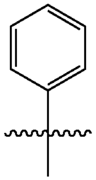 [SMILES: *c1ccccc1] | 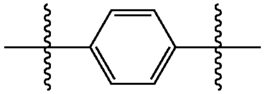 [SMILES: *c1ccc(*)cc1] | Z1 | H | H | 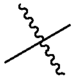 |
| 38 | 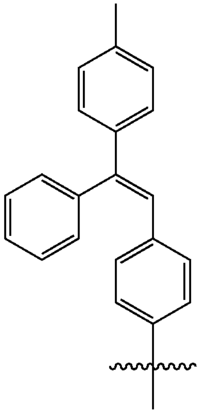 | 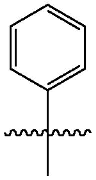 [SMILES: *c1ccccc1] | 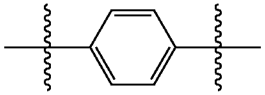 | Z1 | H | H | 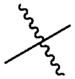 |

-continued
| | | | | | | | |
|---|---|---|---|---|---|---|---|
| 39 | 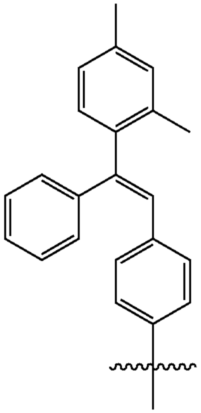 | 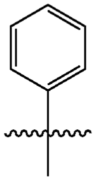 | 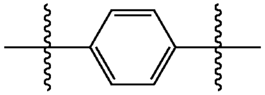 [SMILES: *c1ccc(*)cc1] | Z1 | H | H | 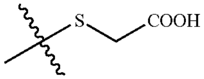 |
| 40 | 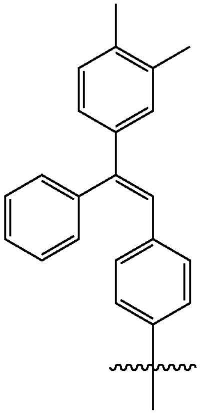 | 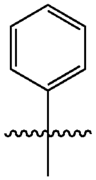 [SMILES: *c1ccccc1] | 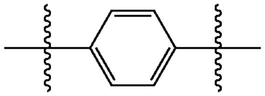 [SMILES: *c1ccc(*)cc1] | Z1 | H | H | 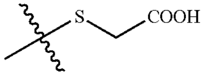 [SMILES: *SCC(=O)O] |

-continued
| | | | | | | | |
|---|---|---|---|---|---|---|---|
| 41 | 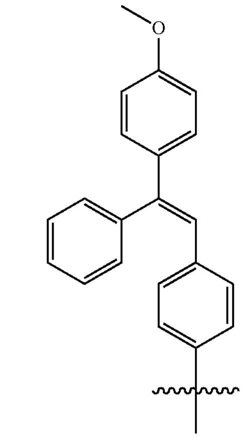 [SMILES: *c1ccc(/C=C(\c2ccccc2)c2ccc(OC)cc2)cc1] | 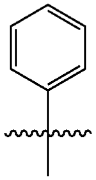 | 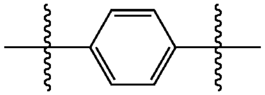 [SMILES: *c1ccc(*)cc1] | Z1 | H | H | 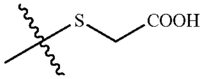 [SMILES: *SCC(=O)O] |
| 42 | 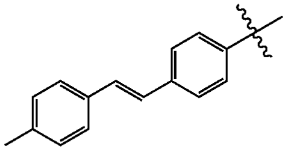 [SMILES: *c1ccc(/C=C/c2ccc(C)cc2)cc1] | 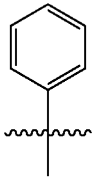 [SMILES: *c1ccccc1] | 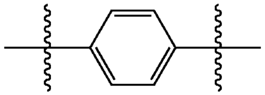 [SMILES: *c1ccc(*)cc1] | Z1 | H | H | 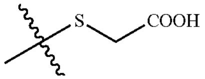 |
| 43 | 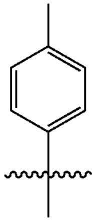 [SMILES: *c1ccc(C)cc1] | 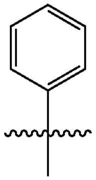 | 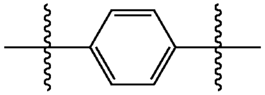 [SMILES: *c1ccc(*)cc1] | Z1 | H | H | 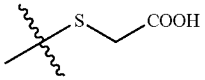 |
| 44 | 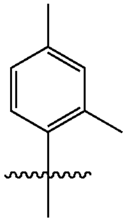 [SMILES: *c1ccc(C)cc1C] | 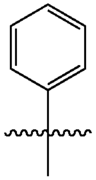 [SMILES: *c1ccccc1] | 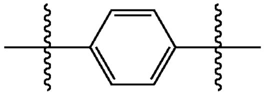 [SMILES: *c1ccc(*)cc1] | Z1 | H | H | 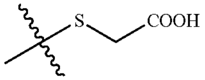 |

-continued
| | | | | | | | |
|---|---|---|---|---|---|---|---|
| 45 | 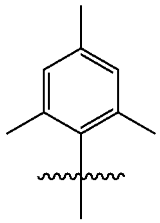 | 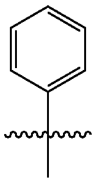 | 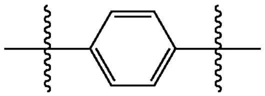 [SMILES: *c1ccc(*)cc1] | Z1 | H | H | 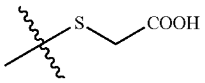 |
| 46 | 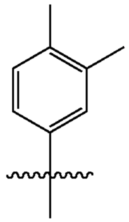 [SMILES: *c1ccc(C)c(C)c1] | 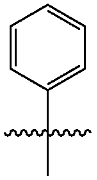 [SMILES: *c1ccccc1] | 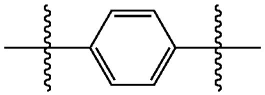 [SMILES: *c1ccc(*)cc1] | Z1 | H | H | 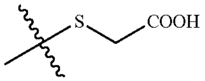 |
| 47 | 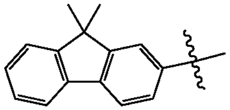 [SMILES: *c1ccc2c(c1)C(C)(C)c1ccccc1-2] | 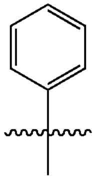 [SMILES: *c1ccccc1] | 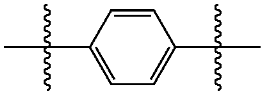 [SMILES: *c1ccc(*)cc1] | Z1 | H | H | 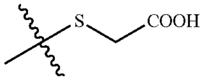 |
| 48 | 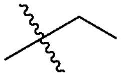 | 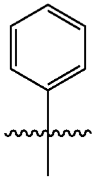 [SMILES: *c1ccccc1] | 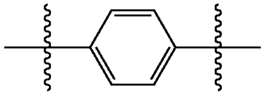 | Z1 | H | H | 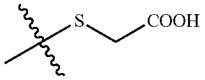 [SMILES: *SCC(=O)O] |

-continued
| | | | | | | | |
|---|---|---|---|---|---|---|---|
| 49 | 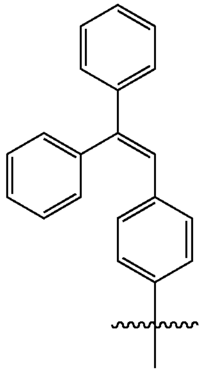 [SMILES: *c1ccc(C=C(c2ccccc2)c2ccccc2)cc1] | 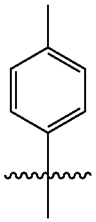 | 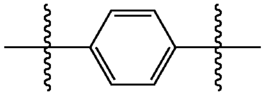 [SMILES: *c1ccc(*)cc1] | Z1 | H | H | 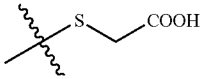 |
| 50 | 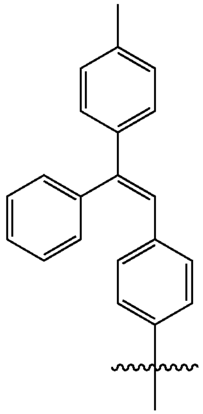 [SMILES: *c1ccc(/C=C(\c2ccccc2)c2ccc(C)cc2)cc1] | 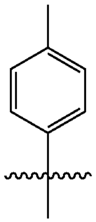 [SMILES: *c1ccc(C)cc1] | 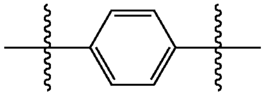 [SMILES: *c1ccc(*)cc1] | Z1 | H | H | 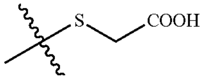 |

-continued
| | | | | | | | |
|---|---|---|---|---|---|---|---|
| 51 | 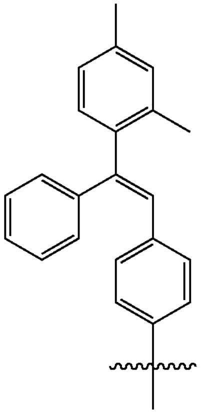 [SMILES: *c1ccc(/C=C(\c2ccccc2)c2ccc(C)cc2C)cc1] | 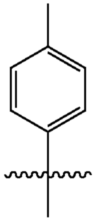 [SMILES: *c1ccc(C)cc1] | 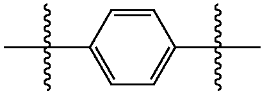 [SMILES: *c1ccc(*)cc1] | Z1 | H | H | 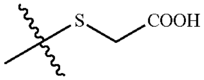 |
| 52 | 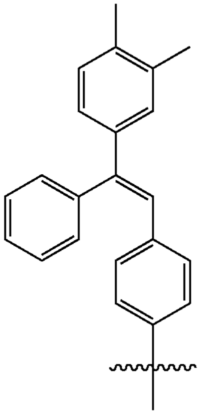 [SMILES: *c1ccc(/C=C(\c2ccccc2)c2ccc(C)c(C)c2)cc1] | 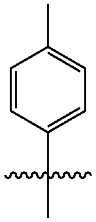 [SMILES: *c1ccc(C)cc1] | 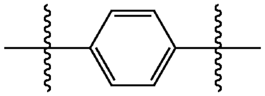 [SMILES: *c1ccc(*)cc1] | Z1 | H | H | 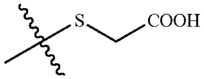 |

-continued
| | | | | | | | |
|---|---|---|---|---|---|---|---|
| 53 | 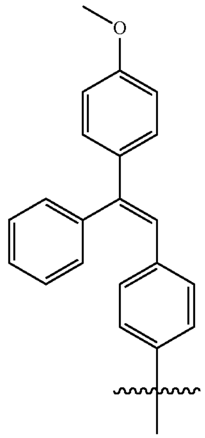 [SMILES: *c1ccc(/C=C(\c2ccccc2)c2ccc(OC)cc2)cc1] | 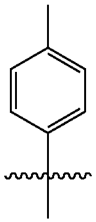 [SMILES: *c1ccc(C)cc1] | 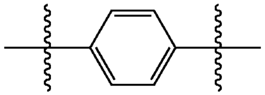 [SMILES: *c1ccc(*)cc1] | Z1 | H | H | 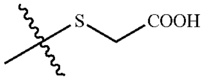 |
| 54 | 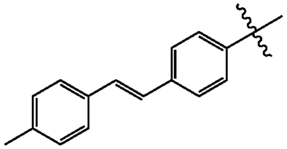 [SMILES: *c1ccc(/C=C/c2ccc(C)cc2)cc1] | 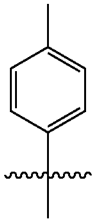 | 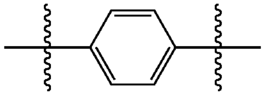 | Z1 | H | H | 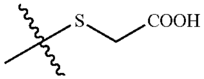 |
| 55 | 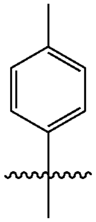 [SMILES: *c1ccc(C)cc1] | 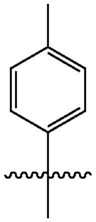 | 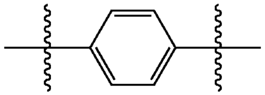 [SMILES: *c1ccc(*)cc1] | Z1 | H | H | 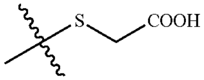 |

-continued
| | | | | | | | |
|---|---|---|---|---|---|---|---|
| 56 | 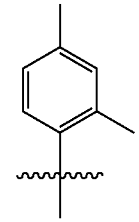 [SMILES: *c1ccc(C)cc1C] | 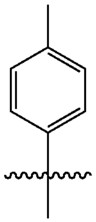 | 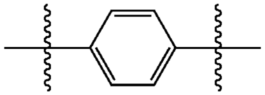 [SMILES: *c1ccc(*)cc1] | Z1 | H | H | 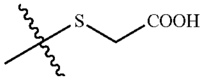 |
| 57 | 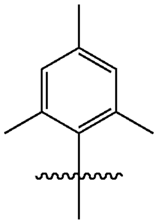 | 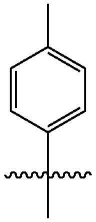 [SMILES: *c1ccc(C)cc1] | 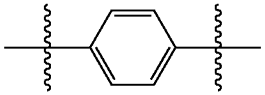 [SMILES: *c1ccc(*)cc1] | Z1 | H | H | 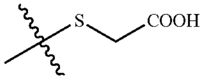 |
| 58 | 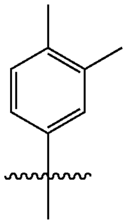 [SMILES: *c1ccc(C)c(C)c1] | 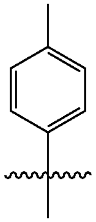 [SMILES: *c1ccc(C)cc1] | 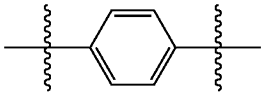 [SMILES: *c1ccc(*)cc1] | Z1 | H | H | 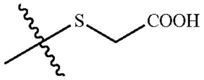 [SMILES: *SCC(=O)O] |
| 59 | 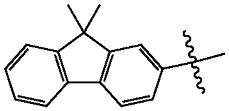 [SMILES: *c1ccc2c(c1)C(C)(C)c1ccccc1-2] | 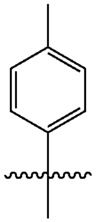 [SMILES: *c1ccc(C)cc1] | 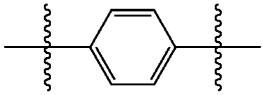 [SMILES: *c1ccc(*)cc1] | Z1 | H | H | 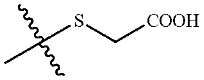 |

-continued
| | | | | | | | |
|---|---|---|---|---|---|---|---|
| 60 | 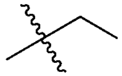 [SMILES: *CC] | 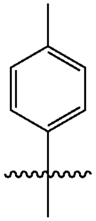 | 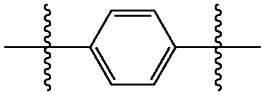 [SMILES: *c1ccc(*)cc1] | Z1 | H | H | 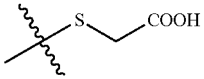 [SMILES: *SCC(=O)O] |
| 61 | 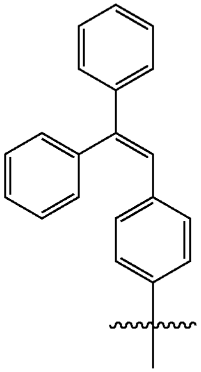 [SMILES: *c1ccc(C=C(c2ccccc2)c2ccccc2)cc1] | 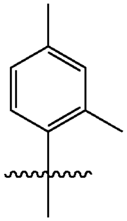 [SMILES: *c1ccc(C)cc1C] | 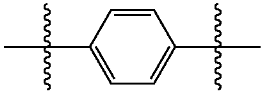 [SMILES: *c1ccc(*)cc1] | Z1 | H | H | 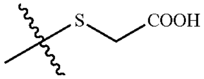 |
| 62 | 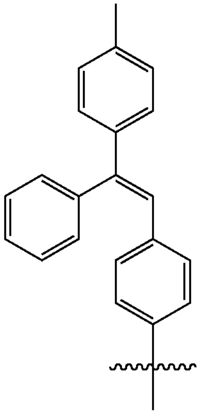 | 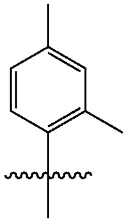 | 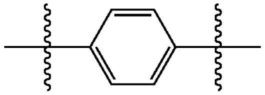 [SMILES: *c1ccc(*)cc1] | Z1 | H | H | 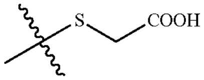 |

-continued
| | | | | | | | |
|---|---|---|---|---|---|---|---|
| 63 | 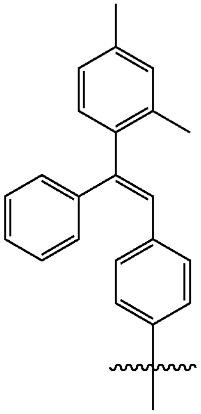 | 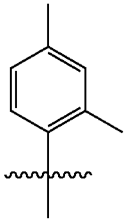 | 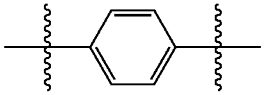 [SMILES: *c1ccc(*)cc1] | Z1 | H | H | 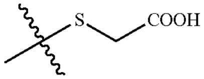 [SMILES: *SCC(=O)O] |
| 64 | 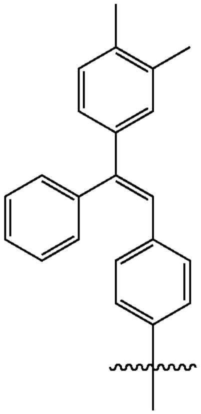 | 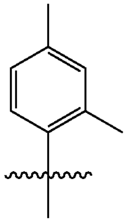 [SMILES: *c1ccc(C)cc1C] | 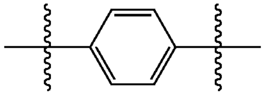 [SMILES: *c1ccc(*)cc1] | Z1 | H | H | 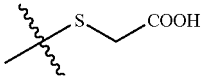 |

-continued
| | | | | | | | |
|---|---|---|---|---|---|---|---|
| 65 | 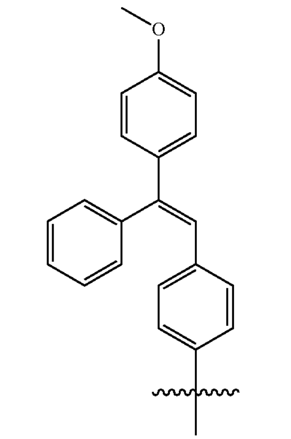 [SMILES: *c1ccc(/C=C(\c2ccccc2)c2ccc(OC)cc2)cc1] | 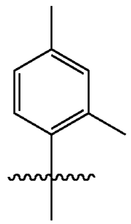 | 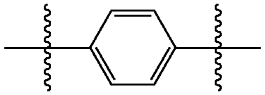 [SMILES: *c1ccc(*)cc1] | Z1 | H | H | 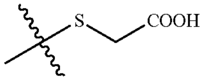 |
| 66 | 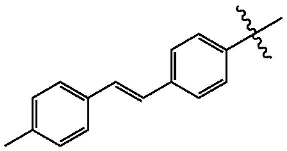 [SMILES: *c1ccc(/C=C/c2ccc(C)cc2)cc1] | 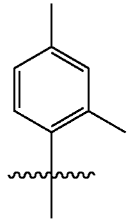 | 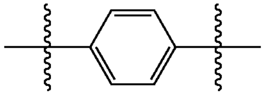 [SMILES: *c1ccc(*)cc1] | Z1 | H | H | 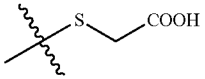 |
| 67 | 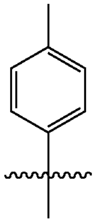 [SMILES: *c1ccc(C)cc1] | 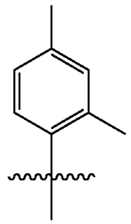 | 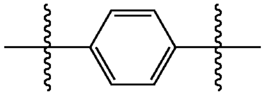 [SMILES: *c1ccc(*)cc1] | Z1 | H | H | 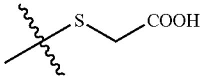 |

-continued
| | | | | | | | |
|---|---|---|---|---|---|---|---|
| 68 | 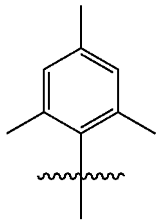 | 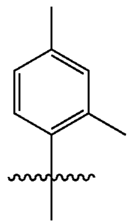 | 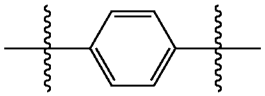 | Z1 | H | H | 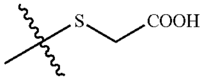 |
| 69 | 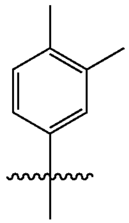 [SMILES: *c1ccc(C)c(C)c1] | 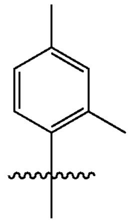 [SMILES: *c1ccc(C)cc1C] | 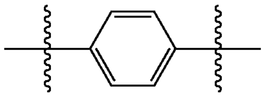 | Z1 | H | H | 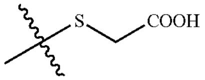 |
| 70 | 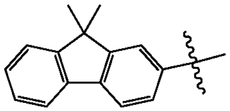 [SMILES: *c1ccc2c(c1)C(C)(C)c1ccccc1-2] | 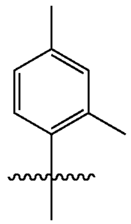 [SMILES: *c1ccc(C)cc1C] | 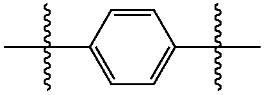 [SMILES: *c1ccc(*)cc1] | Z1 | H | H | 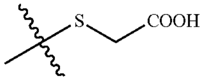 |
| 71 | 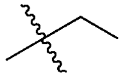 [SMILES: *CC] | 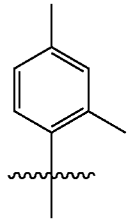 [SMILES: *c1ccc(C)cc1C] | 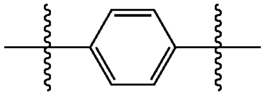 [SMILES: *c1ccc(*)cc1] | Z1 | H | H | 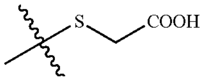 |

-continued
| | | | | | | | |
|---|---|---|---|---|---|---|---|
| 72 | 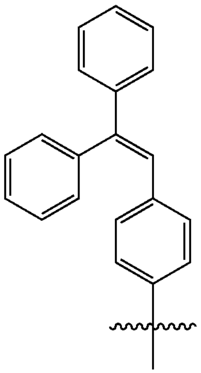 [SMILES: *c1ccc(C=C(c2ccccc2)c2ccccc2)cc1] | 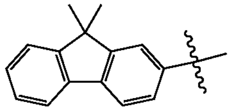 [SMILES: *c1ccc2c(c1)C(C)(C)c1ccccc1-2] | 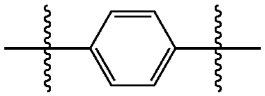 [SMILES: *c1ccc(*)cc1] | Z1 | H | H | 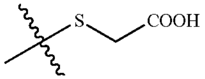 |
| 73 | 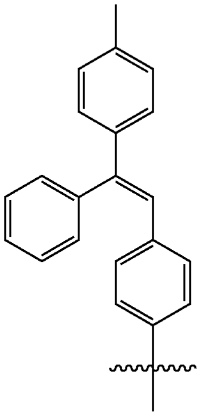 [SMILES: *c1ccc(/C=C(\c2ccccc2)c2ccc(C)cc2)cc1] | 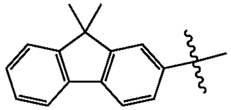 [SMILES: *c1ccc2c(c1)C(C)(C)c1ccccc1-2] | 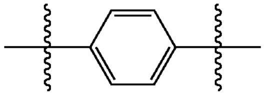 | Z1 | H | H | 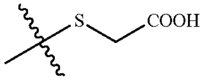 |

-continued
| | | | | | | | |
|---|---|---|---|---|---|---|---|
| 74 | 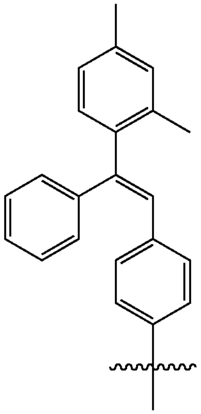 [SMILES: *c1ccc(/C=C(\c2ccccc2)c2ccc(C)cc2C)cc1] | 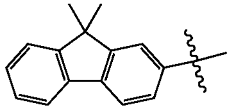 [SMILES: *c1ccc2c(c1)C(C)(C)c1ccccc1-2] | 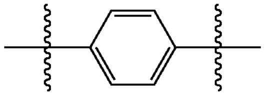 [SMILES: *c1ccc(*)cc1] | Z1 | H | H | 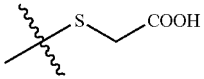 [SMILES: *SCC(=O)O] |
| 75 | 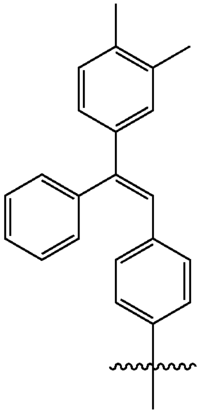 | 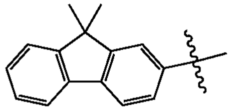 [SMILES: *c1ccc2c(c1)C(C)(C)c1ccccc1-2] | 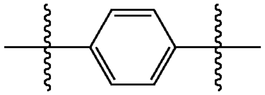 [SMILES: *c1ccc(*)cc1] | Z1 | H | H | 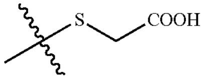 |

-continued
| | | | | | | | |
|---|---|---|---|---|---|---|---|
| 76 | 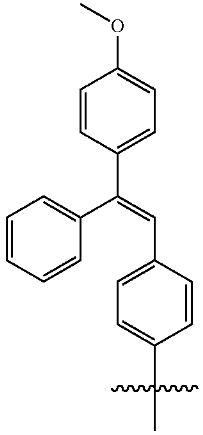 [SMILES: *c1ccc(/C=C(\c2ccccc2)c2ccc(OC)cc2)cc1] | 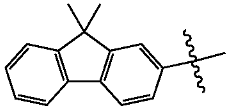 [SMILES: *c1ccc2c(c1)C(C)(C)c1ccccc1-2] | 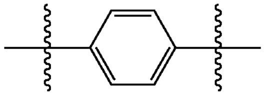 [SMILES: *c1ccc(*)cc1] | Z1 | H | H | 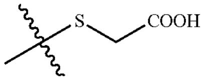 |
| 77 | 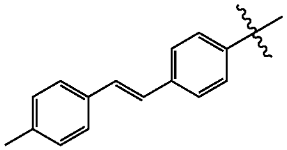 [SMILES: *c1ccc(/C=C/c2ccc(C)cc2)cc1] | 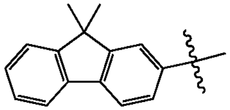 [SMILES: *c1ccc2c(c1)C(C)(C)c1ccccc1-2] | 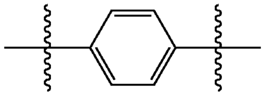 [SMILES: *c1ccc(*)cc1] | Z1 | H | H | 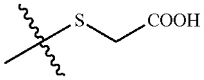 |
| 78 | 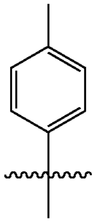 [SMILES: *c1ccc(C)cc1] | 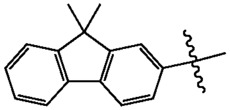 [SMILES: *c1ccc2c(c1)C(C)(C)c1ccccc1-2] | 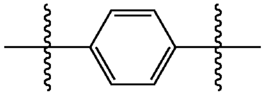 | Z1 | H | H | 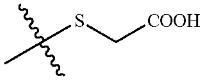 [SMILES: *SCC(=O)O] |
| 79 | 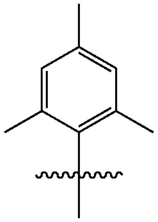 | 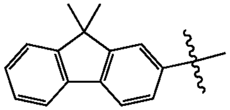 [SMILES: *c1ccc2c(c1)C(C)(C)c1ccccc1-2] | 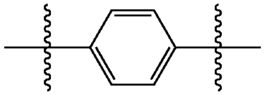 [SMILES: *c1ccc(*)cc1] | Z1 | H | H | 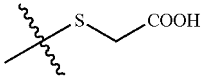 |

-continued
| | | | | | | | |
|---|---|---|---|---|---|---|---|
| 80 | 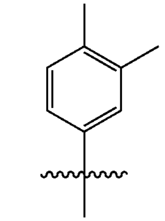 [SMILES: *c1ccc(C)c(C)c1] | 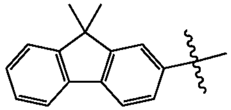 [SMILES: *c1ccc2c(c1)C(C)(C)c1ccccc1-2] | 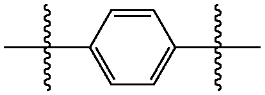 [SMILES: *c1ccc(*)cc1] | Z1 | H | H | 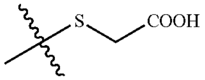 |
| 81 | 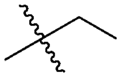 [SMILES: *CC] | 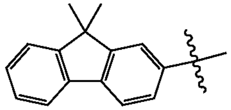 [SMILES: *c1ccc2c(c1)C(C)(C)c1ccccc1-2] | 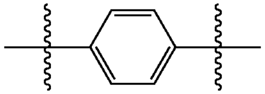 | Z1 | H | H | 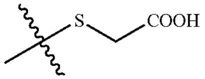 [SMILES: *SCC(=O)O] |
| 82 | 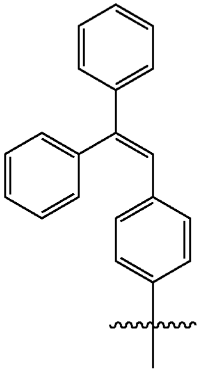 [SMILES: *c1ccc(C=C(c2ccccc2)c2ccccc2)cc1] | 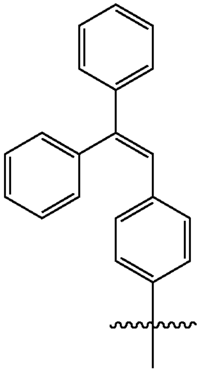 [SMILES: *c1ccc(C=C(c2ccccc2)c2ccccc2)cc1] | 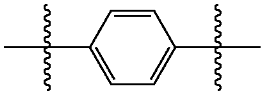 [SMILES: *c1ccc(*)cc1] | Z2 | H | H | 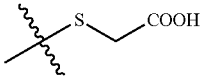 |

-continued
| | | | | | | | |
|---|---|---|---|---|---|---|---|
| 83 | 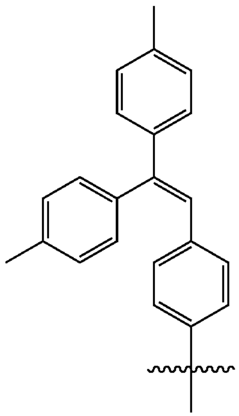 [SMILES: *c1ccc(C=C(c2ccc(C)cc2)c2ccc(C)cc2)cc1] | 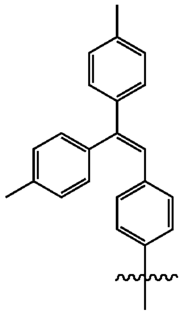 [SMILES: *c1ccc(C=C(c2ccc(C)cc2)c2ccc(C)cc2)cc1] | 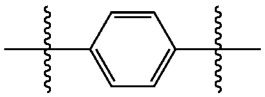 [SMILES: *c1ccc(*)cc1] | Z2 | H | H | 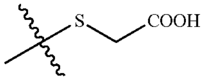 [SMILES: *SCC(=O)O] |
| 84 | 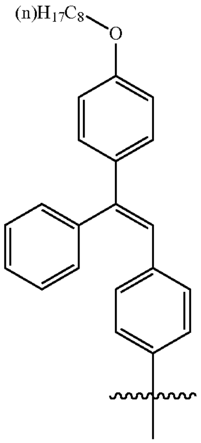 | 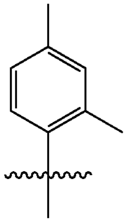 [SMILES: *c1ccc(C)cc1C] | 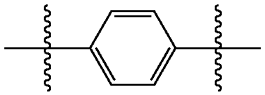 [SMILES: *c1ccc(*)cc1] | Z2 | H | H | 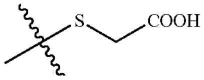 |
| 85 | 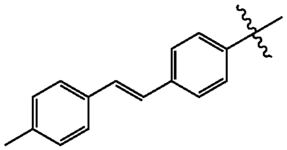 [SMILES: *c1ccc(/C=C/c2ccc(C)cc2)cc1] | 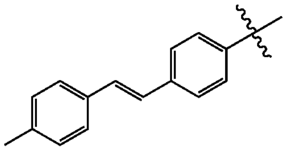 [SMILES: *c1ccc(/C=C/c2ccc(C)cc2)cc1] | 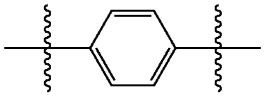 [SMILES: *c1ccc(*)cc1] | Z2 | H | H | 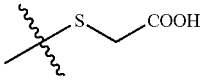 |

-continued
| | | | | | | | |
|---|---|---|---|---|---|---|---|
| 86 | 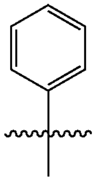 [SMILES: *c1ccccc1] | 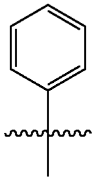 [SMILES: *c1ccccc1] | 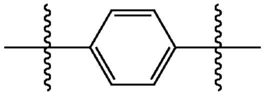 [SMILES: *c1ccc(*)cc1] | Z2 | H | H | 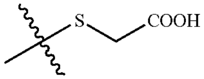 |
| 87 | 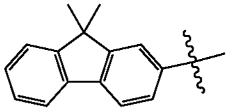 [SMILES: *c1ccc2c(c1)C(C)(C)c1ccccc1-2] | 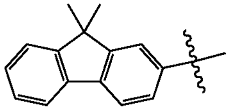 [SMILES: *c1ccc2c(c1)C(C)(C)c1ccccc1-2] | 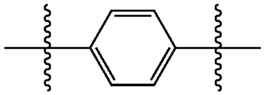 [SMILES: *c1ccc(*)cc1] | Z2 | H | H | 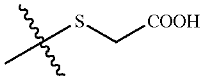 |
| 88 | 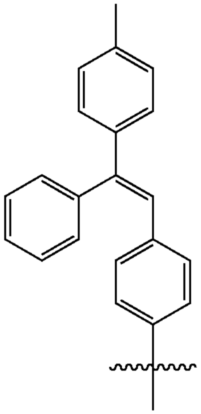 | 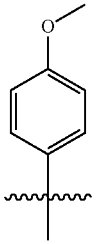 [SMILES: *c1ccc(OC)cc1] | 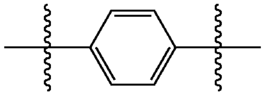 [SMILES: *c1ccc(*)cc1] | Z2 | H | H | 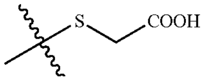 |
| 89 | 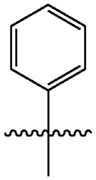 [SMILES: *c1ccccc1] | 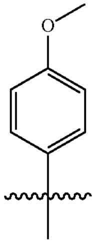 [SMILES: *c1ccc(OC)cc1] | 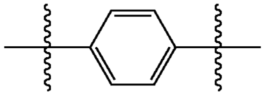 | Z2 | H | H | 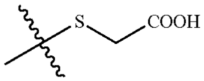 |

-continued
| | | | | | | | |
|---|---|---|---|---|---|---|---|
| 90 | 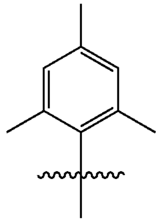 | 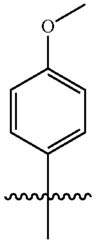 [SMILES: *c1ccc(OC)cc1] | 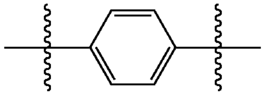 [SMILES: *c1ccc(*)cc1] | Z2 | H | H | 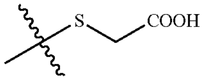 |
| 91 | 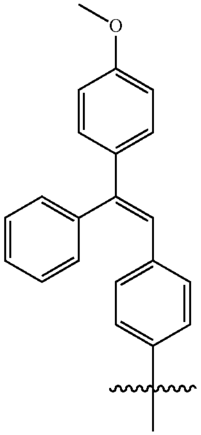 [SMILES: *c1ccc(/C=C(\c2ccccc2)c2ccc(OC)cc2)cc1] | 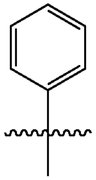 [SMILES: *c1ccccc1] | 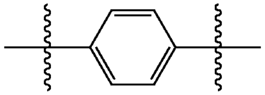 [SMILES: *c1ccc(*)cc1] | Z2 | H | H | 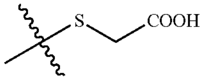 |
| 92 | 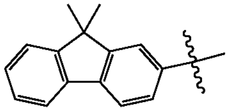 [SMILES: *c1ccc2c(c1)C(C)(C)c1ccccc1-2] | 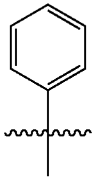 [SMILES: *c1ccccc1] | 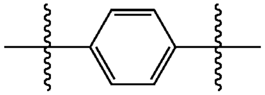 | Z2 | H | H | 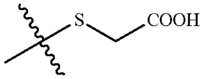 [SMILES: *SCC(=O)O] |

-continued
| | | | | | | | |
|---|---|---|---|---|---|---|---|
| 93 | 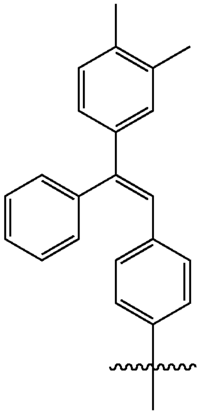 [SMILES: *c1ccc(/C=C(\c2ccccc2)c2ccc(C)c(C)c2)cc1] | 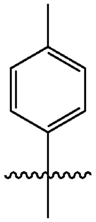 [SMILES: *c1ccc(C)cc1] | 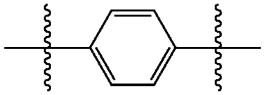 [SMILES: *c1ccc(*)cc1] | Z2 | H | H | 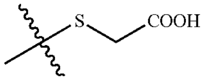 |
| 94 | 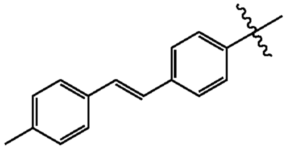 [SMILES: *c1ccc(/C=C/c2ccc(C)cc2)cc1] | 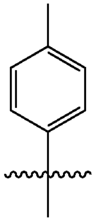 [SMILES: *c1ccc(C)cc1] | 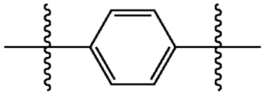 [SMILES: *c1ccc(*)cc1] | Z2 | H | H | 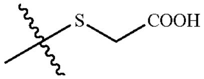 [SMILES: *SCC(=O)O] |
| 95 | 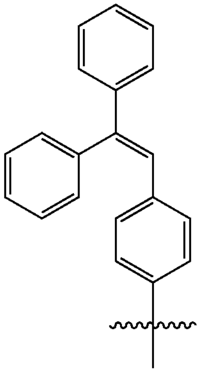 [SMILES: *c1ccc(C=C(c2ccccc2)c2ccccc2)cc1] | 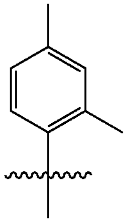 | 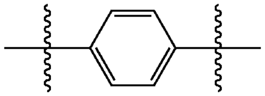 [SMILES: *c1ccc(*)cc1] | Z2 | H | H | 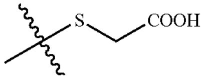 |

-continued
| | | | | | | | |
|---|---|---|---|---|---|---|---|
| 96 | 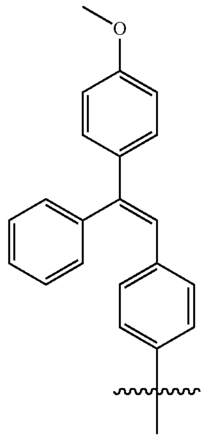 [SMILES: *c1ccc(/C=C(\c2ccccc2)c2ccc(OC)cc2)cc1] | 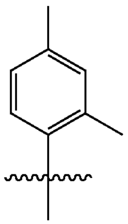 [SMILES: *c1ccc(C)cc1C] | 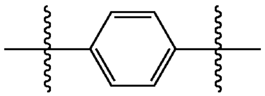 [SMILES: *c1ccc(*)cc1] | Z2 | H | H | 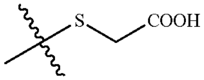 |
| 97 | 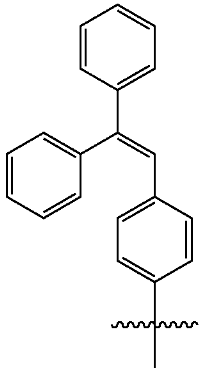 [SMILES: *c1ccc(C=C(c2ccccc2)c2ccccc2)cc1] | 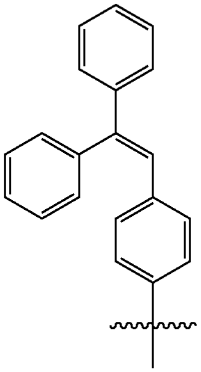 [SMILES: *c1ccc(C=C(c2ccccc2)c2ccccc2)cc1] | 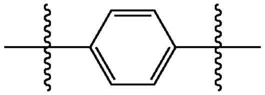 [SMILES: *c1ccc(*)cc1] | Z3 | H | H | 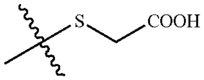 |

-continued
| | | | | | | | |
|---|---|---|---|---|---|---|---|
| 98 | 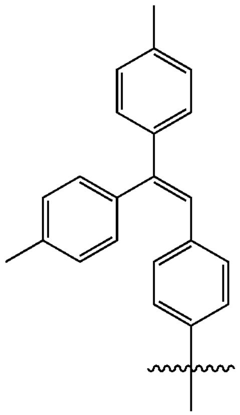 [SMILES: *c1ccc(C=C(c2ccc(C)cc2)c2ccc(C)cc2)cc1] | 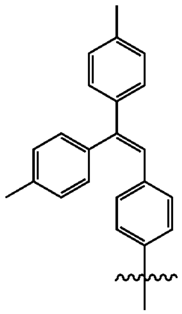 [SMILES: *c1ccc(C=C(c2ccc(C)cc2)c2ccc(C)cc2)cc1] | 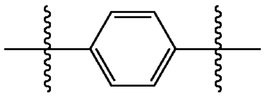 [SMILES: *c1ccc(*)cc1] | Z3 | H | H | 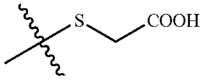 [SMILES: *SCC(=O)O] |
| 99 | 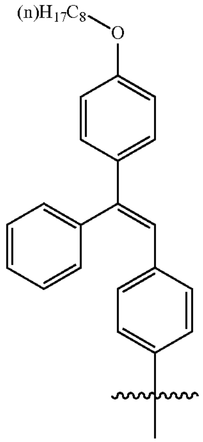 | 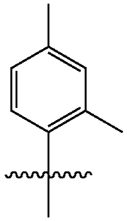 [SMILES: *c1ccc(C)cc1C] | 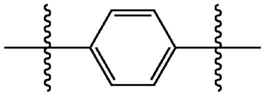 [SMILES: *c1ccc(*)cc1] | Z3 | H | H | 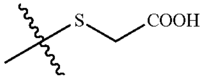 |
| 100 | 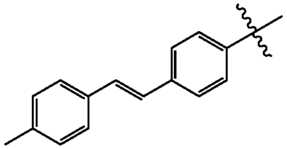 [SMILES: *c1ccc(/C=C/c2ccc(C)cc2)cc1] | 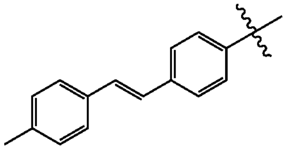 [SMILES: *c1ccc(/C=C/c2ccc(C)cc2)cc1] | 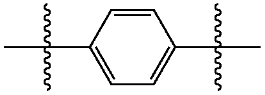 | Z3 | H | H | 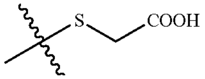 |

-continued
| | | | | | | | |
|---|---|---|---|---|---|---|---|
| 101 | 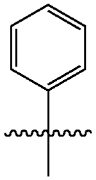 [SMILES: *c1ccccc1] | 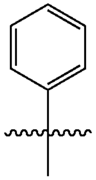 [SMILES: *c1ccccc1] | 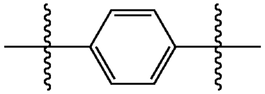 [SMILES: *c1ccc(*)cc1] | Z3 | H | H | 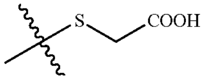 [SMILES: *SCC(=O)O] |
| 102 | 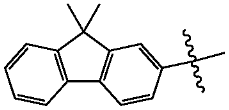 [SMILES: *c1ccc2c(c1)C(C)(C)c1ccccc1-2] | 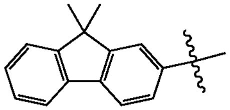 [SMILES: *c1ccc2c(c1)C(C)(C)c1ccccc1-2] | 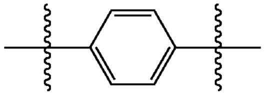 | Z3 | H | H | 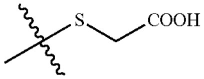 |
| 103 | 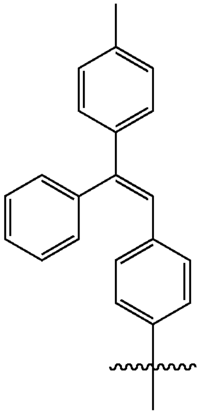 | 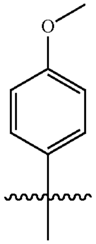 [SMILES: *c1ccc(OC)cc1] | 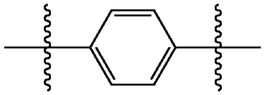 [SMILES: *c1ccc(*)cc1] | Z3 | H | H | 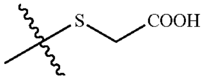 |
| 104 | 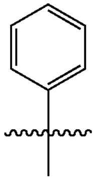 [SMILES: *c1ccccc1] | 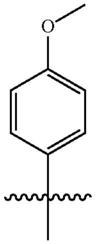 [SMILES: *c1ccc(OC)cc1] | 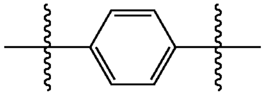 [SMILES: *c1ccc(*)cc1] | Z3 | H | H | 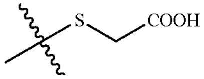 |

-continued
| | | | | | | | |
|---|---|---|---|---|---|---|---|
| 105 | 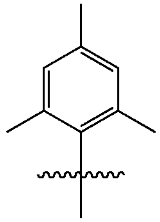 | 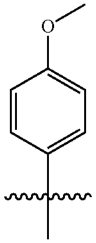 [SMILES: *c1ccc(OC)cc1] | 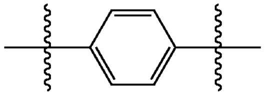 [SMILES: *c1ccc(*)cc1] | Z3 | H | H | 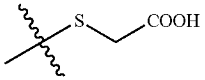 |
| 106 | 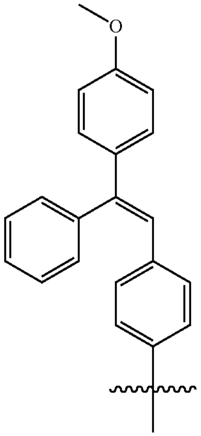 [SMILES: *c1ccc(/C=C(\c2ccccc2)c2ccc(OC)cc2)cc1] | 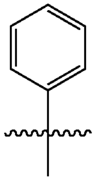 | 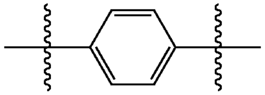 [SMILES: *c1ccc(*)cc1] | Z3 | H | H | 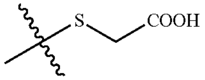 [SMILES: *SCC(=O)O] |
| 107 | 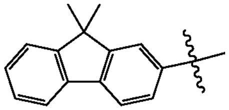 [SMILES: *c1ccc2c(c1)C(C)(C)c1ccccc1-2] | 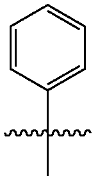 | 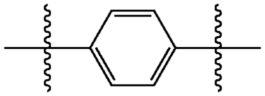 [SMILES: *c1ccc(*)cc1] | Z3 | H | H | 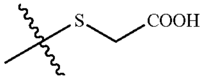 [SMILES: *SCC(=O)O] |

-continued
| | | | | | | | |
|---|---|---|---|---|---|---|---|
| 108 | 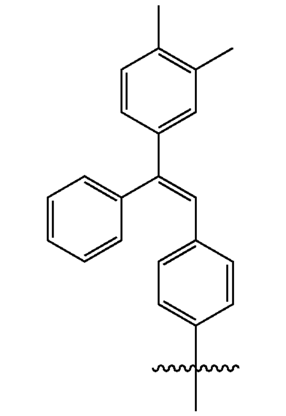 | 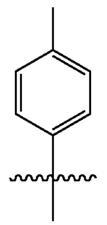 [SMILES: *c1ccc(C)cc1] | 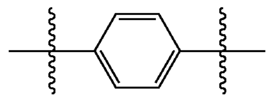 [SMILES: *c1ccc(*)cc1] | Z3 | H | H | 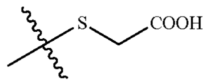 |
| 109 | 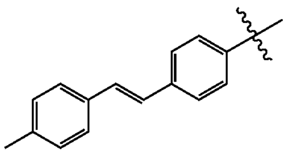 [SMILES: *c1ccc(/C=C/c2ccc(C)cc2)cc1] | 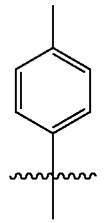 | 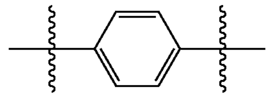 | Z3 | H | H | 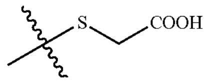 [SMILES: *SCC(=O)O] |
| 110 | 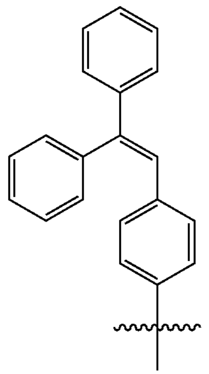 [SMILES: *c1ccc(C=C(c2ccccc2)c2ccccc2)cc1] | 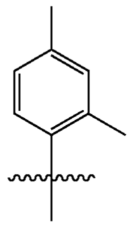 [SMILES: *c1ccc(C)cc1C] | 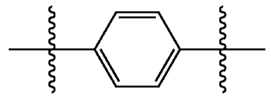 [SMILES: *c1ccc(*)cc1] | Z3 | H | H | 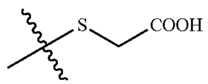 |

-continued
| | | | | | | | |
|---|---|---|---|---|---|---|---|
| 111 | 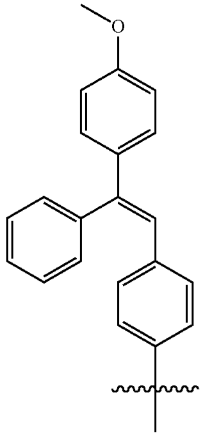 [SMILES: *c1ccc(/C=C(\c2ccccc2)c2ccc(OC)cc2)cc1] | 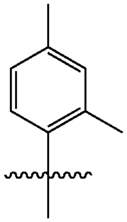 | 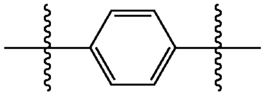 [SMILES: *c1ccc(*)cc1] | Z4 | H | H | 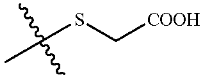 |
| 112 | 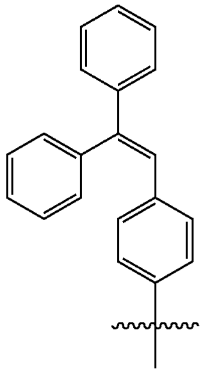 [SMILES: *c1ccc(C=C(c2ccccc2)c2ccccc2)cc1] | 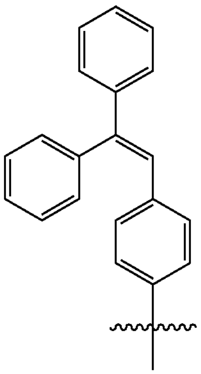 [SMILES: *c1ccc(C=C(c2ccccc2)c2ccccc2)cc1] | 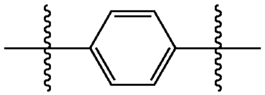 [SMILES: *c1ccc(*)cc1] | Z4 | H | H | 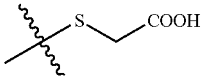 [SMILES: *SCC(=O)O] |

-continued
| | | | | | | | |
|---|---|---|---|---|---|---|---|
| 113 | 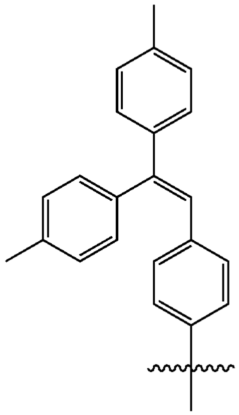 [SMILES: *c1ccc(C=C(c2ccc(C)cc2)c2ccc(C)cc2)cc1] | 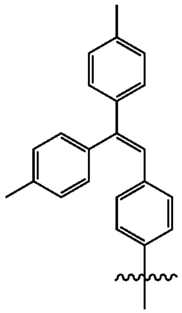 [SMILES: *c1ccc(C=C(c2ccc(C)cc2)c2ccc(C)cc2)cc1] | 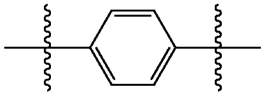 [SMILES: *c1ccc(*)cc1] | Z4 | H | H | 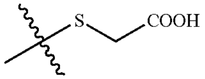 [SMILES: *SCC(=O)O] |
| 114 | 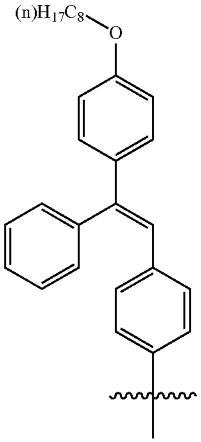 | 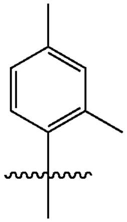 [SMILES: *c1ccc(C)cc1C] | 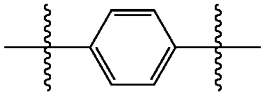 | Z4 | H | H | 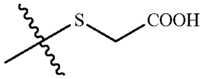 |
| 115 | 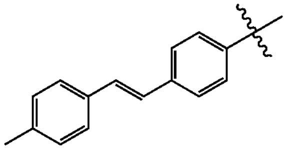 [SMILES: *c1ccc(/C=C/c2ccc(C)cc2)cc1] | 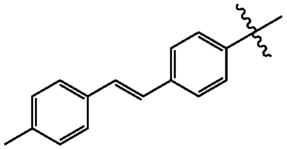 [SMILES: *c1ccc(/C=C/c2ccc(C)cc2)cc1] | 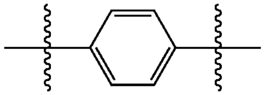 [SMILES: *c1ccc(*)cc1] | Z4 | H | H | 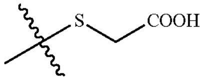 [SMILES: *SCC(=O)O] |

-continued
| | | | | | | | |
|---|---|---|---|---|---|---|---|
| 116 | 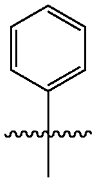 [SMILES: *c1ccccc1] | 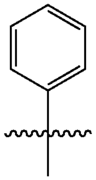 | 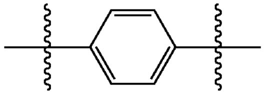 [SMILES: *c1ccc(*)cc1] | Z4 | H | H | 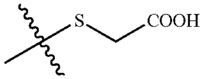 [SMILES: *SCC(=O)O] |
| 117 | 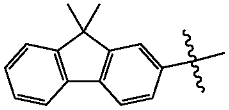 [SMILES: *c1ccc2c(c1)C(C)(C)c1ccccc1-2] | 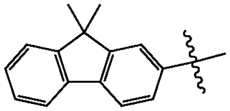 [SMILES: *c1ccc2c(c1)C(C)(C)c1ccccc1-2] | 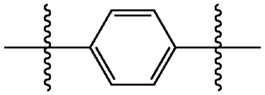 | Z4 | H | H | 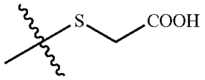 [SMILES: *SCC(=O)O] |
| 118 | 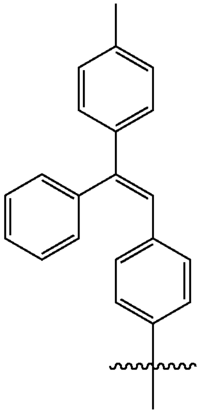 [SMILES: *c1ccc(/C=C(\c2ccccc2)c2ccc(C)cc2)cc1] | 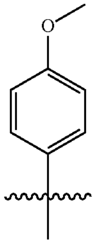 | 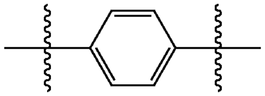 [SMILES: *c1ccc(*)cc1] | Z4 | H | H | 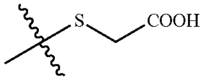 |
| 119 | 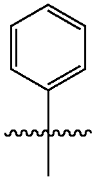 [SMILES: *c1ccccc1] | 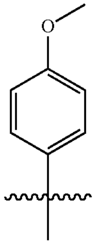 [SMILES: *c1ccc(OC)cc1] | 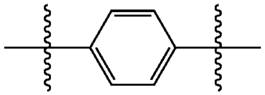 | Z4 | H | H | 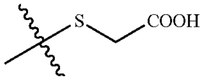 [SMILES: *SCC(=O)O] |

-continued
| | | | | | | | |
|---|---|---|---|---|---|---|---|
| 120 | 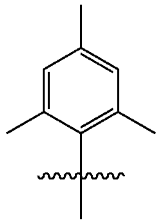 | 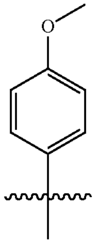 [SMILES: *c1ccc(OC)cc1] | 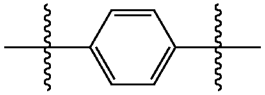 [SMILES: *c1ccc(*)cc1] | Z4 | H | H | 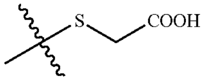 [SMILES: *SCC(=O)O] |
| 121 | 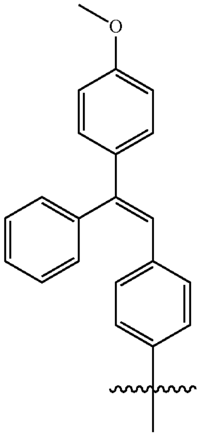 [SMILES: *c1ccc(/C=C(\c2ccccc2)c2ccc(OC)cc2)cc1] | 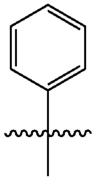 [SMILES: *c1ccccc1] | 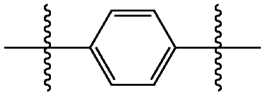 [SMILES: *c1ccc(*)cc1] | Z4 | H | H | 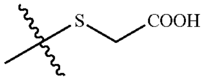 [SMILES: *SCC(=O)O] |
| 122 | 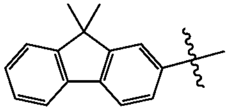 [SMILES: *c1ccc2c(c1)C(C)(C)c1ccccc1-2] | 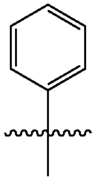 [SMILES: *c1ccccc1] | 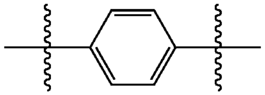 [SMILES: *c1ccc(*)cc1] | Z4 | H | H | 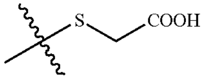 |

-continued
| | | | | | | | |
|---|---|---|---|---|---|---|---|
| 123 | 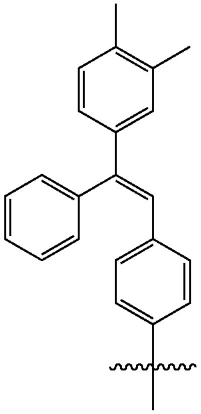 | 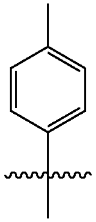 [SMILES: *c1ccc(C)cc1] | 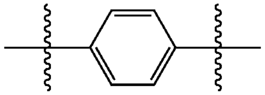 [SMILES: *c1ccc(*)cc1] | Z4 | H | H | 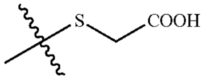 [SMILES: *SCC(=O)O]<br> |
| 124 | 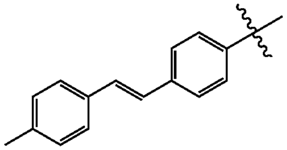 [SMILES: *c1ccc(/C=C/c2ccc(C)cc2)cc1] | 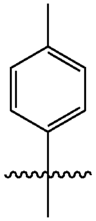 [SMILES: *c1ccc(C)cc1] | 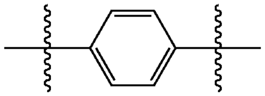 [SMILES: *c1ccc(*)cc1] | Z4 | H | H | 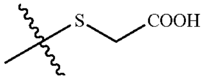 [SMILES: *SCC(=O)O]<br> |
| 125 | 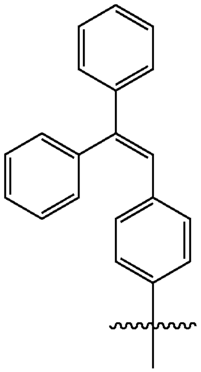 [SMILES: *c1ccc(C=C(c2ccccc2)c2ccccc2)cc1] | 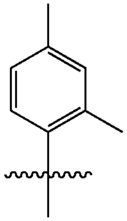 [SMILES: *c1ccc(C)cc1C] | 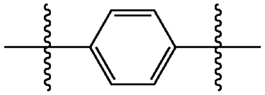 [SMILES: *c1ccc(*)cc1] | Z4 | H | H | 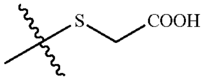 [SMILES: *SCC(=O)O]<br> |

-continued
| | | | | | | | |
|---|---|---|---|---|---|---|---|
| 126 | 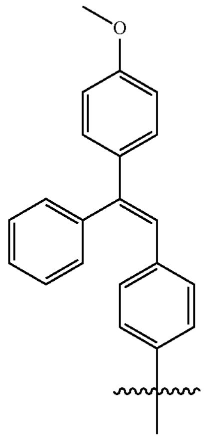 [SMILES: *c1ccc(/C=C(\c2ccccc2)c2ccc(OC)cc2)cc1] | 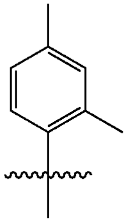 [SMILES: *c1ccc(C)cc1C] | 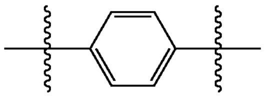 [SMILES: *c1ccc(*)cc1] | Z4 | H | H | 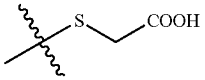 [SMILES: *SCC(=O)O] |
| 127 | 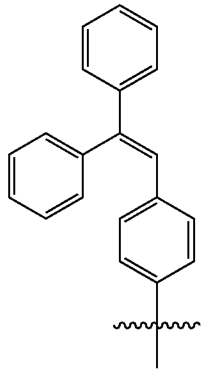 [SMILES: *c1ccc(C=C(c2ccccc2)c2ccccc2)cc1] | 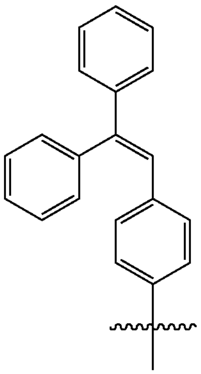 [SMILES: *c1ccc(C=C(c2ccccc2)c2ccccc2)cc1] | 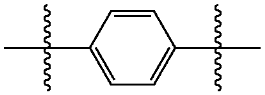 | Z5 | H | H | 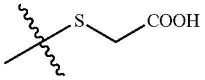 [SMILES: *SCC(=O)O] |

-continued
| | | | | | | | |
|---|---|---|---|---|---|---|---|
| 128 | 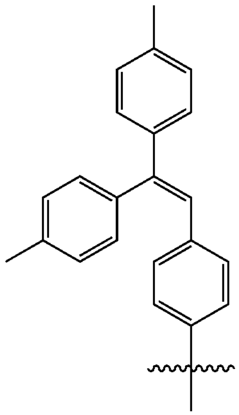 [SMILES: *c1ccc(C=C(c2ccc(C)cc2)c2ccc(C)cc2)cc1] | 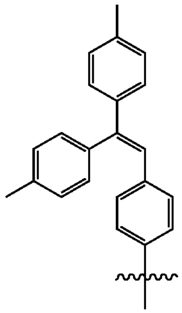 [SMILES: *c1ccc(C=C(c2ccc(C)cc2)c2ccc(C)cc2)cc1] | 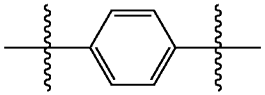 [SMILES: *c1ccc(*)cc1] | Z5 | H | H | 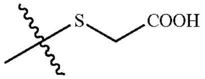 [SMILES: *SCC(=O)O] |
| 129 | 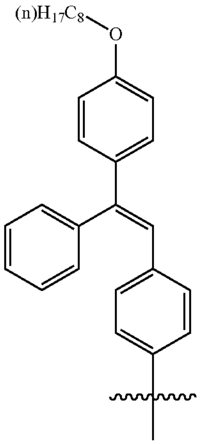 | 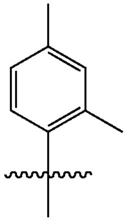 [SMILES: *c1ccc(C)cc1C] | 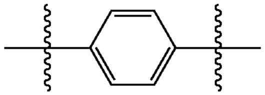 | Z5 | H | H | 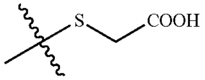 [SMILES: *SCC(=O)O] |
| 130 | 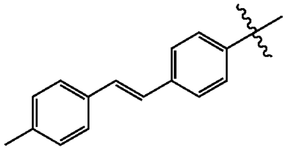 [SMILES: *c1ccc(/C=C/c2ccc(C)cc2)cc1] | 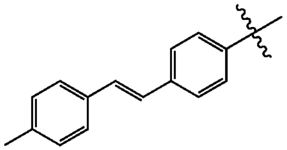 [SMILES: *c1ccc(/C=C/c2ccc(C)cc2)cc1] | 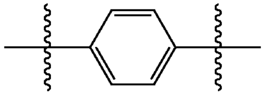 [SMILES: *c1ccc(*)cc1] | Z5 | H | H | 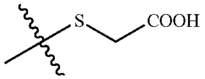 [SMILES: *SCC(=O)O] |

-continued
| | | | | | | | |
|---|---|---|---|---|---|---|---|
| 131 | 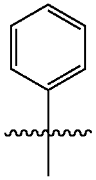 [SMILES: *c1ccccc1] | 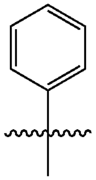 [SMILES: *c1ccccc1] | 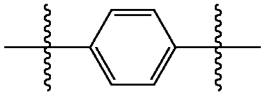 | Z5 | H | H | 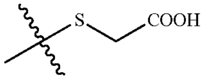 |
| 132 | 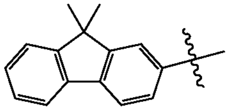 [SMILES: *c1ccc2c(c1)C(C)(C)c1ccccc1-2] | 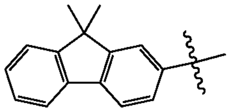 [SMILES: *c1ccc2c(c1)C(C)(C)c1ccccc1-2] | 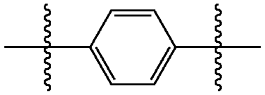 [SMILES: *c1ccc(*)cc1] | Z5 | H | H | 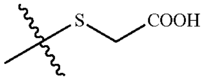 |
| 133 | 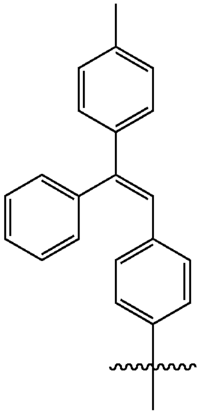 [SMILES: *c1ccc(/C=C(\c2ccccc2)c2ccc(C)cc2)cc1] | 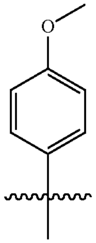 [SMILES: *c1ccc(OC)cc1] | 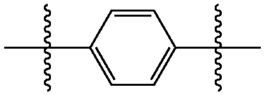 [SMILES: *c1ccc(*)cc1] | Z5 | H | H | 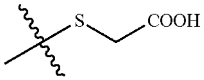 |
| 134 | 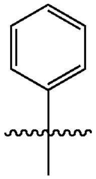 [SMILES: *c1ccccc1] | 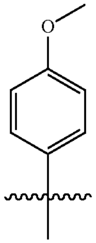 [SMILES: *c1ccc(OC)cc1] | 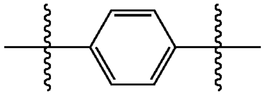 [SMILES: *c1ccc(*)cc1] | Z5 | H | H | 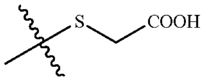 [SMILES: *SCC(=O)O] |

-continued
| | | | | | | | |
|---|---|---|---|---|---|---|---|
| 135 | 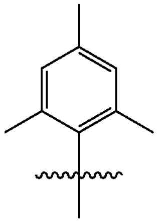 | 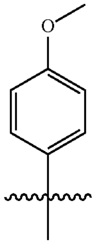 [SMILES: *c1ccc(OC)cc1] | 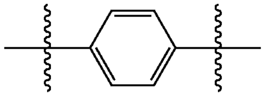 [SMILES: *c1ccc(*)cc1] | Z5 | H | H | 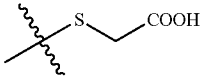 |
| 136 | 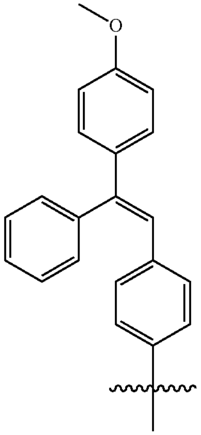 [SMILES: *c1ccc(/C=C(\c2ccccc2)c2ccc(OC)cc2)cc1] | 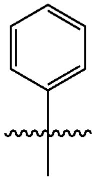 [SMILES: *c1ccccc1] | 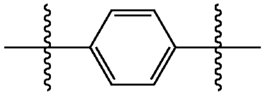 | Z5 | H | H | 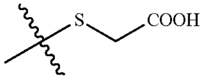 |
| 137 | 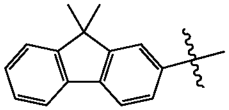 [SMILES: *c1ccc2c(c1)C(C)(C)c1ccccc1-2] | 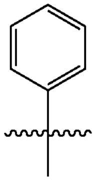 [SMILES: *c1ccccc1] | 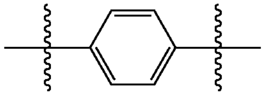 [SMILES: *c1ccc(*)cc1] | Z5 | H | H | 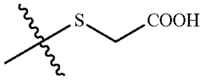 |

-continued
| | | | | | | | |
|---|---|---|---|---|---|---|---|
| 138 | 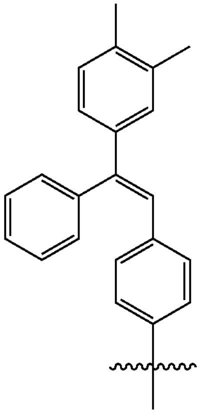 [SMILES: *c1ccc(/C=C(\c2ccccc2)c2ccc(C)c(C)c2)cc1] | 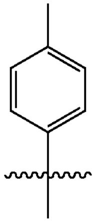 [SMILES: *c1ccc(C)cc1] | 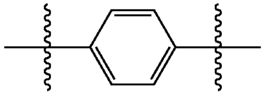 [SMILES: *c1ccc(*)cc1] | Z5 | H | H | 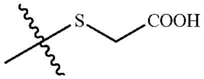 [SMILES: *SCC(=O)O] |
| 139 | 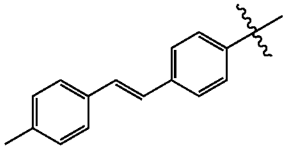 [SMILES: *c1ccc(/C=C/c2ccc(C)cc2)cc1] | 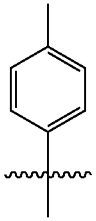 [SMILES: *c1ccc(C)cc1] | 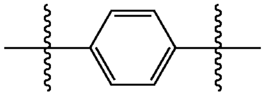 | Z5 | H | H | 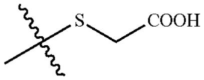 |
| 140 | 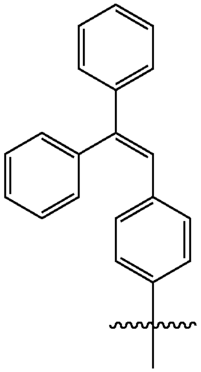 [SMILES: *c1ccc(C=C(c2ccccc2)c2ccccc2)cc1] | 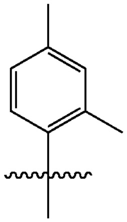 [SMILES: *c1ccc(C)cc1C] | 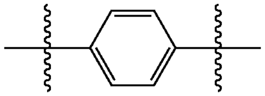 [SMILES: *c1ccc(*)cc1] | Z5 | H | H | 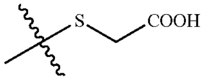 [SMILES: *SCC(=O)O] |

-continued
| | | | | | | | |
|---|---|---|---|---|---|---|---|
| 141 | 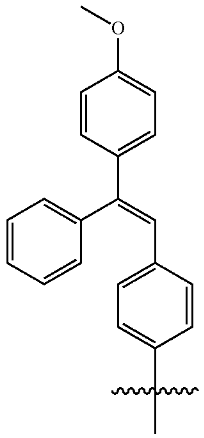 [SMILES: *c1ccc(/C=C(\c2ccccc2)c2ccc(OC)cc2)cc1] | 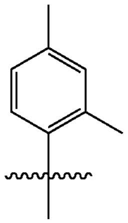 [SMILES: *c1ccc(C)cc1C] | 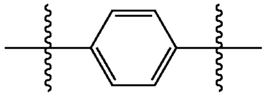 [SMILES: *c1ccc(*)cc1] | Z5 | H | H | 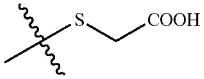 |
| 142 | 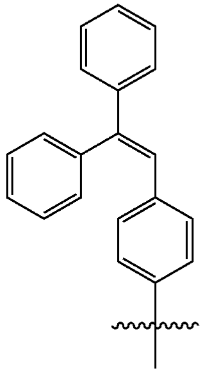 [SMILES: *c1ccc(C=C(c2ccccc2)c2ccccc2)cc1] | 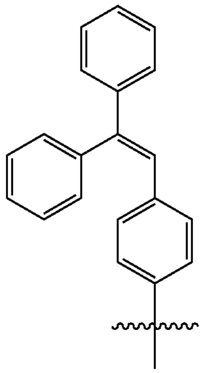 [SMILES: *c1ccc(C=C(c2ccccc2)c2ccccc2)cc1] | 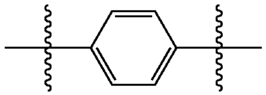 [SMILES: *c1ccc(*)cc1] | Z6 | H | H | 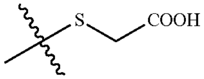 |

-continued
| | | | | | | | |
|---|---|---|---|---|---|---|---|
| 143 | 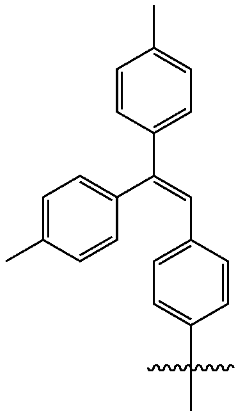 [SMILES: *c1ccc(C=C(c2ccc(C)cc2)c2ccc(C)cc2)cc1] | 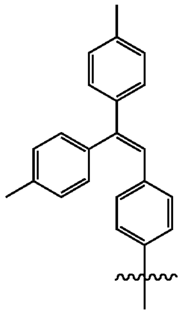 [SMILES: *c1ccc(C=C(c2ccc(C)cc2)c2ccc(C)cc2)cc1] | 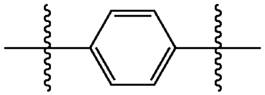 | Z6 | H | H | 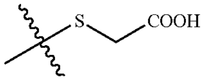 [SMILES: *SCC(=O)O] |
| 144 | 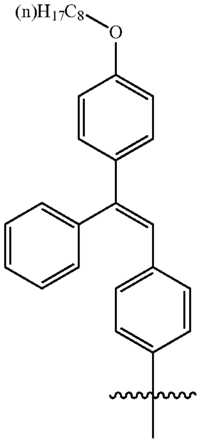 | 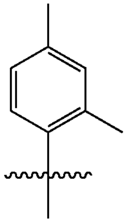 [SMILES: *c1ccc(C)cc1C] | 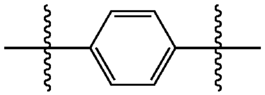 [SMILES: *c1ccc(*)cc1] | Z6 | H | H | 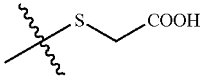 [SMILES: *SCC(=O)O] |
| 145 | 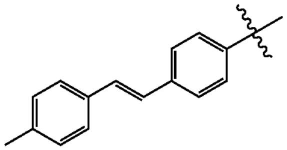 [SMILES: *c1ccc(/C=C/c2ccc(C)cc2)cc1] | 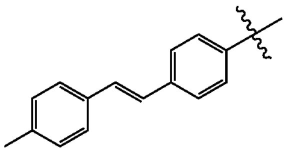 [SMILES: *c1ccc(/C=C/c2ccc(C)cc2)cc1] | 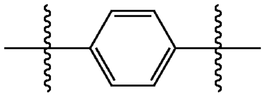 [SMILES: *c1ccc(*)cc1] | Z6 | H | H | 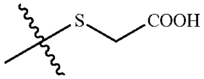 [SMILES: *SCC(=O)O] |

-continued
| | | | | | | | |
|---|---|---|---|---|---|---|---|
| 146 | 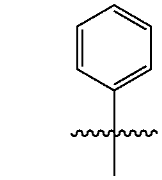 [SMILES: *c1ccccc1] | 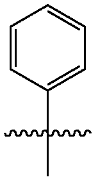 [SMILES: *c1ccccc1] | 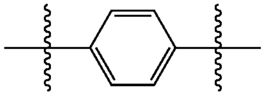 [SMILES: *c1ccc(*)cc1] | Z6 | H | H | 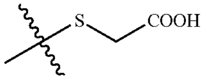 [SMILES: *SCC(=O)O] |
| 147 | 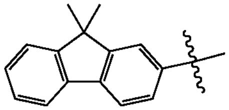 [SMILES: *c1ccc2c(c1)C(C)(C)c1ccccc1-2] | 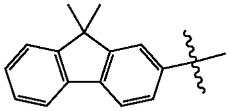 [SMILES: *c1ccc2c(c1)C(C)(C)c1ccccc1-2] | 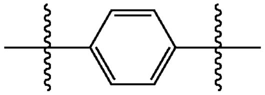 [SMILES: *c1ccc(*)cc1] | Z6 | H | H | 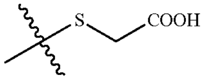 |
| 148 | 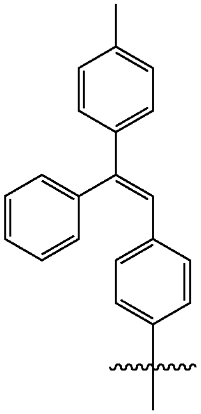 [SMILES: *c1ccc(/C=C(\c2ccccc2)c2ccc(C)cc2)cc1] | 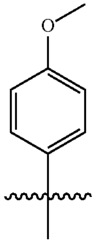 [SMILES: *c1ccc(OC)cc1] | 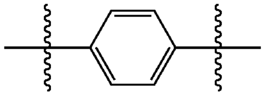 [SMILES: *c1ccc(*)cc1] | Z6 | H | H | 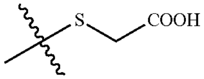 |
| 149 | 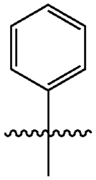 [SMILES: *c1ccccc1] | 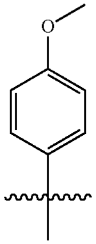 [SMILES: *c1ccc(OC)cc1] | 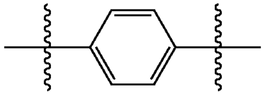 [SMILES: *c1ccc(*)cc1] | Z6 | H | H | 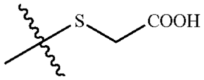 [SMILES: *SCC(=O)O] |

-continued
| | | | | | | | |
|---|---|---|---|---|---|---|---|
| 150 | 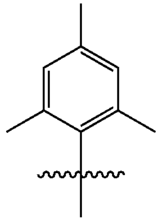 | 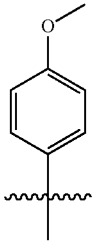 [SMILES: *c1ccc(OC)cc1] | 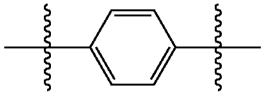 | Z6 | H | H | 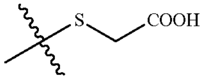 |
| 151 | 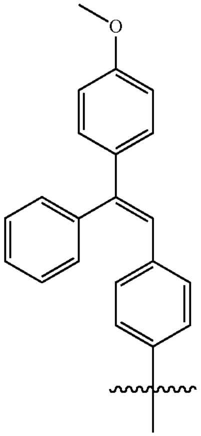 [SMILES: *c1ccc(/C=C(\c2ccccc2)c2ccc(OC)cc2)cc1] | 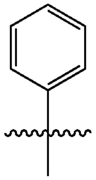 [SMILES: *c1ccccc1] | 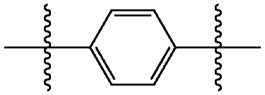 | Z6 | H | H | 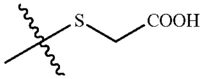 [SMILES: *SCC(=O)O] |
| 152 | 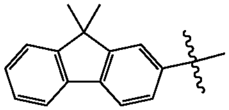 [SMILES: *c1ccc2c(c1)C(C)(C)c1ccccc1-2] | 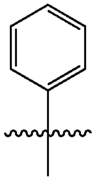 | 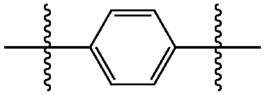 | Z6 | H | H | 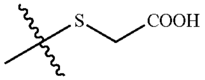 [SMILES: *SCC(=O)O] |

-continued
| | | | | | | | |
|---|---|---|---|---|---|---|---|
| 153 | 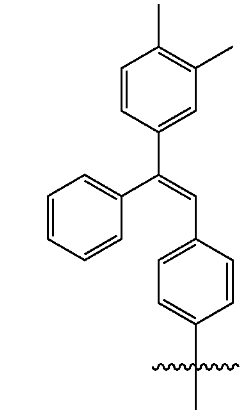 [SMILES: *c1ccc(/C=C(\c2ccccc2)c2ccc(C)c(C)c2)cc1] | 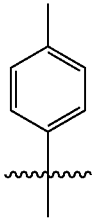 [SMILES: *c1ccc(C)cc1] | 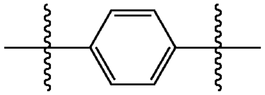 | Z6 | H | H | 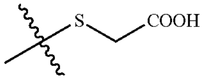 [SMILES: *SCC(=O)O] |
| 154 | 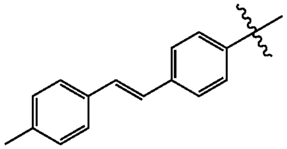 [SMILES: *c1ccc(/C=C/c2ccc(C)cc2)cc1] | 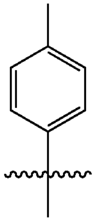 [SMILES: *c1ccc(C)cc1] | 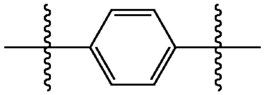 [SMILES: *c1ccc(*)cc1] | Z6 | H | H | 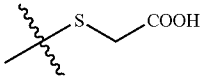 |
| 155 | 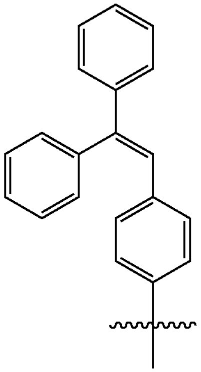 [SMILES: *c1ccc(C=C(c2ccccc2)c2ccccc2)cc1] | 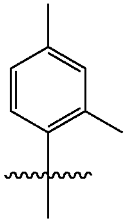 | 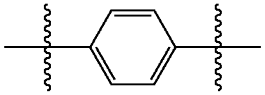 [SMILES: *c1ccc(*)cc1] | Z6 | H | H | 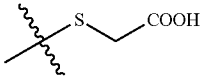 |

-continued
| | | | | | | | |
|---|---|---|---|---|---|---|---|
| 156 | 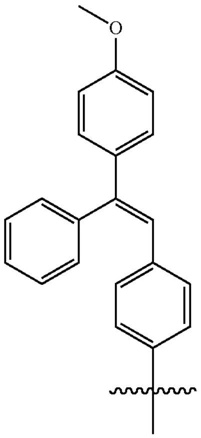 [SMILES: *c1ccc(/C=C(\c2ccccc2)c2ccc(OC)cc2)cc1] | 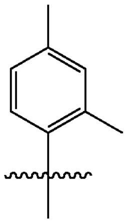 [SMILES: *c1ccc(C)cc1C] | 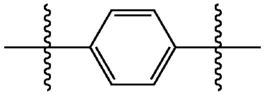 [SMILES: *c1ccc(*)cc1] | Z6 | H | H | 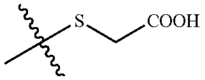 |
| 157 | 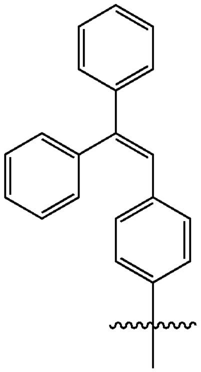 [SMILES: *c1ccc(C=C(c2ccccc2)c2ccccc2)cc1] | 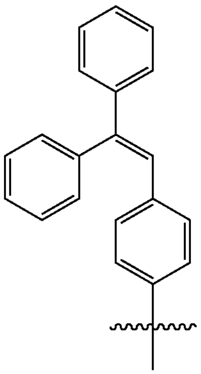 [SMILES: *c1ccc(C=C(c2ccccc2)c2ccccc2)cc1] | 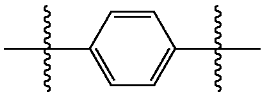 [SMILES: *c1ccc(*)cc1] | Z7 | H | H | 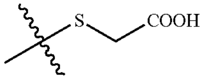 |

-continued
| | | | | | | | |
|---|---|---|---|---|---|---|---|
| 158 | 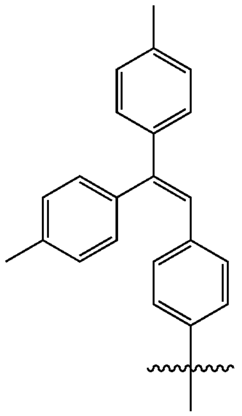 [SMILES: *c1ccc(C=C(c2ccc(C)cc2)c2ccc(C)cc2)cc1] | 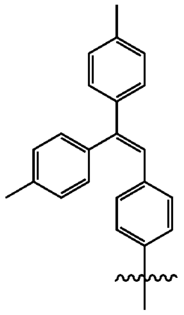 [SMILES: *c1ccc(C=C(c2ccc(C)cc2)c2ccc(C)cc2)cc1] | 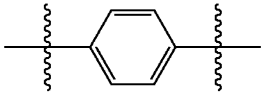 | Z7 | H | H | 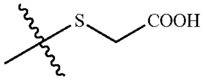 |
| 159 | 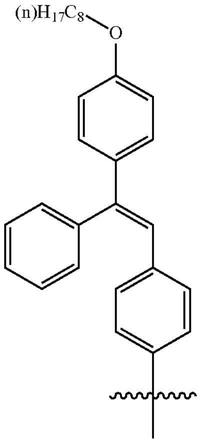 | 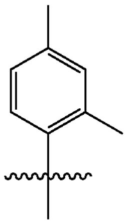 [SMILES: *c1ccc(C)cc1C] | 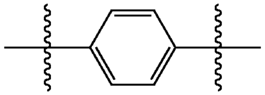 [SMILES: *c1ccc(*)cc1] | Z7 | H | H | 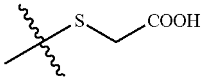 |
| 160 | 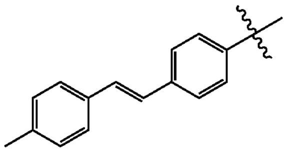 [SMILES: *c1ccc(/C=C/c2ccc(C)cc2)cc1] | 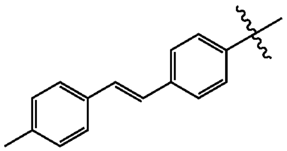 [SMILES: *c1ccc(/C=C/c2ccc(C)cc2)cc1] | 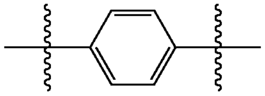 [SMILES: *c1ccc(*)cc1] | Z7 | H | H | 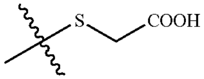 [SMILES: *SCC(=O)O] |

-continued
| | | | | | | | |
|---|---|---|---|---|---|---|---|
| 161 | 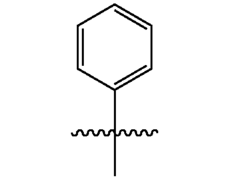 [SMILES: *c1ccccc1] | 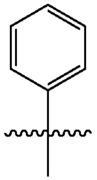 | 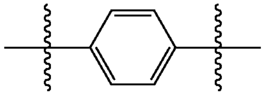 | Z7 | H | H | 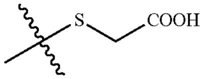 |
| 162 | 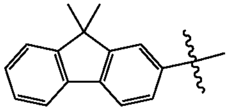 [SMILES: *c1ccc2c(c1)C(C)(C)c1ccccc1-2] | 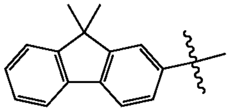 [SMILES: *c1ccc2c(c1)C(C)(C)c1ccccc1-2] | 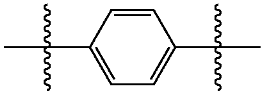 | Z7 | H | H | 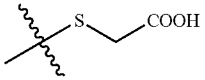 [SMILES: *SCC(=O)O] |
| 163 | 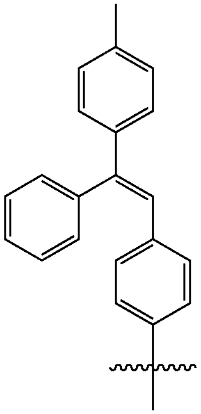 [SMILES: *c1ccc(/C=C(\c2ccccc2)c2ccc(C)cc2)cc1] | 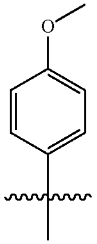 [SMILES: *c1ccc(OC)cc1] | 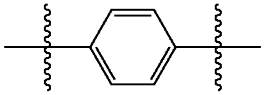 [SMILES: *c1ccc(*)cc1] | Z7 | H | H | 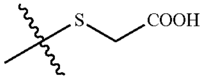 |
| 164 | 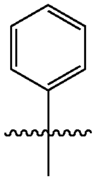 [SMILES: *c1ccccc1] | 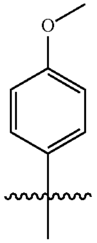 [SMILES: *c1ccc(OC)cc1] | 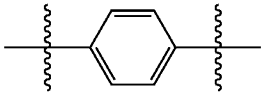 | Z7 | H | H | 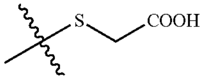 |

-continued
| | | | | | | | |
|---|---|---|---|---|---|---|---|
| 165 | 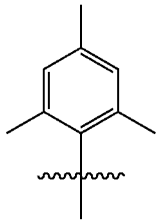 | 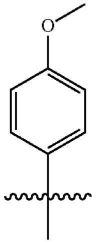 [SMILES: *c1ccc(OC)cc1] | 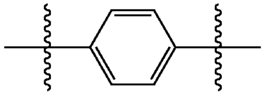 [SMILES: *c1ccc(*)cc1] | Z7 | H | H | 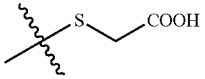 |
| 166 | 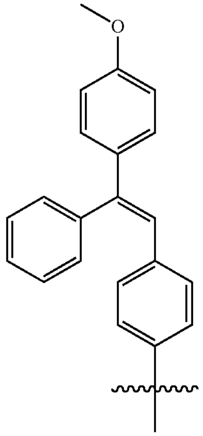 [SMILES: *c1ccc(/C=C(\c2ccccc2)c2ccc(OC)cc2)cc1] | 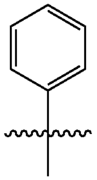 | 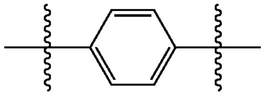 [SMILES: *c1ccc(*)cc1] | Z7 | H | H | 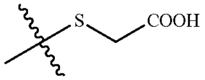 |
| 167 | 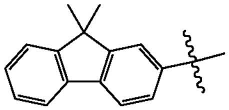 [SMILES: *c1ccc2c(c1)C(C)(C)c1ccccc1-2] | 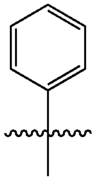 | 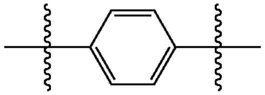 [SMILES: *c1ccc(*)cc1] | Z7 | H | H | 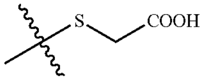 [SMILES: *SCC(=O)O] |

-continued
| | | | | | | | |
|---|---|---|---|---|---|---|---|
| 168 | 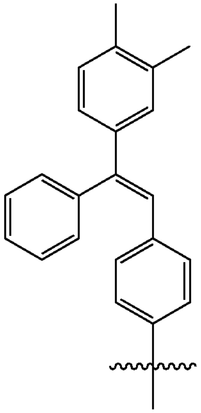 [SMILES: *c1ccc(/C=C(\c2ccccc2)c2ccc(C)c(C)c2)cc1] | 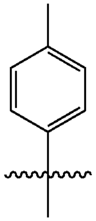 [SMILES: *c1ccc(C)cc1] | 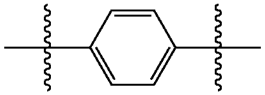 [SMILES: *c1ccc(*)cc1] | Z7 | H | H | 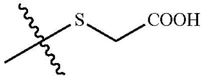  |
| 169 | 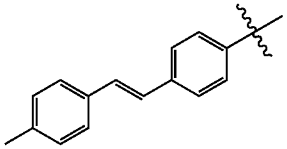 [SMILES: *c1ccc(/C=C/c2ccc(C)cc2)cc1] | 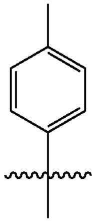 [SMILES: *c1ccc(C)cc1] | 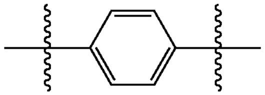 [SMILES: *c1ccc(*)cc1] | Z7 | H | H | 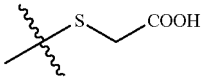  |
| 170 | 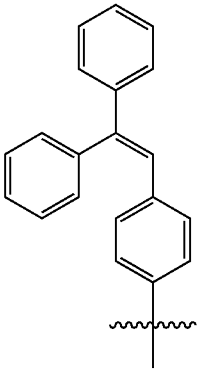 [SMILES: *c1ccc(C=C(c2ccccc2)c2ccccc2)cc1] | 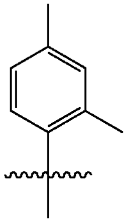 [SMILES: *c1ccc(C)cc1C] | 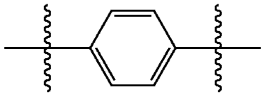 [SMILES: *c1ccc(*)cc1] | Z7 | H | H | 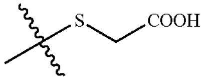  |

-continued
| | | | | | | | |
|---|---|---|---|---|---|---|---|
| 171 | 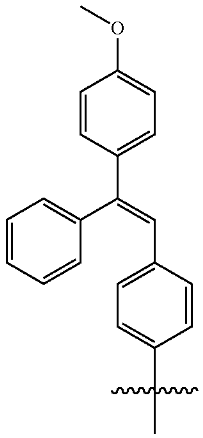 [SMILES: *c1ccc(/C=C(\c2ccccc2)c2ccc(OC)cc2)cc1] | 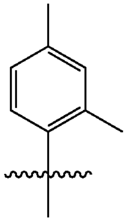 [SMILES: *c1ccc(C)cc1C] | 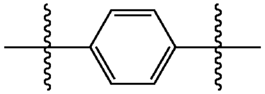 | Z7 | H | H | 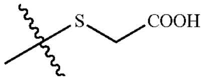 |
| 172 | 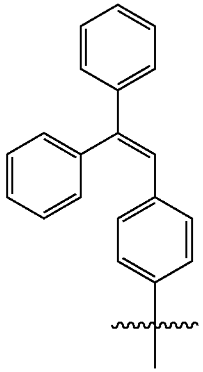 [SMILES: *c1ccc(C=C(c2ccccc2)c2ccccc2)cc1] | 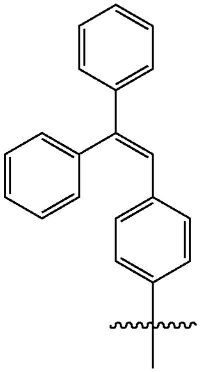 [SMILES: *c1ccc(C=C(c2ccccc2)c2ccccc2)cc1] | 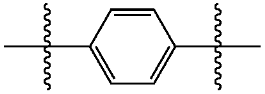 [SMILES: *c1ccc(*)cc1] | Z8 | H | H | 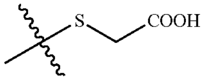 |

-continued
| | | | | | | | |
|---|---|---|---|---|---|---|---|
| 173 | 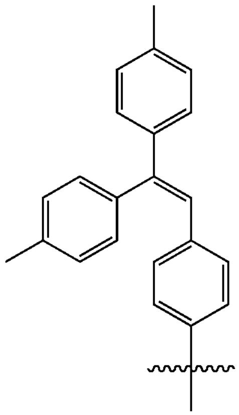 [SMILES: *c1ccc(C=C(c2ccc(C)cc2)c2ccc(C)cc2)cc1] | 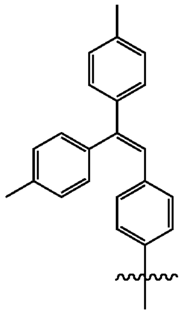 [SMILES: *c1ccc(C=C(c2ccc(C)cc2)c2ccc(C)cc2)cc1] | 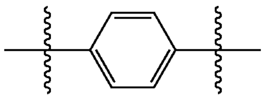 [SMILES: *c1ccc(*)cc1] | Z8 | H | H | 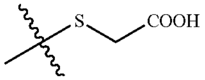 |
| 174 | 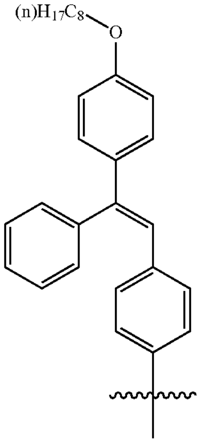 | 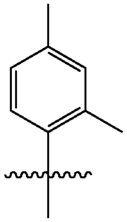 [SMILES: *c1ccc(C)cc1C] | 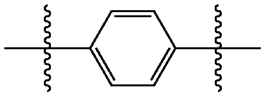 [SMILES: *c1ccc(*)cc1] | Z8 | H | H | 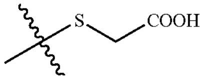 |
| 175 | 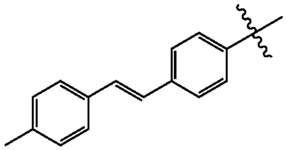 [SMILES: *c1ccc(/C=C/c2ccc(C)cc2)cc1] | 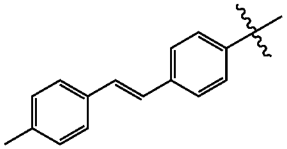 [SMILES: *c1ccc(/C=C/c2ccc(C)cc2)cc1] | 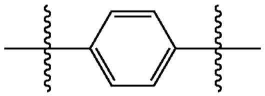 | Z8 | H | H | 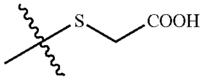 [SMILES: *SCC(=O)O] |

-continued
| | | | | | | | |
|---|---|---|---|---|---|---|---|
| 176 | 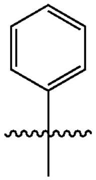 [SMILES: *c1ccccc1] | 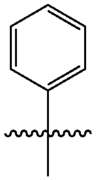 [SMILES: *c1ccccc1] | 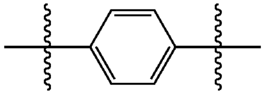 [SMILES: *c1ccc(*)cc1] | Z8 | H | H | 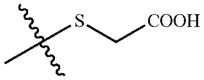 |
| 177 | 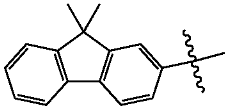 [SMILES: *c1ccc2c(c1)C(C)(C)c1ccccc1-2] | 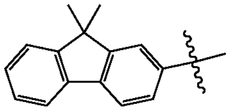 [SMILES: *c1ccc2c(c1)C(C)(C)c1ccccc1-2] | 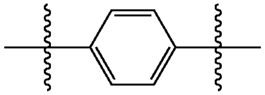 | Z8 | H | H | 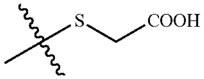 |
| 178 | 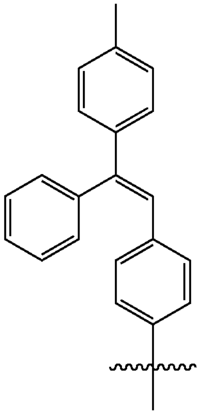 [SMILES: *c1ccc(/C=C(\c2ccccc2)c2ccc(C)cc2)cc1] | 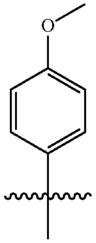 [SMILES: *c1ccc(OC)cc1] | 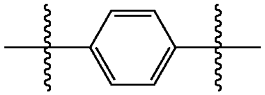 [SMILES: *c1ccc(*)cc1] | Z8 | H | H | 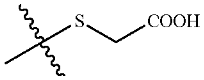 |
| 179 | 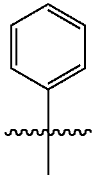 [SMILES: *c1ccccc1] | 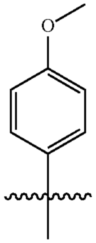 [SMILES: *c1ccc(OC)cc1] | 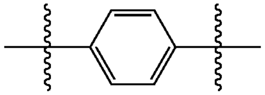 | Z8 | H | H | 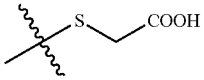 |

-continued
| | | | | | | | |
|---|---|---|---|---|---|---|---|
| 180 | 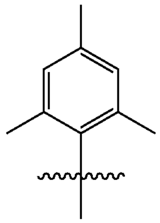 | 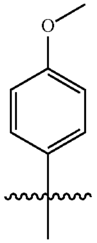 [SMILES: *c1ccc(OC)cc1] | 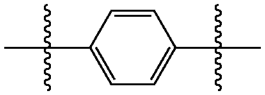 [SMILES: *c1ccc(*)cc1] | Z8 | H | H | 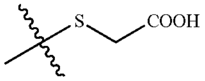<br> |
| 181 | 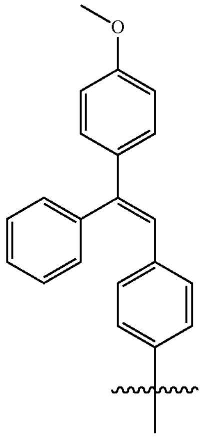 [SMILES: *c1ccc(/C=C(\c2ccccc2)c2ccc(OC)cc2)cc1] | 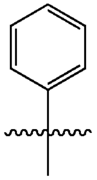 | 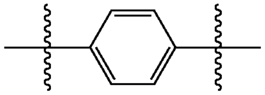 [SMILES: *c1ccc(*)cc1] | Z8 | H | H | 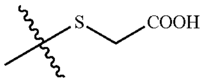<br> |
| 182 | 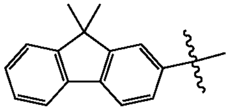 [SMILES: *c1ccc2c(c1)C(C)(C)c1ccccc1-2] | 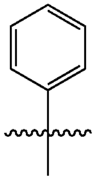 | 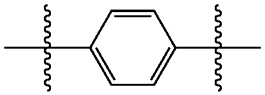 [SMILES: *c1ccc(*)cc1] | Z8 | H | H | 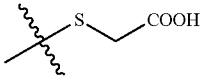<br> |

-continued
| | | | | | | | |
|---|---|---|---|---|---|---|---|
| 183 | 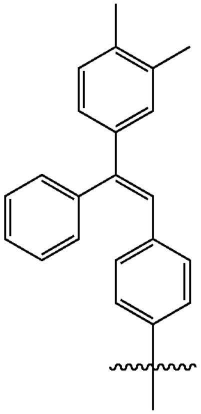 [SMILES: *c1ccc(/C=C(\c2ccccc2)c2ccc(C)c(C)c2)cc1] | 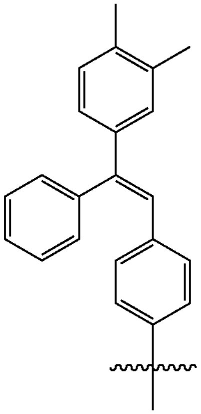 [SMILES: *c1ccc(/C=C(\c2ccccc2)c2ccc(C)c(C)c2)cc1] | 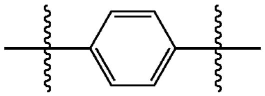 | Z8 | H | H | 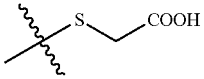 |
| 184 | 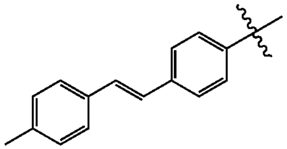 [SMILES: *c1ccc(/C=C/c2ccc(C)cc2)cc1] | 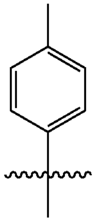 [SMILES: *c1ccc(C)cc1] | 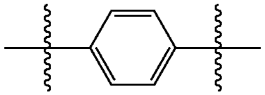 [SMILES: *c1ccc(*)cc1] | Z8 | H | H | 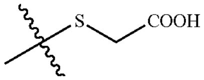 [SMILES: *SCC(=O)O] |
| 185 | 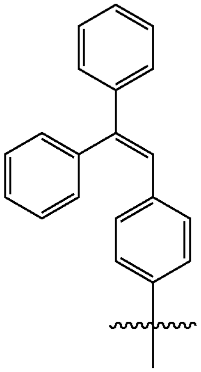 [SMILES: *c1ccc(C=C(c2ccccc2)c2ccccc2)cc1] | 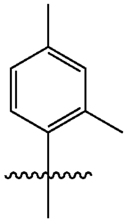 [SMILES: *c1ccc(C)cc1C] | 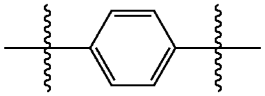 [SMILES: *c1ccc(*)cc1] | Z8 | H | H | 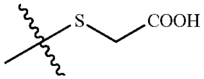 |

-continued
| | | | | | | | |
|---|---|---|---|---|---|---|---|
| 186 | 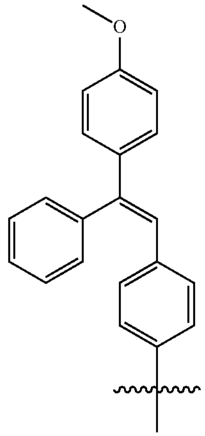 [SMILES: *c1ccc(/C=C(\c2ccccc2)c2ccc(OC)cc2)cc1] | 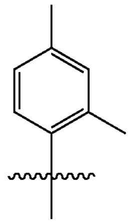 [SMILES: *c1ccc(C)cc1C] | 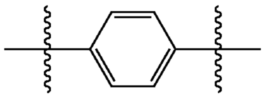 [SMILES: *c1ccc(*)cc1] | Z8 | H | H | 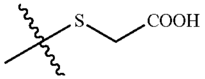 [SMILES: *SCC(=O)O] |
| 187 | 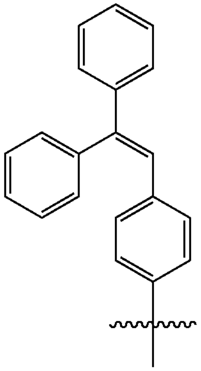 [SMILES: *c1ccc(C=C(c2ccccc2)c2ccccc2)cc1] | 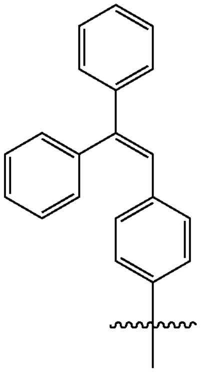 [SMILES: *c1ccc(C=C(c2ccccc2)c2ccccc2)cc1] | 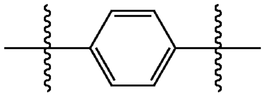 [SMILES: *c1ccc(*)cc1] | Z9 | H | H | 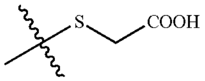 [SMILES: *SCC(=O)O] |

-continued
| | | | | | | | |
|---|---|---|---|---|---|---|---|
| 188 | 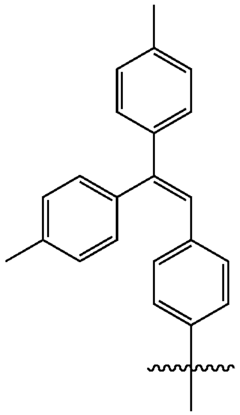 [SMILES: *c1ccc(C=C(c2ccc(C)cc2)c2ccc(C)cc2)cc1] | 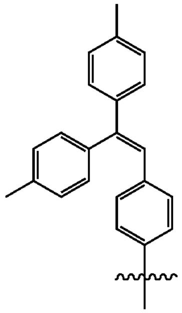 [SMILES: *c1ccc(C=C(c2ccc(C)cc2)c2ccc(C)cc2)cc1] | 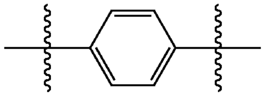 [SMILES: *c1ccc(*)cc1] | Z9 | H | H | 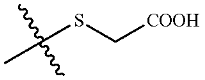 |
| 189 | 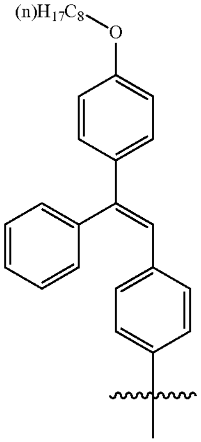 | 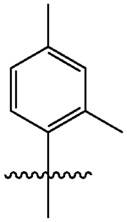 [SMILES: *c1ccc(C)cc1C] | 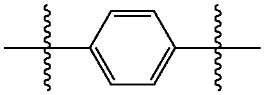 [SMILES: *c1ccc(*)cc1] | Z9 | H | H | 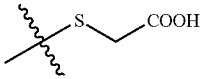 |
| 190 | 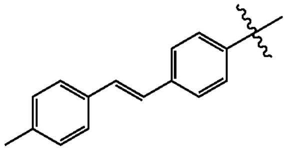 [SMILES: *c1ccc(/C=C/c2ccc(C)cc2)cc1] | 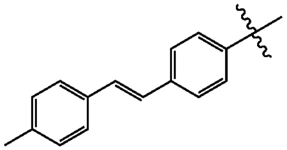 [SMILES: *c1ccc(/C=C/c2ccc(C)cc2)cc1] | 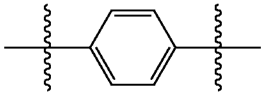 [SMILES: *c1ccc(*)cc1] | Z9 | H | H | 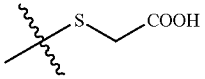 |

-continued
| | | | | | | | |
|---|---|---|---|---|---|---|---|
| 191 | 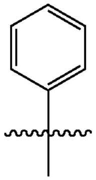 [SMILES: *c1ccccc1] | 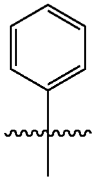 | 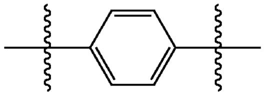 [SMILES: *c1ccc(*)cc1] | Z9 | H | H | 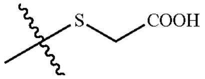 [SMILES: *SCC(=O)O] |
| 192 | 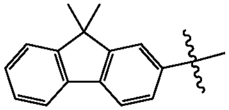 [SMILES: *c1ccc2c(c1)C(C)(C)c1ccccc1-2] | 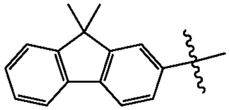 [SMILES: *c1ccc2c(c1)C(C)(C)c1ccccc1-2] | 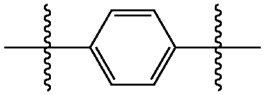 [SMILES: *c1ccc(*)cc1] | Z9 | H | H | 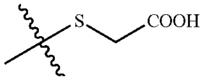 [SMILES: *SCC(=O)O] |
| 193 | 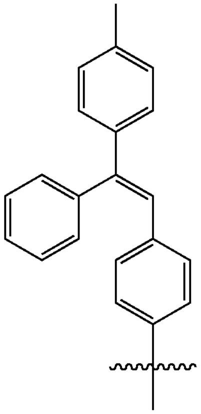 [SMILES: *c1ccc(/C=C(\c2ccccc2)c2ccc(C)cc2)cc1] | 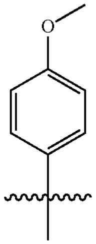 [SMILES: *c1ccc(OC)cc1] | 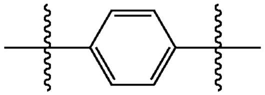 [SMILES: *c1ccc(*)cc1] | Z9 | H | H | 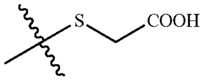 |
| 194 | 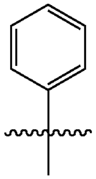 [SMILES: *c1ccccc1] | 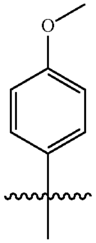 | 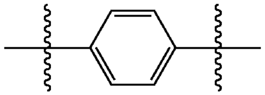 [SMILES: *c1ccc(*)cc1] | Z9 | H | H | 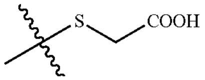 [SMILES: *SCC(=O)O] |

-continued
| | | | | | | | |
|---|---|---|---|---|---|---|---|
| 195 | 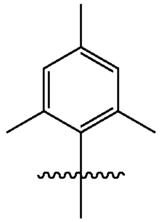 | 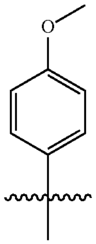 [SMILES: *c1ccc(OC)cc1] | 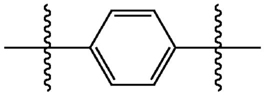 [SMILES: *c1ccc(*)cc1] | Z9 | H | H | 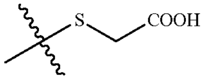  |
| 196 | 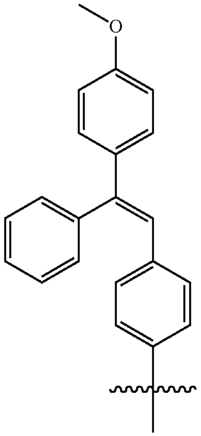 [SMILES: *c1ccc(/C=C(\c2ccccc2)c2ccc(OC)cc2)cc1]  | 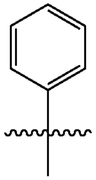 [SMILES: *c1ccccc1] | 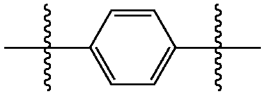 [SMILES: *c1ccc(*)cc1] | Z9 | H | H | 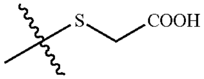 [SMILES: *SCC(=O)O]  |
| 197 | 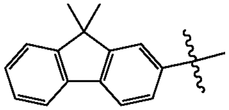 [SMILES: *c1ccc2c(c1)C(C)(C)c1ccccc1-2] | 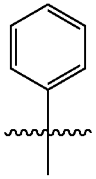 [SMILES: *c1ccccc1] | 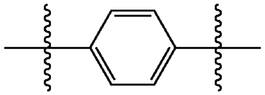 [SMILES: *c1ccc(*)cc1] | Z9 | H | H | 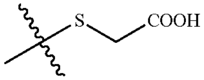  |

-continued
| | | | | | | |
|---|---|---|---|---|---|---|
| 198 | 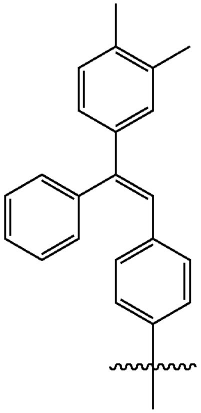 [SMILES: *c1ccc(/C=C(\c2ccccc2)c2ccc(C)c(C)c2)cc1] | 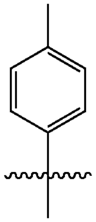 [SMILES: *c1ccc(C)cc1] | 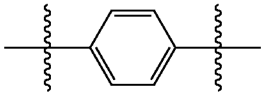 [SMILES: *c1ccc(*)cc1] | Z9 | H | H | 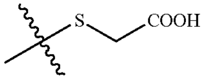 |
| 199 | 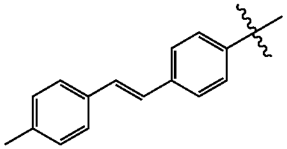 [SMILES: *c1ccc(/C=C/c2ccc(C)cc2)cc1] | 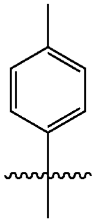 [SMILES: *c1ccc(C)cc1] | 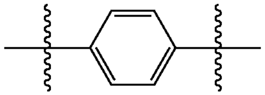 [SMILES: *c1ccc(*)cc1] | Z9 | H | H | 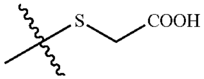 |
| 200 | 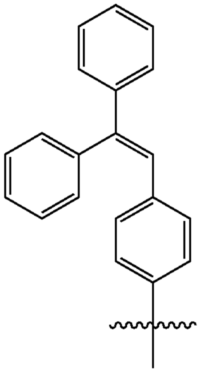 [SMILES: *c1ccc(C=C(c2ccccc2)c2ccccc2)cc1] | 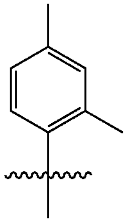 [SMILES: *c1ccc(C)cc1C] | 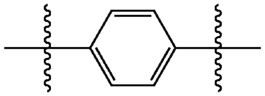 [SMILES: *c1ccc(*)cc1] | Z9 | H | H | 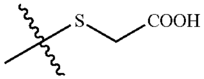 |

-continued
| | | | | | | | |
|---|---|---|---|---|---|---|---|
| 201 | 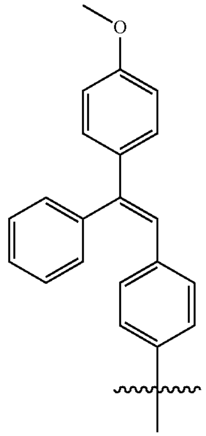 [SMILES: *c1ccc(/C=C(\c2ccccc2)c2ccc(OC)cc2)cc1] | 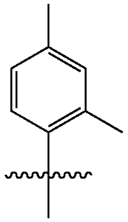 [SMILES: *c1ccc(C)cc1C] | 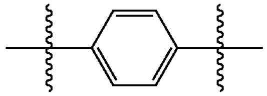 [SMILES: *c1ccc(*)cc1] | Z9 | H | H | 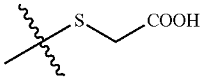 |
| 202 | 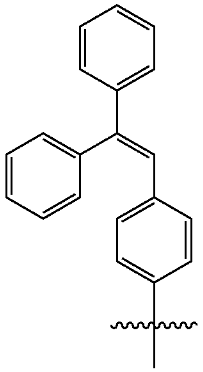 [SMILES: *c1ccc(C=C(c2ccccc2)c2ccccc2)cc1] | 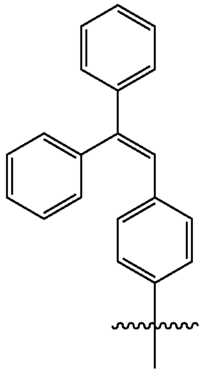 [SMILES: *c1ccc(C=C(c2ccccc2)c2ccccc2)cc1] | 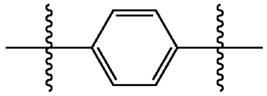 [SMILES: *c1ccc(*)cc1] | Z10 | H | H | 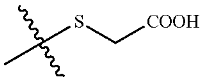 |

-continued
| | | | | | | | |
|---|---|---|---|---|---|---|---|
| 203 | 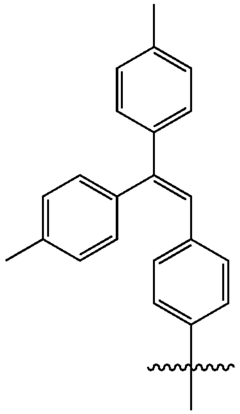 [SMILES: *c1ccc(C=C(c2ccc(C)cc2)c2ccc(C)cc2)cc1] | 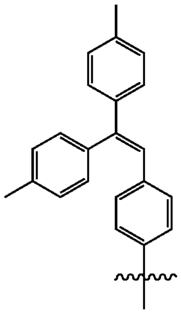 [SMILES: *c1ccc(C=C(c2ccc(C)cc2)c2ccc(C)cc2)cc1] | 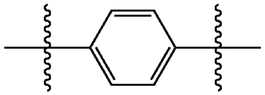 [SMILES: *c1ccc(*)cc1] | Z10 | H | H | 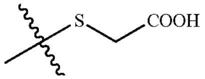 [SMILES: *SCC(=O)O] |
| 204 | 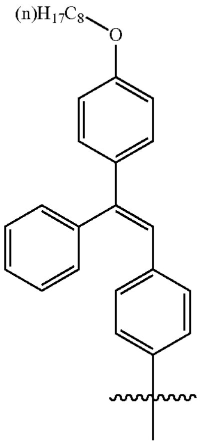 | 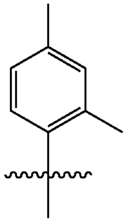 [SMILES: *c1ccc(C)cc1C] | 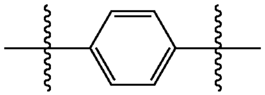 [SMILES: *c1ccc(*)cc1] | Z10 | H | H | 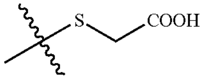 |
| 205 | 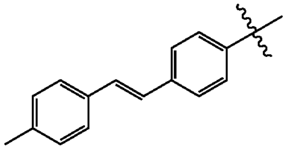 [SMILES: *c1ccc(/C=C/c2ccc(C)cc2)cc1] | 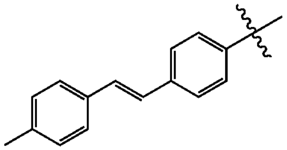 [SMILES: *c1ccc(/C=C/c2ccc(C)cc2)cc1] | 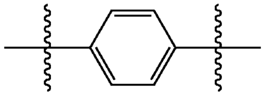 [SMILES: *c1ccc(*)cc1] | Z10 | H | H | 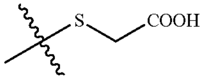 [SMILES: *SCC(=O)O] |

-continued
| | | | | | | | |
|---|---|---|---|---|---|---|---|
| 206 | 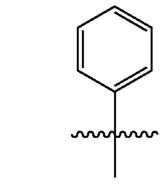 [SMILES: *c1ccccc1] | 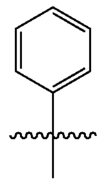 [SMILES: *c1ccccc1] | 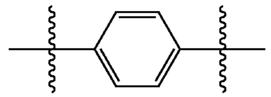 [SMILES: *c1ccc(*)cc1] | Z10 | H | H | 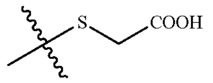  |
| 207 | 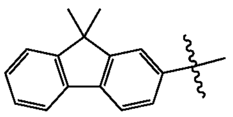 [SMILES: *c1ccc2c(c1)C(C)(C)c1ccccc1-2] | 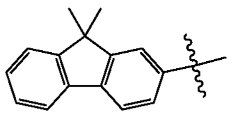 [SMILES: *c1ccc2c(c1)C(C)(C)c1ccccc1-2] | 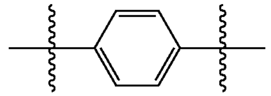 | Z10 | H | H | 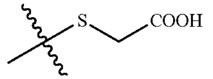 [SMILES: *SCC(=O)O]  |
| 208 | 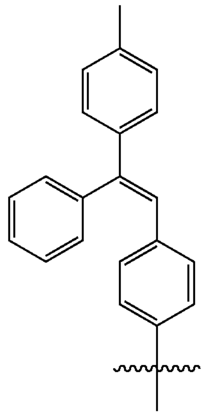 | 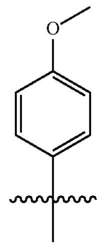 [SMILES: *c1ccc(OC)cc1]  | 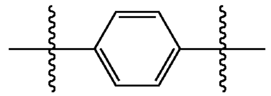 [SMILES: *c1ccc(*)cc1] | Z10 | H | H | 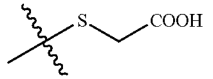 [SMILES: *SCC(=O)O]  |
| 209 | 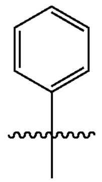 [SMILES: *c1ccccc1] | 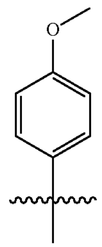 [SMILES: *c1ccc(OC)cc1]  | 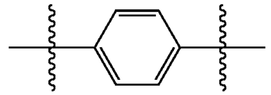 [SMILES: *c1ccc(*)cc1] | Z10 | H | H | 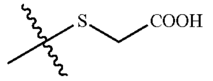  |

-continued
| | | | | | | | |
|---|---|---|---|---|---|---|---|
| 210 | 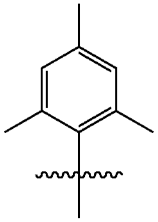 | 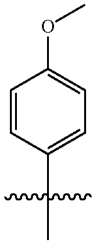 [SMILES: *c1ccc(OC)cc1] | 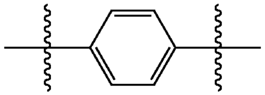 [SMILES: *c1ccc(*)cc1] | Z10 | H | H | 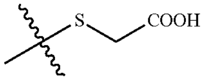 |
| 211 | 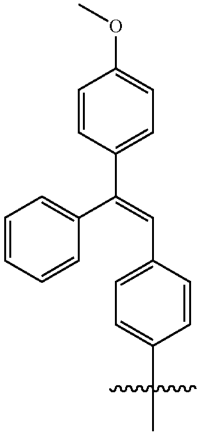 [SMILES: *c1ccc(/C=C(\c2ccccc2)c2ccc(OC)cc2)cc1] | 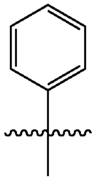 [SMILES: *c1ccccc1] | 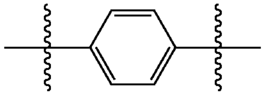 [SMILES: *c1ccc(*)cc1] | Z10 | H | H | 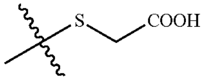 |
| 212 | 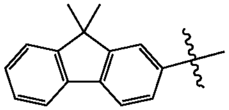 [SMILES: *c1ccc2c(c1)C(C)(C)c1ccccc1-2] | 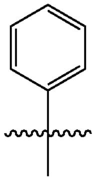 | 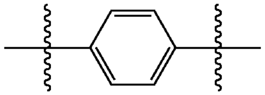 [SMILES: *c1ccc(*)cc1] | Z10 | H | H | 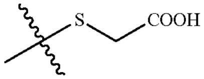 |

-continued
| | | | | | | | |
|---|---|---|---|---|---|---|---|
| 213 | 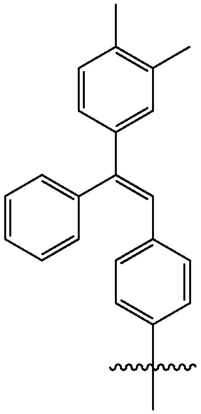 | 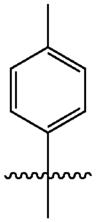 | 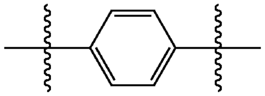 [SMILES: *c1ccc(*)cc1] | Z10 | H | H | 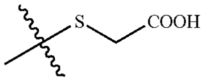 [SMILES: *SCC(=O)O] |
| 214 | 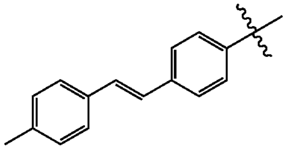 [SMILES: *c1ccc(/C=C/c2ccc(C)cc2)cc1] | 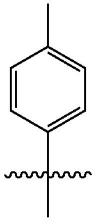 [SMILES: *c1ccc(C)cc1] | 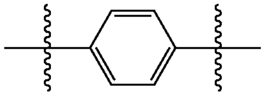 [SMILES: *c1ccc(*)cc1] | Z10 | H | H | 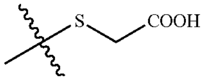 |
| 215 | 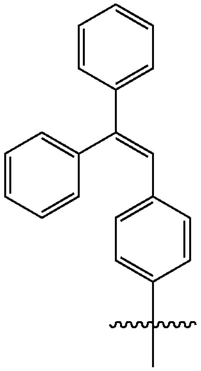 [SMILES: *c1ccc(C=C(c2ccccc2)c2ccccc2)cc1] | 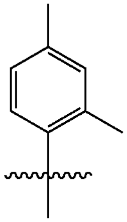 [SMILES: *c1ccc(C)cc1C] | 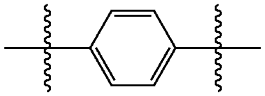 [SMILES: *c1ccc(*)cc1] | Z10 | H | H | 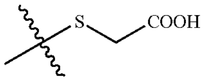 |

-continued
| | | | | | | | |
|---|---|---|---|---|---|---|---|
| 216 | 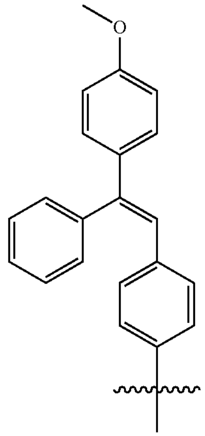 [SMILES: *c1ccc(/C=C(\c2ccccc2)c2ccc(OC)cc2)cc1] | 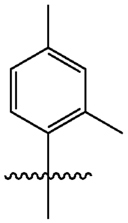 [SMILES: *c1ccc(C)cc1C] | 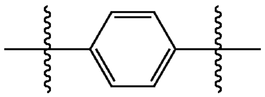 [SMILES: *c1ccc(*)cc1] | Z10 | H | H | 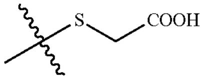 |
| 217 | 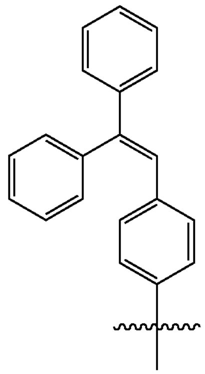 [SMILES: *c1ccc(C=C(c2ccccc2)c2ccccc2)cc1] | 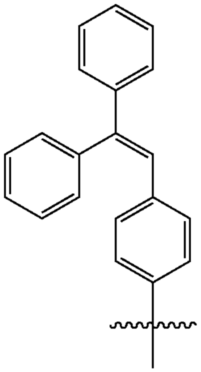 [SMILES: *c1ccc(C=C(c2ccccc2)c2ccccc2)cc1] | 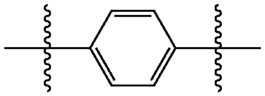 [SMILES: *c1ccc(*)cc1] | Z1 | 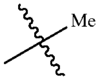 | H | 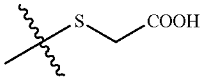 |

-continued
| | | | | | | | |
|---|---|---|---|---|---|---|---|
| 218 | 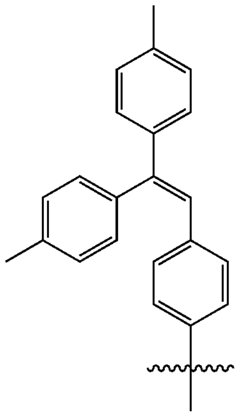 [SMILES: *c1ccc(C=C(c2ccc(C)cc2)c2ccc(C)cc2)cc1] | 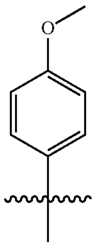 [SMILES: *c1ccc(OC)cc1] | 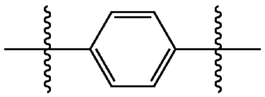 [SMILES: *c1ccc(*)cc1] | Z1 | 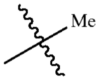 | H | 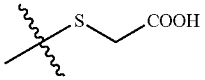 [SMILES: *SCC(=O)O] |
| 219 | 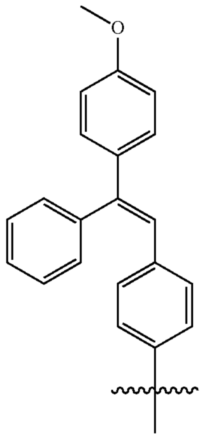 [SMILES: *c1ccc(/C=C(\c2ccccc2)c2ccc(OC)cc2)cc1] | 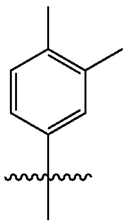 [SMILES: *c1ccc(C)c(C)c1] | 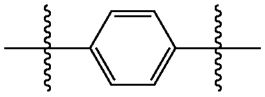 [SMILES: *c1ccc(*)cc1] | Z1 | 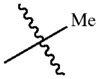 | H | 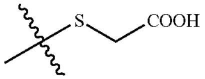 [SMILES: *SCC(=O)O] |
| 220 | 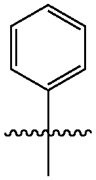 [SMILES: *c1ccccc1] | 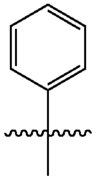 [SMILES: *c1ccccc1] | 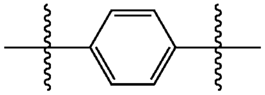 [SMILES: *c1ccc(*)cc1] | Z1 | 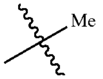 | H | 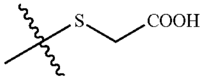 [SMILES: *SCC(=O)O] |

-continued
| | | | | | | | |
|---|---|---|---|---|---|---|---|
| 221 | 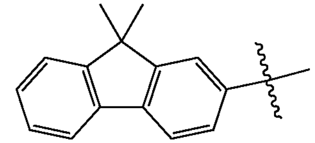 [SMILES: *c1ccc2c(c1)C(C)(C)c1ccccc1-2] | 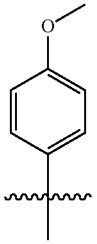 [SMILES: *c1ccc(OC)cc1] | 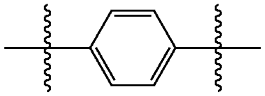 [SMILES: *c1ccc(*)cc1] | Z1 | 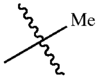 | H | 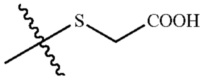 [SMILES: *SCC(=O)O] |
| 222 | 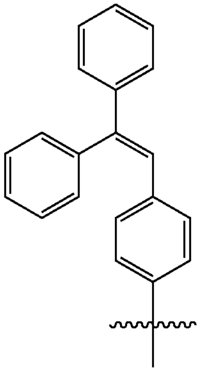 [SMILES: *c1ccc(C=C(c2ccccc2)c2ccccc2)cc1] | 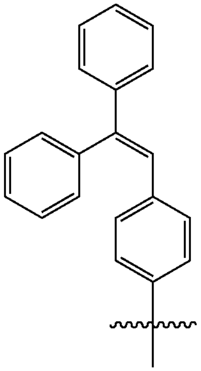 [SMILES: *c1ccc(C=C(c2ccccc2)c2ccccc2)cc1] | 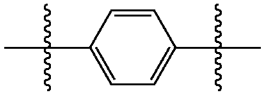 [SMILES: *c1ccc(*)cc1] | Z1 | H | 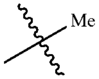 | 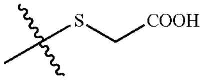 |
| 223 | 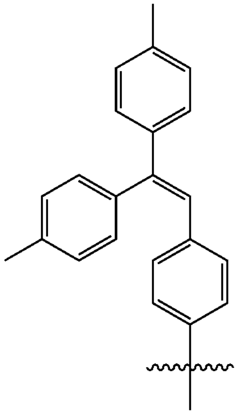 [SMILES: *c1ccc(C=C(c2ccc(C)cc2)c2ccc(C)cc2)cc1] | 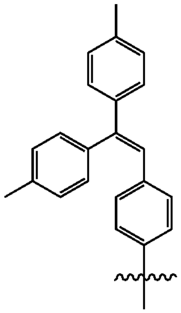 [SMILES: *c1ccc(C=C(c2ccc(C)cc2)c2ccc(C)cc2)cc1] | 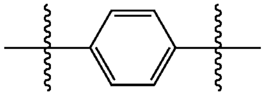 [SMILES: *c1ccc(*)cc1] | Z1 | H | 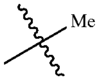 | 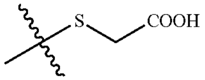 [SMILES: *SCC(=O)O] |

-continued
| | | | | | | | |
|---|---|---|---|---|---|---|---|
| 224 | 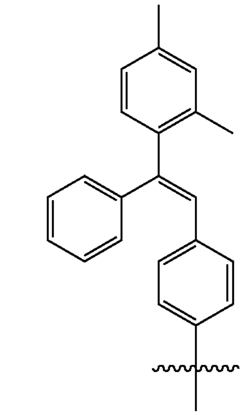 | 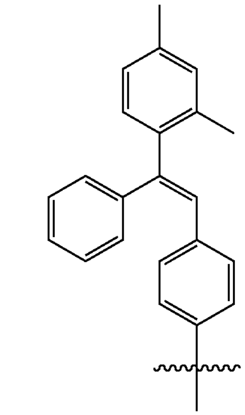 [SMILES: *c1ccc(/C=C(\c2ccccc2)c2ccc(C)cc2C)cc1] | 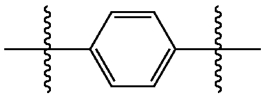 [SMILES: *c1ccc(*)cc1] | Z1 | H | 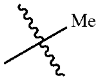 | 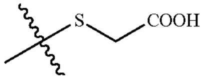 [SMILES: *SCC(=O)O] |
| 225 | 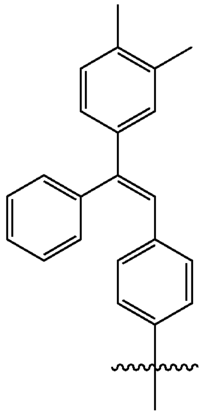 | 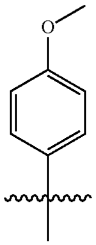 [SMILES: *c1ccc(OC)cc1] | 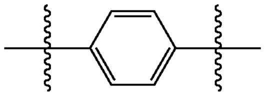 [SMILES: *c1ccc(*)cc1] | Z1 | H | 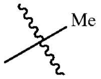 | 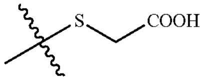 [SMILES: *SCC(=O)O] |
| 226 | 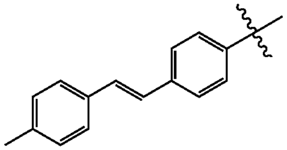 [SMILES: *c1ccc(/C=C/c2ccc(C)cc2)cc1] | 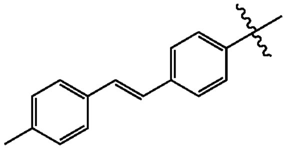 [SMILES: *c1ccc(/C=C/c2ccc(C)cc2)cc1] | 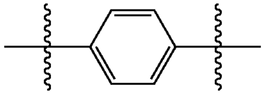 [SMILES: *c1ccc(*)cc1] | Z1 | H | 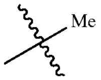 | 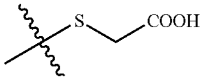 [SMILES: *SCC(=O)O] |

-continued
| | | | | | | | |
|---|---|---|---|---|---|---|---|
| 227 | 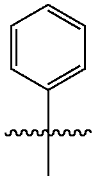 [SMILES: *c1ccccc1] | 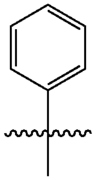 | 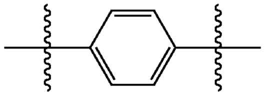 [SMILES: *c1ccc(*)cc1] | Z1 | H | 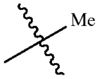 | 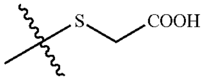 [SMILES: *SCC(=O)O] |
| 228 | 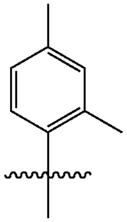 [SMILES: *c1ccc(C)cc1C] | 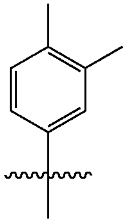 [SMILES: *c1ccc(C)c(C)c1] | 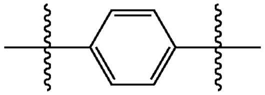 | Z1 | H | 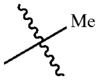 | 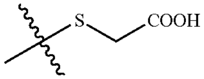 |
| 229 | 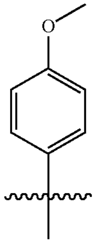 [SMILES: *c1ccc(OC)cc1] | 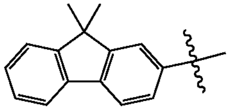 [SMILES: *c1ccc2c(c1)C(C)(C)c1ccccc1-2] | 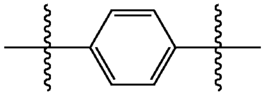 [SMILES: *c1ccc(*)cc1] | Z1 | H | 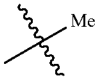 | 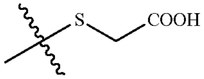 |
| 230 | 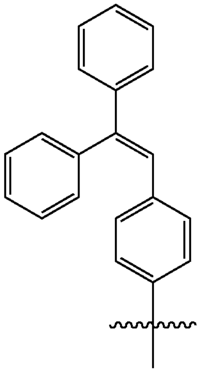 [SMILES: *c1ccc(C=C(c2ccccc2)c2ccccc2)cc1] | 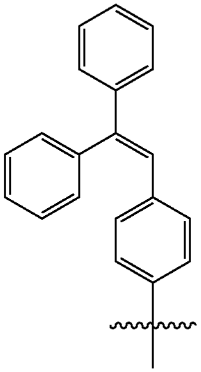 [SMILES: *c1ccc(C=C(c2ccccc2)c2ccccc2)cc1] | 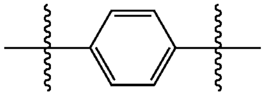 [SMILES: *c1ccc(*)cc1] | Z1 | 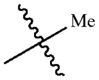 | 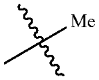 | 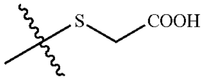 [SMILES: *SCC(=O)O] |

-continued
| | | | | | | | |
|---|---|---|---|---|---|---|---|
| 231 | 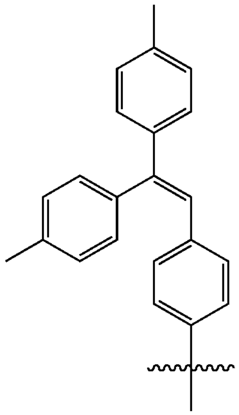 [SMILES: *c1ccc(C=C(c2ccc(C)cc2)c2ccc(C)cc2)cc1] | 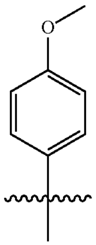 [SMILES: *c1ccc(OC)cc1] | 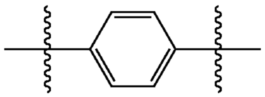 [SMILES: *c1ccc(*)cc1] | Z1 | 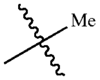 | 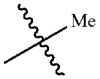 | 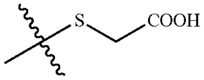 [SMILES: *SCC(=O)O] |
| 232 | 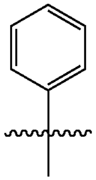 [SMILES: *c1ccccc1] | 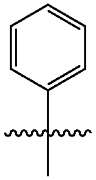 | 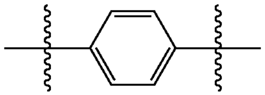 [SMILES: *c1ccc(*)cc1] | Z1 | 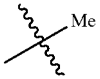 | 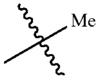 | 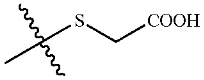 |
| 233 | 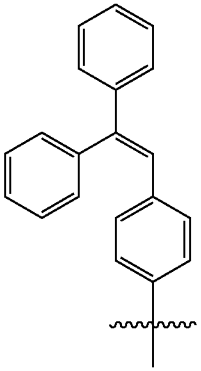 [SMILES: *c1ccc(C=C(c2ccccc2)c2ccccc2)cc1] | 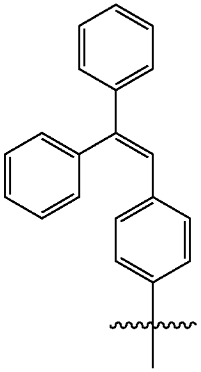 [SMILES: *c1ccc(C=C(c2ccccc2)c2ccccc2)cc1] | 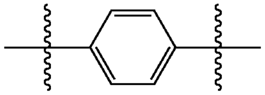 [SMILES: *c1ccc(*)cc1] | Z1 | 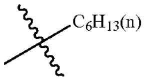 | H | 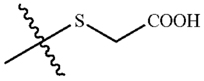 [SMILES: *SCC(=O)O] |

-continued
| | | | | | | | |
|---|---|---|---|---|---|---|---|
| 234 | 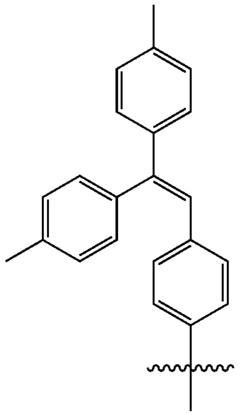 [SMILES: *c1ccc(C=C(c2ccc(C)cc2)c2ccc(C)cc2)cc1] | 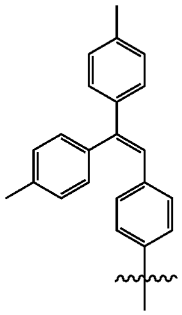 [SMILES: *c1ccc(C=C(c2ccc(C)cc2)c2ccc(C)cc2)cc1] | 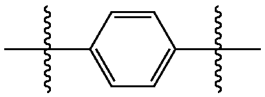 [SMILES: *c1ccc(*)cc1] | Z1 | 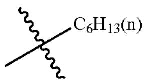 | H | 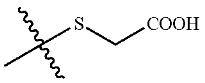 |
| 235 | 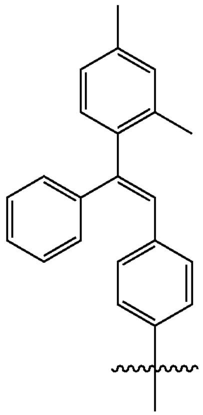 | 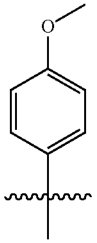 [SMILES: *c1ccc(OC)cc1] | 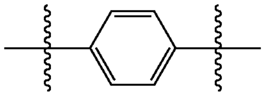 [SMILES: *c1ccc(*)cc1] | Z1 | 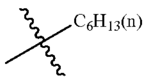 | H | 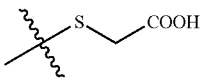 [SMILES: *SCC(=O)O] |

-continued
| | | | | | | | |
|---|---|---|---|---|---|---|---|
| 236 | 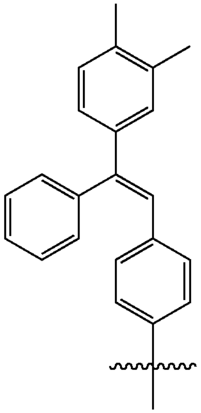 | 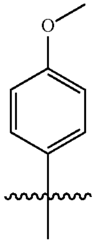 [SMILES: *c1ccc(OC)cc1] | 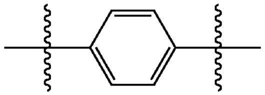 [SMILES: *c1ccc(*)cc1] | Z1 | 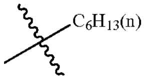 | H | 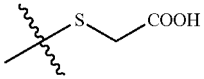 |
| 237 | 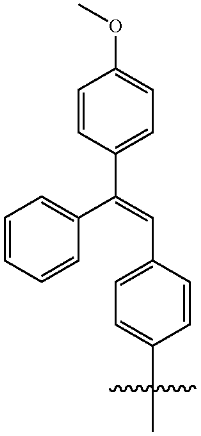 [SMILES: *c1ccc(/C=C(\c2ccccc2)c2ccc(OC)cc2)cc1] | 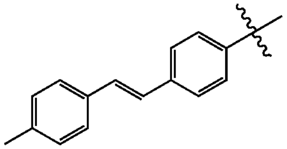 [SMILES: *c1ccc(/C=C/c2ccc(C)cc2)cc1] | 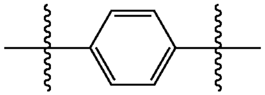 [SMILES: *c1ccc(*)cc1] | Z1 | 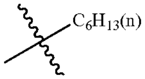 | H | 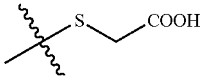 |
| 238 | 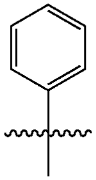 [SMILES: *c1ccccc1] | 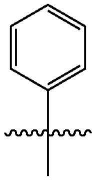 [SMILES: *c1ccccc1] | 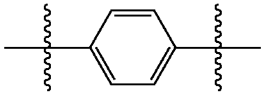 [SMILES: *c1ccc(*)cc1] | Z1 | 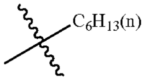 | H | 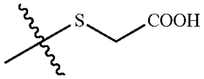 [SMILES: *SCC(=O)O] |

-continued
| | | | | | | |
|---|---|---|---|---|---|---|
| 239 | 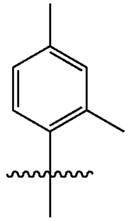 [SMILES: *c1ccc(C)cc1C] | 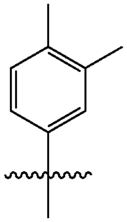 [SMILES: *c1ccc(C)c(C)c1] | 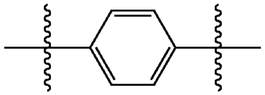 [SMILES: *c1ccc(*)cc1] | Z1 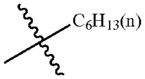 | H | 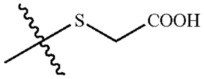 [SMILES: *SCC(=O)O] |
| 240 | 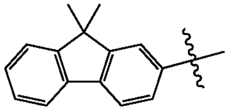 [SMILES: *c1ccc2c(c1)C(C)(C)c1ccccc1-2] | 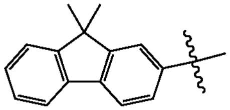 [SMILES: *c1ccc2c(c1)C(C)(C)c1ccccc1-2] | 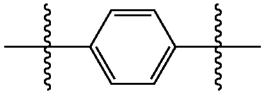 [SMILES: *c1ccc(*)cc1] | Z1 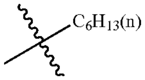 | H | 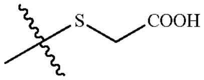 |
| 241 | 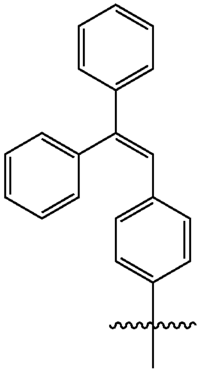 [SMILES: *c1ccc(C=C(c2ccccc2)c2ccccc2)cc1] | 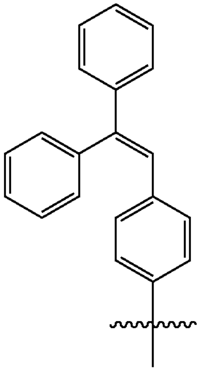 [SMILES: *c1ccc(C=C(c2ccccc2)c2ccccc2)cc1] | 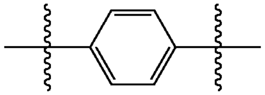 [SMILES: *c1ccc(*)cc1] | Z1 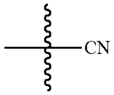 | H | 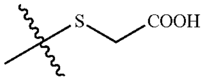 [SMILES: *SCC(=O)O] |

-continued
| | | | | | | | |
|---|---|---|---|---|---|---|---|
| 242 | 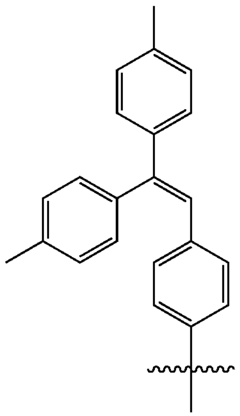 [SMILES: *c1ccc(C=C(c2ccc(C)cc2)c2ccc(C)cc2)cc1] | 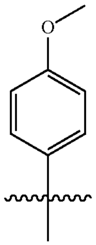 [SMILES: *c1ccc(OC)cc1] | 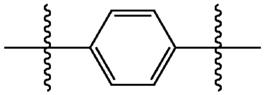 [SMILES: *c1ccc(*)cc1] | Z1 | 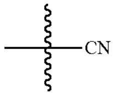 | H | 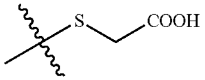 [SMILES: *SCC(=O)O] |
| 243 | 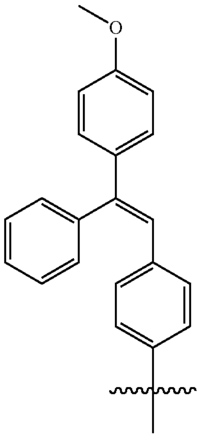 [SMILES: *c1ccc(/C=C(\c2ccccc2)c2ccc(OC)cc2)cc1] | 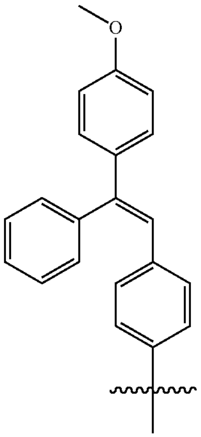 [SMILES: *c1ccc(/C=C(\c2ccccc2)c2ccc(OC)cc2)cc1] | 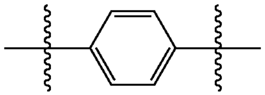 [SMILES: *c1ccc(*)cc1] | Z1 | 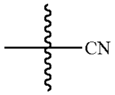 [SMILES: *C#N] | H | 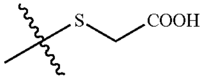 |
| 244 | 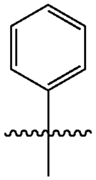 [SMILES: *c1ccccc1] | 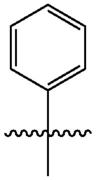 [SMILES: *c1ccccc1] | 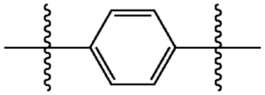 [SMILES: *c1ccc(*)cc1] | Z1 | 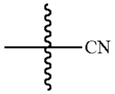 | H | 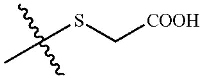 [SMILES: *SCC(=O)O] |

-continued
| | | | | | | | |
|---|---|---|---|---|---|---|---|
| 245 | 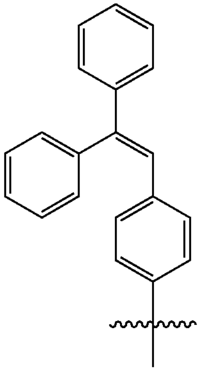 [SMILES: *c1ccc(C=C(c2ccccc2)c2ccccc2)cc1] | 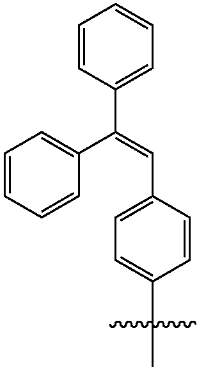 [SMILES: *c1ccc(C=C(c2ccccc2)c2ccccc2)cc1] | 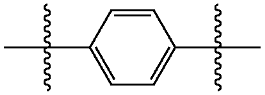 [SMILES: *c1ccc(*)cc1] | Z1 | H | H | 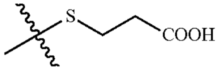 [SMILES: *SCCC(=O)O] |
| 246 | 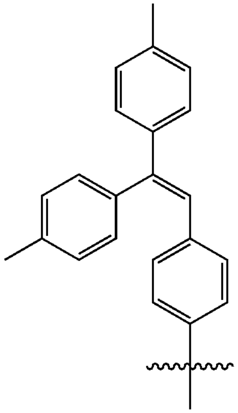 [SMILES: *c1ccc(C=C(c2ccc(C)cc2)c2ccc(C)cc2)cc1] | 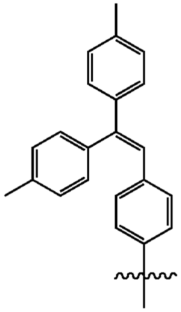 [SMILES: *c1ccc(C=C(c2ccc(C)cc2)c2ccc(C)cc2)cc1] | 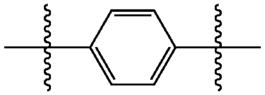 | Z1 | H | H | 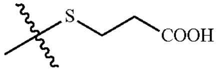 [SMILES: *SCCC(=O)O] |

-continued
| | | | | | | | |
|---|---|---|---|---|---|---|---|
| 247 | 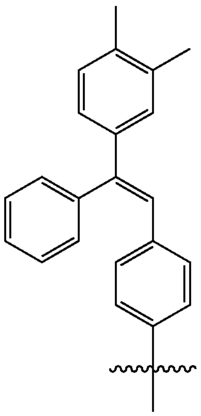 [SMILES: *c1ccc(/C=C(\c2ccccc2)c2ccc(C)c(C)c2)cc1] | 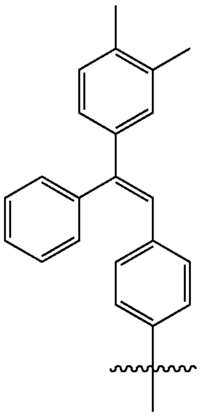 [SMILES: *c1ccc(/C=C(\c2ccccc2)c2ccc(C)c(C)c2)cc1] | 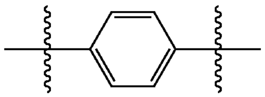 [SMILES: *c1ccc(*)cc1] | Z1 | H | H | 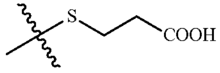 [SMILES: *SCCC(=O)O] |
| 248 | 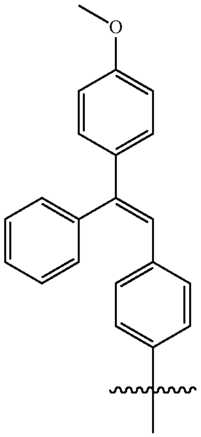 [SMILES: *c1ccc(/C=C(\c2ccccc2)c2ccc(OC)cc2)cc1] | 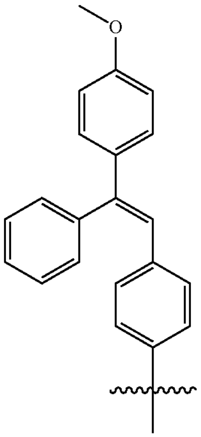 [SMILES: *c1ccc(/C=C(\c2ccccc2)c2ccc(OC)cc2)cc1] | 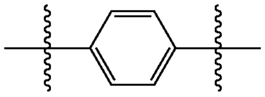 [SMILES: *c1ccc(*)cc1] | Z1 | H | H | 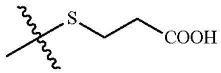 [SMILES: *SCCC(=O)O] |
| 249 | 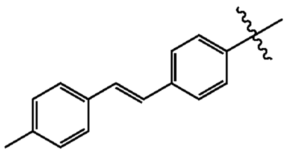 [SMILES: *c1ccc(/C=C/c2ccc(C)cc2)cc1] | 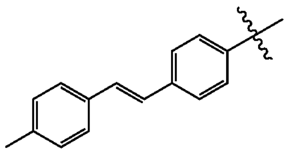 [SMILES: *c1ccc(/C=C/c2ccc(C)cc2)cc1] | 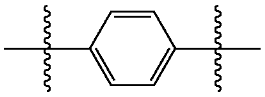 [SMILES: *c1ccc(*)cc1] | Z1 | H | H | 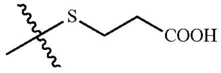 [SMILES: *SCCC(=O)O] |

-continued
| | | | | | | | |
|---|---|---|---|---|---|---|---|
| 250 | 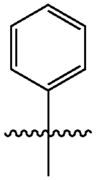 [SMILES: *c1ccccc1] | 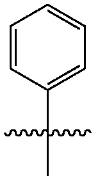 [SMILES: *c1ccccc1] | 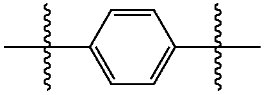 [SMILES: *c1ccc(*)cc1] | Z1 | H | H | 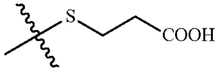 [SMILES: *SCCC(=O)O] |
| 251 | 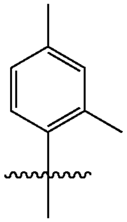 [SMILES: *c1ccc(C)cc1C] | 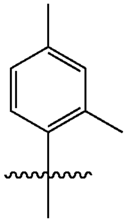 [SMILES: *c1ccc(C)cc1C] | 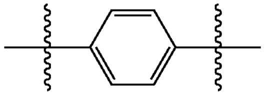 | Z1 | H | H | 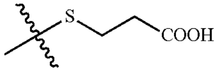 [SMILES: *SCCC(=O)O] |
| 252 | 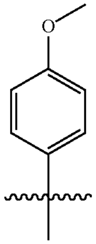 [SMILES: *c1ccc(OC)cc1] | 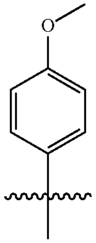 [SMILES: *c1ccc(OC)cc1] | 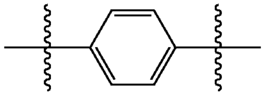 [SMILES: *c1ccc(*)cc1] | Z1 | H | H | 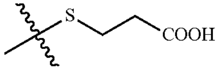 [SMILES: *SCCC(=O)O] |
| 253 | 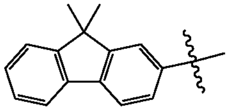 [SMILES: *c1ccc2c(c1)C(C)(C)c1ccccc1-2] | 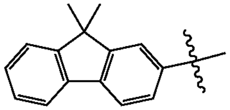 [SMILES: *c1ccc2c(c1)C(C)(C)c1ccccc1-2] | 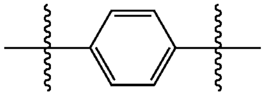 [SMILES: *c1ccc(*)cc1] | Z1 | H | H | 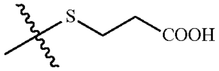 [SMILES: *SCCC(=O)O] |

-continued
| | | | | | | | |
|---|---|---|---|---|---|---|---|
| 254 | 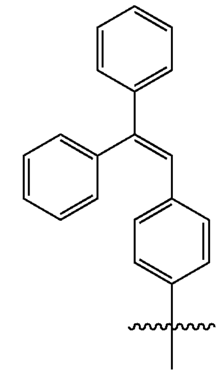 [SMILES: *c1ccc(C=C(c2ccccc2)c2ccccc2)cc1] | 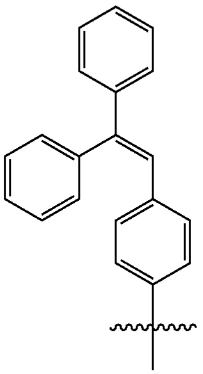 [SMILES: *c1ccc(C=C(c2ccccc2)c2ccccc2)cc1] | 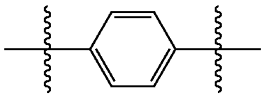 [SMILES: *c1ccc(*)cc1] | Z1 | H | H | 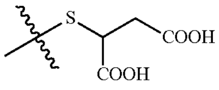 [SMILES: *SC(CC(=O)O)C(=O)O] |
| 255 | 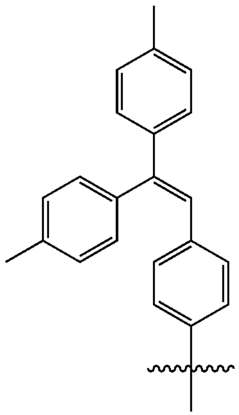 [SMILES: *c1ccc(C=C(c2ccc(C)cc2)c2ccc(C)cc2)cc1] | 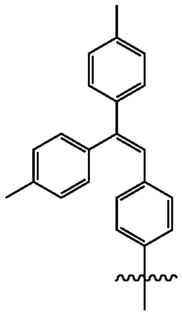 [SMILES: *c1ccc(C=C(c2ccc(C)cc2)c2ccc(C)cc2)cc1] | 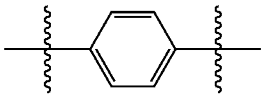 | Z1 | H | H | 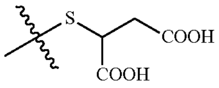 [SMILES: *SC(CC(=O)O)C(=O)O] |

-continued
| | | | | | | | |
|---|---|---|---|---|---|---|---|
| 256 | 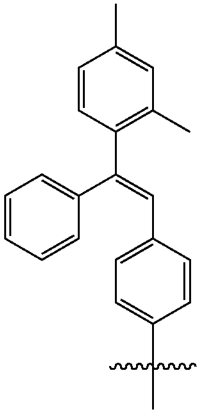 | 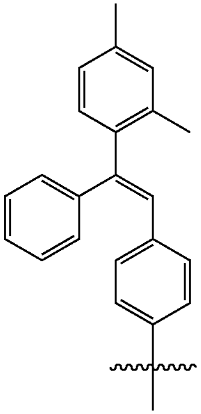 [SMILES: *c1ccc(/C=C(\c2ccccc2)c2ccc(C)cc2C)cc1] | 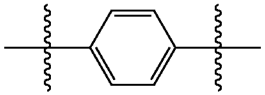 [SMILES: *c1ccc(*)cc1] | Z1 | H | H | 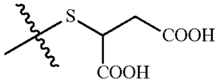 |
| 257 | 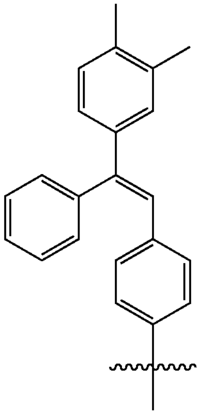 | 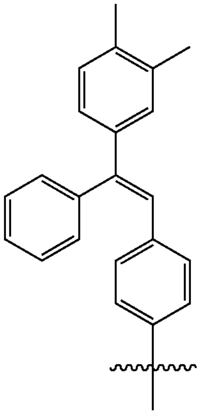 [SMILES: *c1ccc(/C=C(\c2ccccc2)c2ccc(C)c(C)c2)cc1] | 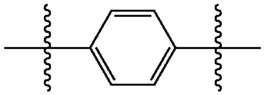 [SMILES: *c1ccc(*)cc1] | Z1 | H | H | 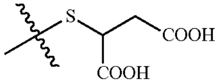 [SMILES: *SC(CC(=O)O)C(=O)O] |

-continued
| | | | | | | | |
|---|---|---|---|---|---|---|---|
| 258 | 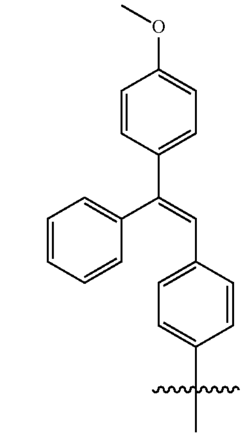 [SMILES: *c1ccc(/C=C(\c2ccccc2)c2ccc(OC)cc2)cc1]  | 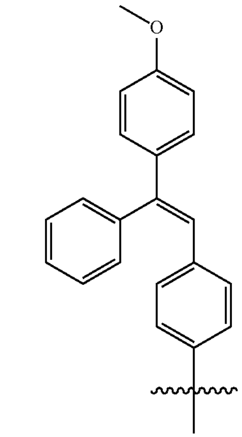 [SMILES: *c1ccc(/C=C(\c2ccccc2)c2ccc(OC)cc2)cc1]  | 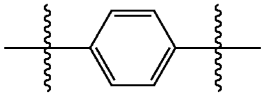 [SMILES: *c1ccc(*)cc1] | Z1 | H | H | 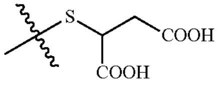 [SMILES: *SC(CC(=O)O)C(=O)O]  |
| 259 | 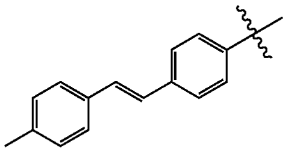 [SMILES: *c1ccc(/C=C/c2ccc(C)cc2)cc1] | 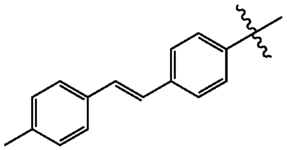 [SMILES: *c1ccc(/C=C/c2ccc(C)cc2)cc1] | 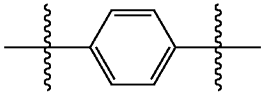 [SMILES: *c1ccc(*)cc1] | Z1 | H | H | 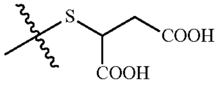  |
| 260 | 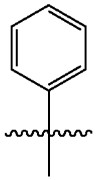 [SMILES: *c1ccccc1] | 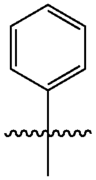 [SMILES: *c1ccccc1] | 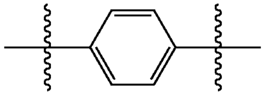 | Z1 | H | H | 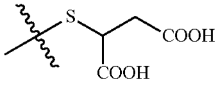 [SMILES: *SC(CC(=O)O)C(=O)O]  |
| 261 | 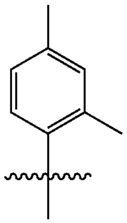 [SMILES: *c1ccc(C)cc1C] | 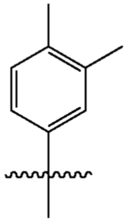 [SMILES: *c1ccc(C)c(C)c1] | 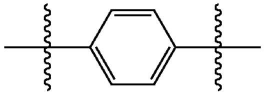 | Z1 | H | H | 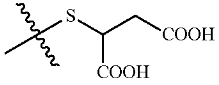 [SMILES: *SC(CC(=O)O)C(=O)O]  |

-continued
| | | | | | | | |
|---|---|---|---|---|---|---|---|
| 262 | 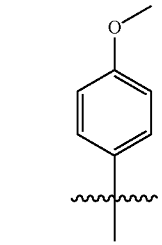 [SMILES: *c1ccc(OC)cc1] | 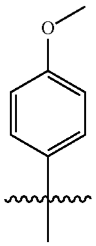 | 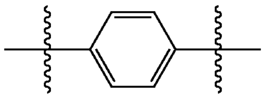 [SMILES: *c1ccc(*)cc1] | Z1 | H | H | 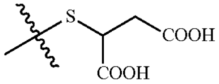 [SMILES: *SC(CC(=O)O)C(=O)O] |
| 263 | 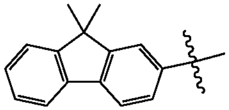 [SMILES: *c1ccc2c(c1)C(C)(C)c1ccccc1-2] | 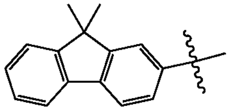 [SMILES: *c1ccc2c(c1)C(C)(C)c1ccccc1-2] | 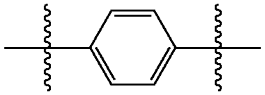 | Z1 | H | H | 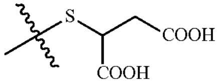 [SMILES: *SC(CC(=O)O)C(=O)O] |
| 264 | 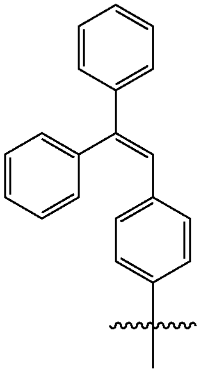 [SMILES: *c1ccc(C=C(c2ccccc2)c2ccccc2)cc1] | 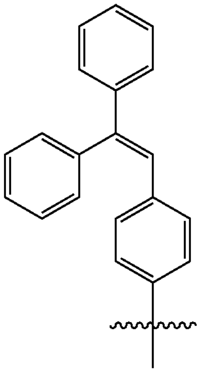 [SMILES: *c1ccc(C=C(c2ccccc2)c2ccccc2)cc1] | 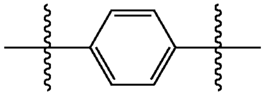 [SMILES: *c1ccc(*)cc1] | Z1 | H | H | 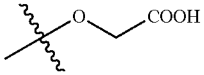 [SMILES: *OCC(=O)O] |

-continued
| | | | | | | | |
|---|---|---|---|---|---|---|---|
| 265 | 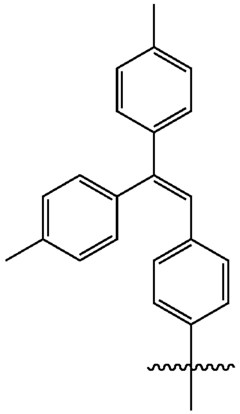 [SMILES: *c1ccc(C=C(c2ccc(C)cc2)c2ccc(C)cc2)cc1] | 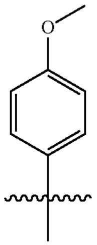 [SMILES: *c1ccc(OC)cc1] | 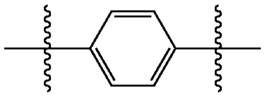 [SMILES: *c1ccc(*)cc1] | Z1 | H | H | 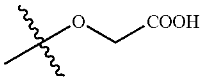 |
| 266 | 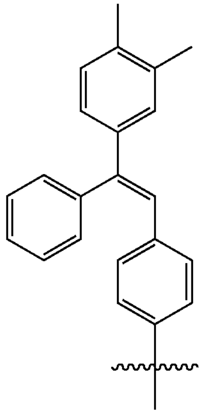 [SMILES: *c1ccc(/C=C(\c2ccccc2)c2ccc(C)c(C)c2)cc1] | 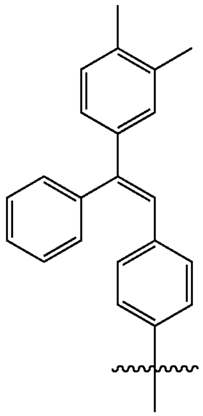 [SMILES: *c1ccc(/C=C(\c2ccccc2)c2ccc(C)c(C)c2)cc1] | 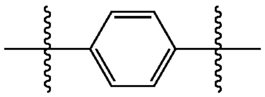 [SMILES: *c1ccc(*)cc1] | Z1 | H | H | 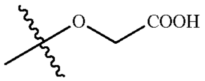 |

-continued
| | | | | | | | |
|---|---|---|---|---|---|---|---|
| 267 | 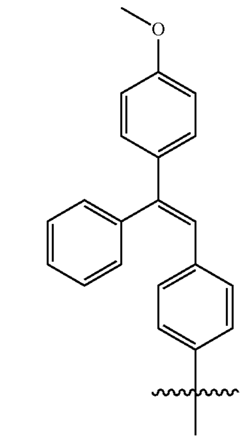 [SMILES: *c1ccc(/C=C(\c2ccccc2)c2ccc(OC)cc2)cc1] | 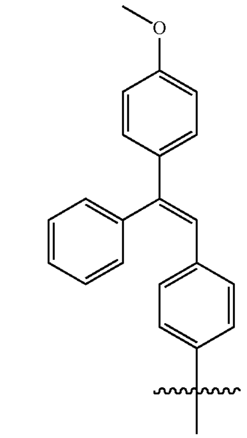 [SMILES: *c1ccc(/C=C(\c2ccccc2)c2ccc(OC)cc2)cc1] | 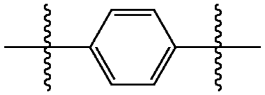 [SMILES: *c1ccc(*)cc1] | Z1 | H | H | 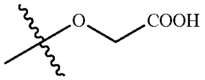 |
| 268 | 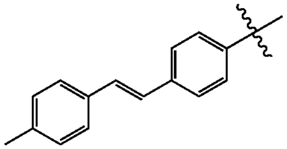 [SMILES: *c1ccc(/C=C/c2ccc(C)cc2)cc1] | 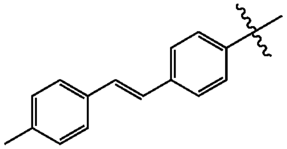 [SMILES: *c1ccc(/C=C/c2ccc(C)cc2)cc1] | 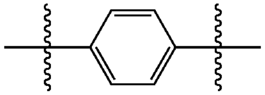 [SMILES: *c1ccc(*)cc1] | Z1 | H | H | 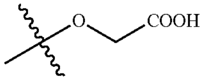 [SMILES: *OCC(=O)O] |
| 269 | 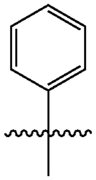 [SMILES: *c1ccccc1] | 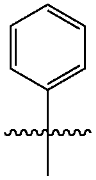 | 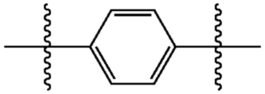 [SMILES: *c1ccc(*)cc1] | Z1 | H | H | 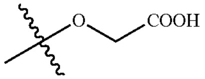 [SMILES: *OCC(=O)O] |
| 270 | 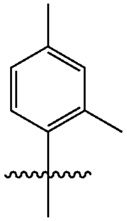 [SMILES: *c1ccc(C)cc1C] | 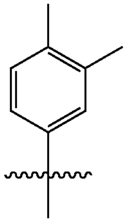 [SMILES: *c1ccc(C)c(C)c1] | 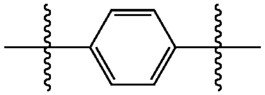 [SMILES: *c1ccc(*)cc1] | Z1 | H | H | 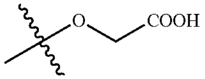 |

-continued
| | | | | | | | |
|---|---|---|---|---|---|---|---|
| 271 | 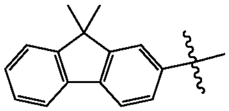 [SMILES: *c1ccc2c(c1)C(C)(C)c1ccccc1-2] | 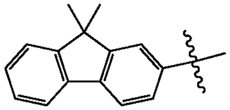 [SMILES: *c1ccc2c(c1)C(C)(C)c1ccccc1-2] | 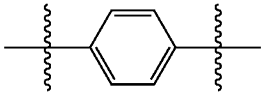 | Z1 | H | H | 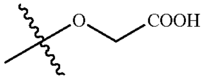 |
| 272 | 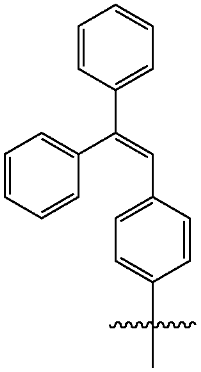 [SMILES: *c1ccc(C=C(c2ccccc2)c2ccccc2)cc1] | 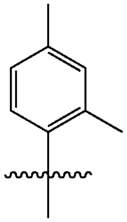 [SMILES: *c1ccc(C)cc1C] | 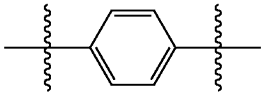 [SMILES: *c1ccc(*)cc1] | Z1 | H | H | 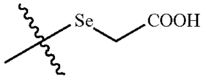 |
| 273 | 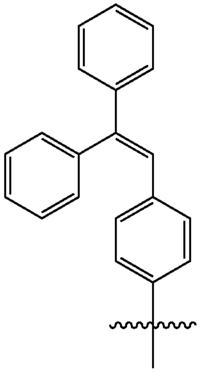 [SMILES: *c1ccc(C=C(c2ccccc2)c2ccccc2)cc1] | 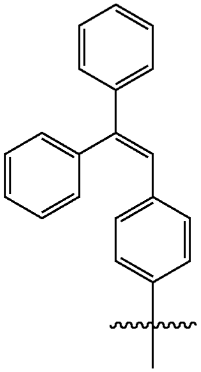 [SMILES: *c1ccc(C=C(c2ccccc2)c2ccccc2)cc1] | 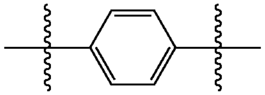 | Z1 | H | H | 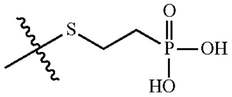 |

-continued
| | | | | | | | |
|---|---|---|---|---|---|---|---|
| 274 | 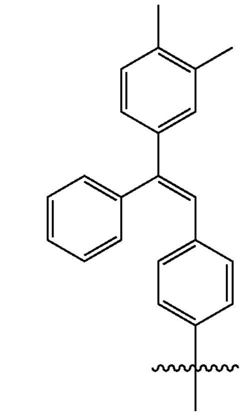 [SMILES: *c1ccc(/C=C(\c2ccccc2)c2ccc(C)c(C)c2)cc1] | 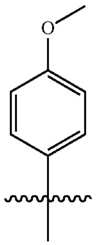 | 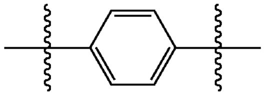 [SMILES: *c1ccc(*)cc1] | Z1 | H | H | 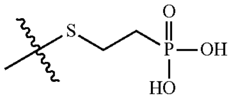 |
| 275 | 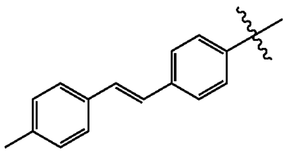 [SMILES: *c1ccc(/C=C/c2ccc(C)cc2)cc1] | 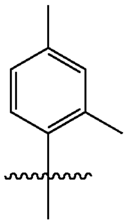 | 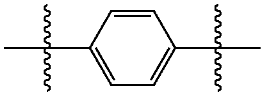 [SMILES: *c1ccc(*)cc1] | Z1 | H | H | 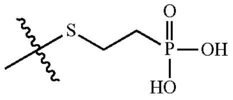 |
| 276 | 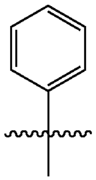 [SMILES: *c1ccccc1] | 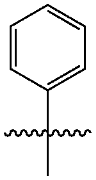 | 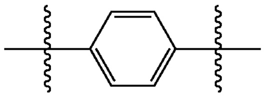 [SMILES: *c1ccc(*)cc1] | Z1 | H | H | 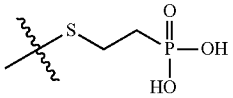 |

-continued
| | | | | | | | |
|---|---|---|---|---|---|---|---|
| 277 | 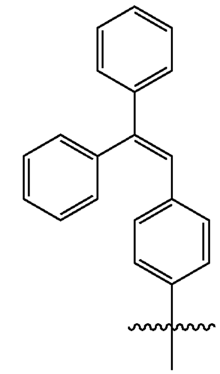 [SMILES: *c1ccc(C=C(c2ccccc2)c2ccccc2)cc1] | 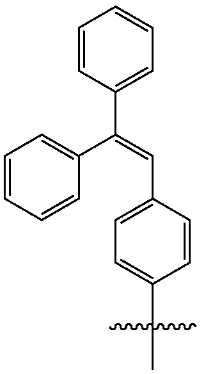 [SMILES: *c1ccc(C=C(c2ccccc2)c2ccccc2)cc1] | 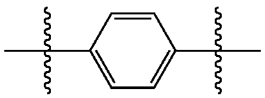 | Z1 | H | H | 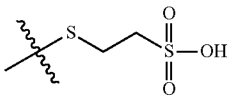 |
| 278 | 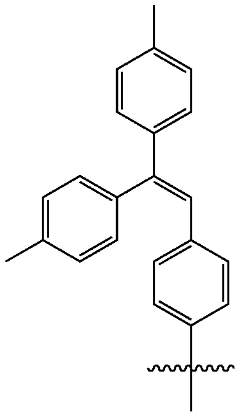 [SMILES: *c1ccc(C=C(c2ccc(C)cc2)c2ccc(C)cc2)cc1] | 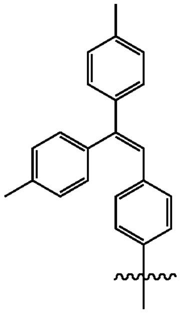 [SMILES: *c1ccc(C=C(c2ccc(C)cc2)c2ccc(C)cc2)cc1] | 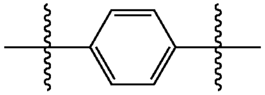 [SMILES: *c1ccc(*)cc1] | Z1 | H | H | 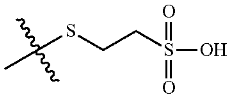 |

-continued
| | | | | | | | |
|---|---|---|---|---|---|---|---|
| 279 | 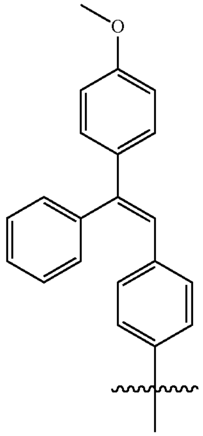 [SMILES: *c1ccc(/C=C(\c2ccccc2)c2ccc(OC)cc2)cc1] | 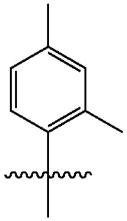 [SMILES: *c1ccc(C)cc1C] | 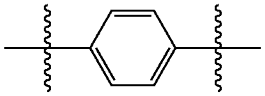 [SMILES: *c1ccc(*)cc1] | Z1 | H | H | 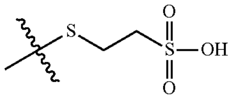 |
| 280 | 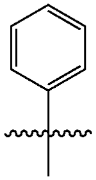 [SMILES: *c1ccccc1] | 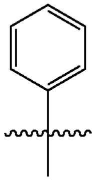 [SMILES: *c1ccccc1] | 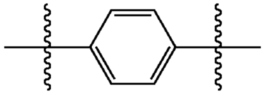 | Z1 | H | H | 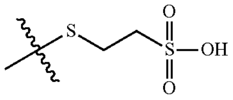 |
| 281 | 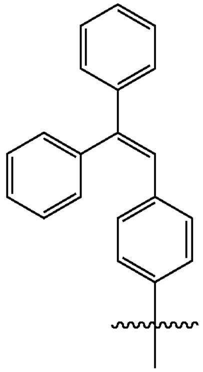 [SMILES: *c1ccc(C=C(c2ccccc2)c2ccccc2)cc1] | 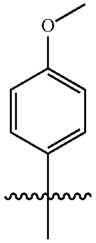 [SMILES: *c1ccc(OC)cc1] | 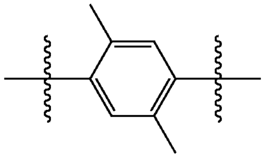 [SMILES: *c1cc(C)c(*)cc1C] | Z1 | H | H | 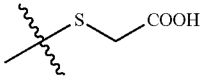 |

-continued
| | | | | | | | |
|---|---|---|---|---|---|---|---|
| 282 | 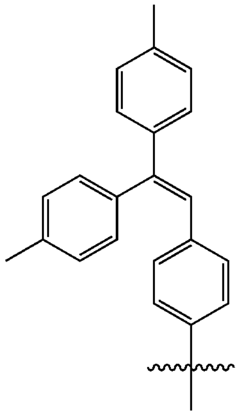 [SMILES: *c1ccc(C=C(c2ccc(C)cc2)c2ccc(C)cc2)cc1] | 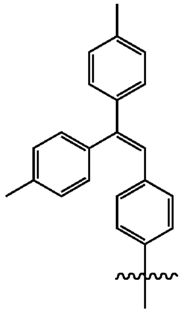 [SMILES: *c1ccc(C=C(c2ccc(C)cc2)c2ccc(C)cc2)cc1] | 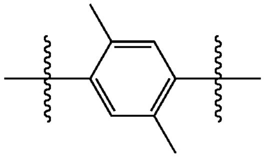 [SMILES: *c1cc(C)c(*)cc1C] | Z1 | H | H | 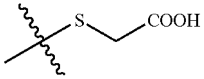 |
| 283 | 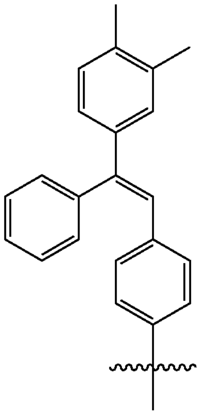 [SMILES: *c1ccc(/C=C(\c2ccccc2)c2ccc(C)c(C)c2)cc1] | 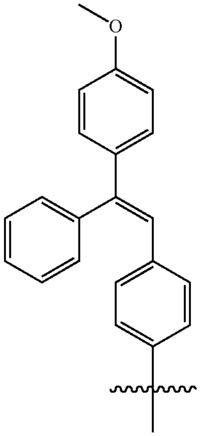 [SMILES: *c1ccc(/C=C(\c2ccccc2)c2ccc(OC)cc2)cc1] | 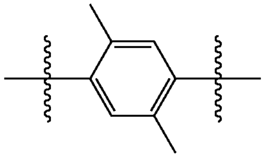 [SMILES: *c1cc(C)c(*)cc1C] | Z1 | H | H | 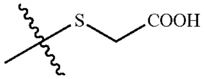 [SMILES: *SCC(=O)O] |
| 284 | 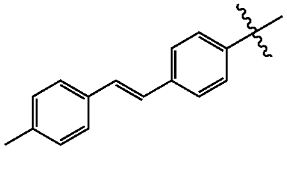 [SMILES: *c1ccc(/C=C/c2ccc(C)cc2)cc1] | 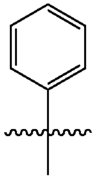 [SMILES: *c1ccccc1] | 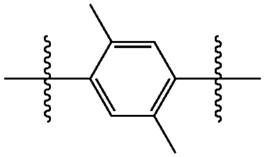 [SMILES: *c1cc(C)c(*)cc1C] | Z1 | H | H | 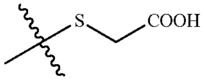 [SMILES: *SCC(=O)O] |

-continued
| | | | | | | | |
|---|---|---|---|---|---|---|---|
| 285 | 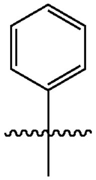 [SMILES: *c1ccccc1] | 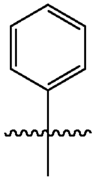 | 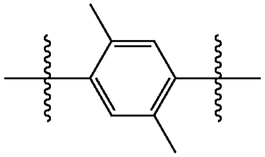 [SMILES: *c1cc(C)c(*)cc1C] | Z1 | H | H | 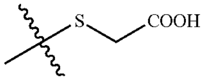 [SMILES: *SCC(=O)O] |
| 286 | 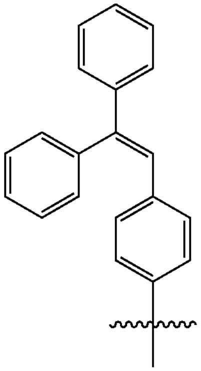 [SMILES: *c1ccc(C=C(c2ccccc2)c2ccccc2)cc1] | 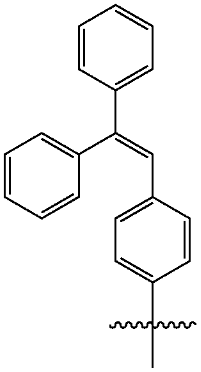 [SMILES: *c1ccc(C=C(c2ccccc2)c2ccccc2)cc1] | 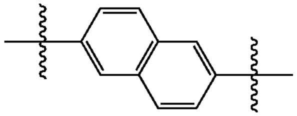 [SMILES: *c1ccc2cc(*)ccc2c1] | Z1 | H | H | 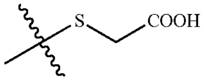 [SMILES: *SCC(=O)O] |
| 287 | 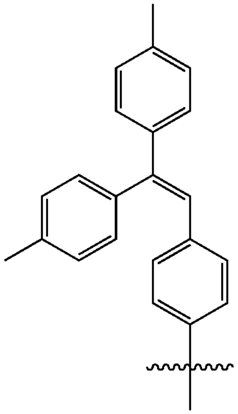 [SMILES: *c1ccc(C=C(c2ccc(C)cc2)c2ccc(C)cc2)cc1] | 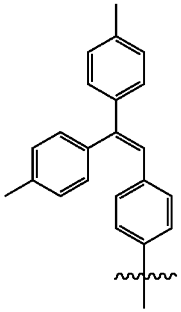 [SMILES: *c1ccc(C=C(c2ccc(C)cc2)c2ccc(C)cc2)cc1] | 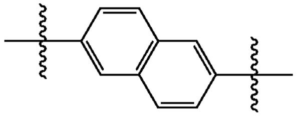 [SMILES: *c1ccc2cc(*)ccc2c1] | Z1 | H | H | 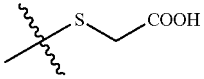 |

-continued
| | | | | | | | |
|---|---|---|---|---|---|---|---|
| 288 | 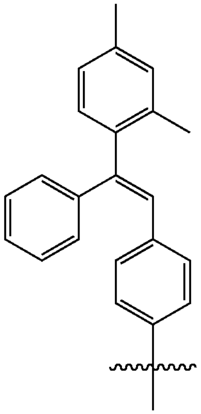 [SMILES: *c1ccc(/C=C(\c2ccccc2)c2ccc(C)cc2C)cc1] | 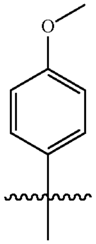 [SMILES: *c1ccc(OC)cc1] | 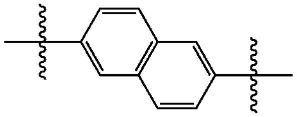 [SMILES: *c1ccc2cc(*)ccc2c1] | Z1 | H | H | 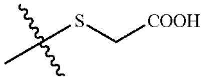 [SMILES: *SCC(=O)O] |
| 289 | 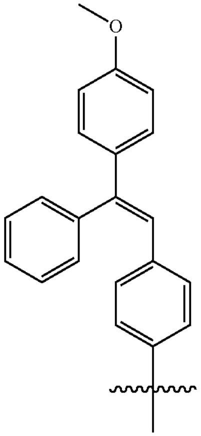 [SMILES: *c1ccc(/C=C(\c2ccccc2)c2ccc(OC)cc2)cc1] | 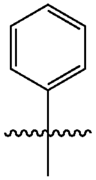 [SMILES: *c1ccccc1] | 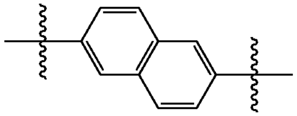 [SMILES: *c1ccc2cc(*)ccc2c1] | Z1 | H | H | 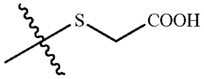 [SMILES: *SCC(=O)O] |
| 290 | 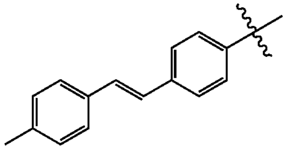 [SMILES: *c1ccc(/C=C/c2ccc(C)cc2)cc1] | 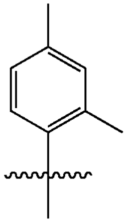 | 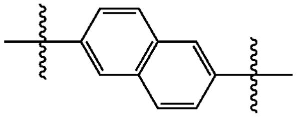 [SMILES: *c1ccc2cc(*)ccc2c1] | Z1 | H | H | 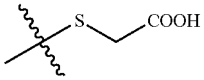 |

-continued
| | | | | | | | |
|---|---|---|---|---|---|---|---|
| 291 | 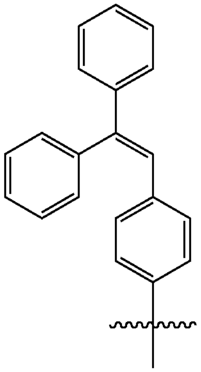 [SMILES: *c1ccc(C=C(c2ccccc2)c2ccccc2)cc1] | 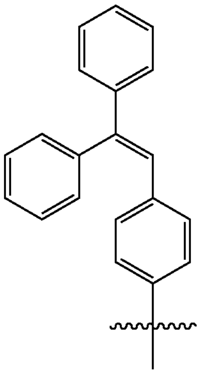 [SMILES: *c1ccc(C=C(c2ccccc2)c2ccccc2)cc1] | 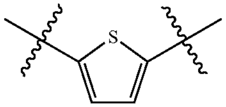 [SMILES: *c1ccc(*)s1] | Z1 | H | H | 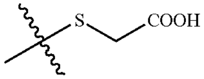 [SMILES: *SCC(=O)O] |
| 292 | 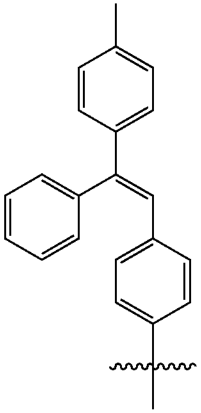 [SMILES: *c1ccc(/C=C(\c2ccccc2)c2ccc(C)cc2)cc1] | 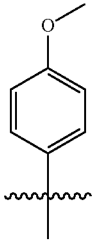 [SMILES: *c1ccc(OC)cc1] | 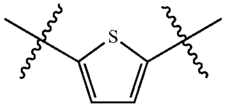 | Z1 | H | H | 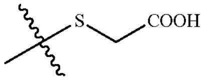 [SMILES: *SCC(=O)O] |

-continued
| | | | | | | | |
|---|---|---|---|---|---|---|---|
| 293 | 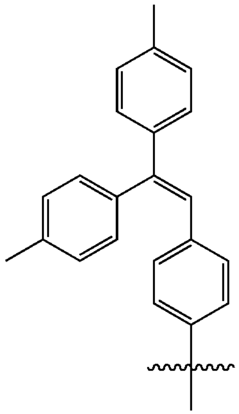 [SMILES: *c1ccc(C=C(c2ccc(C)cc2)c2ccc(C)cc2)cc1] | 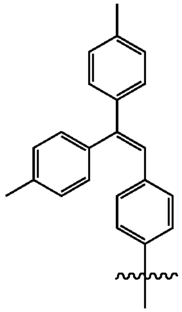 [SMILES: *c1ccc(C=C(c2ccc(C)cc2)c2ccc(C)cc2)cc1] | 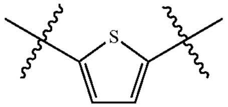 [SMILES: *c1ccc(*)s1] | Z1 | H | H | 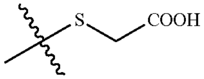 |
| 294 | 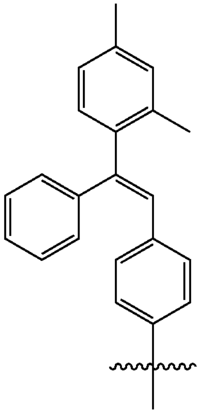 | 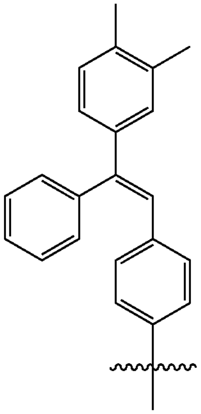 [SMILES: *c1ccc(/C=C(\c2ccccc2)c2ccc(C)c(C)c2)cc1] | 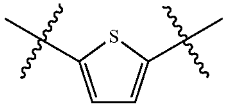 [SMILES: *c1ccc(*)s1] | Z1 | H | H | 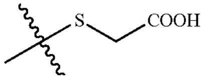 |

-continued
| | | | | | | | |
|---|---|---|---|---|---|---|---|
| 295 | 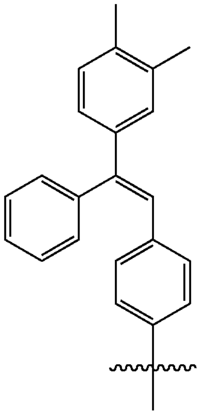 | 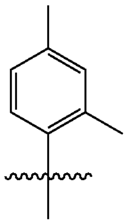 [SMILES: *c1ccc(C)cc1C] | 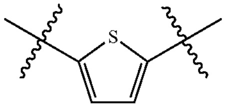 | Z1 | H | H | 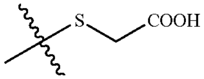 [SMILES: *SCC(=O)O] |
| 296 | 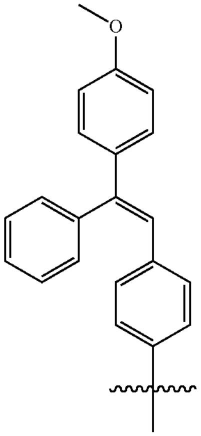 [SMILES: *c1ccc(/C=C(\c2ccccc2)c2ccc(OC)cc2)cc1] | 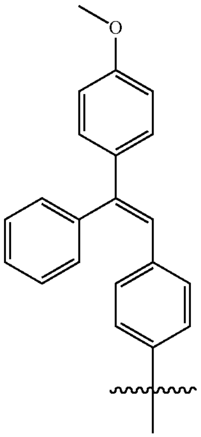 [SMILES: *c1ccc(/C=C(\c2ccccc2)c2ccc(OC)cc2)cc1] | 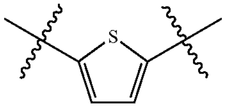 [SMILES: *c1ccc(*)s1] | Z1 | H | H | 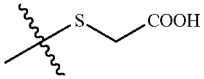 |
| 297 | 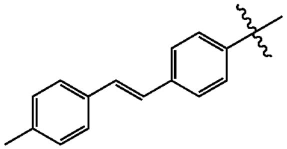 [SMILES: *c1ccc(/C=C/c2ccc(C)cc2)cc1] | 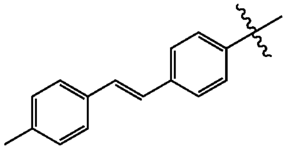 [SMILES: *c1ccc(/C=C/c2ccc(C)cc2)cc1] | 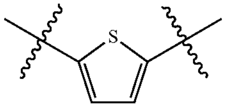 [SMILES: *c1ccc(*)s1] | Z1 | H | H | 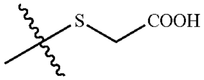 [SMILES: *SCC(=O)O] |

-continued
| | | | | | | | |
|---|---|---|---|---|---|---|---|
| 298 | 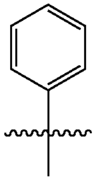 [SMILES: *c1ccccc1] | 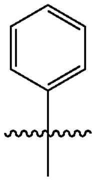 [SMILES: *c1ccccc1] | 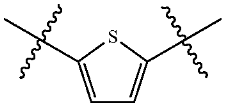 [SMILES: *c1ccc(*)s1] | Z1 | H | H | 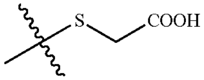 |
| 299 | 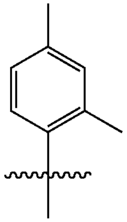 [SMILES: *c1ccc(C)cc1C] | 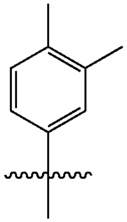 [SMILES: *c1ccc(C)c(C)c1] | 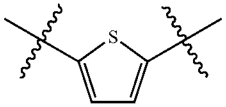 [SMILES: *c1ccc(*)s1] | Z1 | H | H | 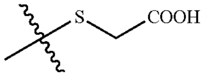 [SMILES: *SCC(=O)O] |
| 300 | 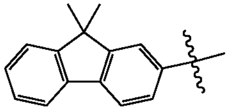 [SMILES: *c1ccc2c(c1)C(C)(C)c1ccccc1-2] | 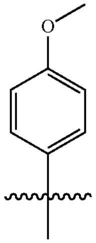 [SMILES: *c1ccc(OC)cc1] | 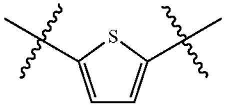 [SMILES: *c1ccc(*)s1] | | | | 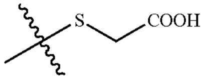 |
| Compound | 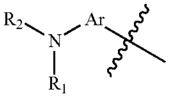 | Z | $R_5$ | $R_6$ | 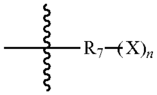 |
|---|---|---|---|---|---|
| 301 | 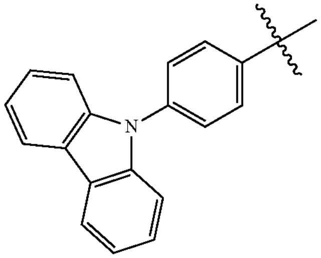 [SMILES: *c1ccc(-n2c3ccccc3c3ccccc32)cc1] | Z1 | H | H | 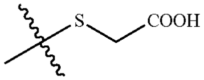 [SMILES: *SCC(=O)O] |

-continued
| | | | | | |
|---|---|---|---|---|---|
| 302 | 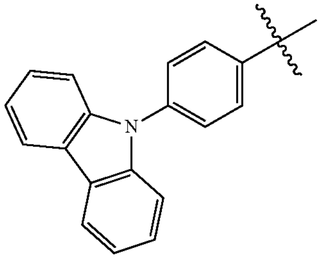 [SMILES: *c1ccc(-n2c3ccccc3c3ccccc32)cc1] | Z1 | 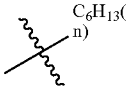 | H | 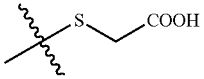 |
| 303 | 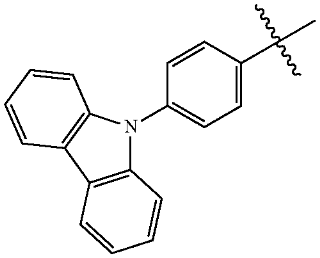 [SMILES: *c1ccc(-n2c3ccccc3c3ccccc32)cc1] | Z1 | H | H | 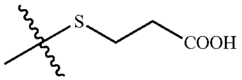 [SMILES: *SCCC(=O)O] |
| 304 | 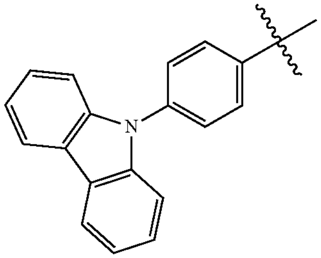 [SMILES: *c1ccc(-n2c3ccccc3c3ccccc32)cc1] | Z1 | H | H | 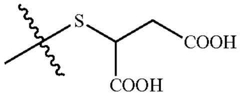 [SMILES: *SC(CC(=O)O)C(=O)O] |
| 305 | 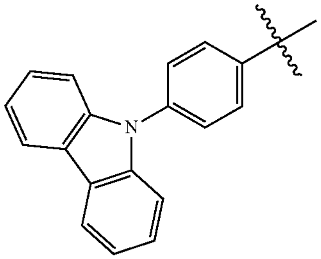 [SMILES: *c1ccc(-n2c3ccccc3c3ccccc32)cc1] | Z1 | H | H | 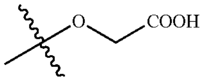 |

-continued
| | | | | | |
|---|---|---|---|---|---|
| 306 | 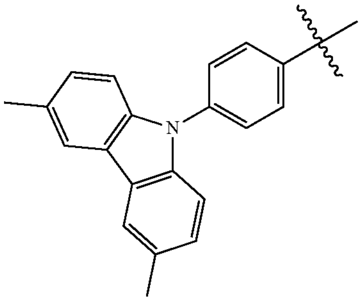 [SMILES: *c1ccc(-n2c3ccc(C)cc3c3cc(C)ccc32)cc1] | Z1 | H | H | 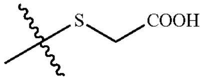 |
| 307 | 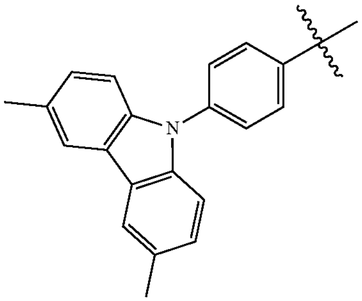 [SMILES: *c1ccc(-n2c3ccc(C)cc3c3cc(C)ccc32)cc1] | Z1 | 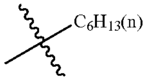 | H | 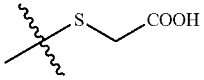 |
| 308 | 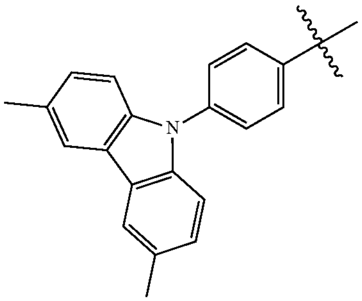 [SMILES: *c1ccc(-n2c3ccc(C)cc3c3cc(C)ccc32)cc1] | Z1 | H | H | 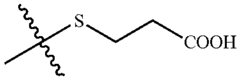 [SMILES: *SCCC(=O)O] |

-continued
| | | | | | |
|---|---|---|---|---|---|
| 309 | 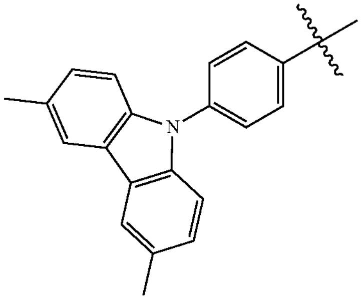 [SMILES: *c1ccc(-n2c3ccc(C)cc3c3cc(C)ccc32)cc1] | Z1 | H | H | 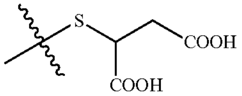 [SMILES: *SC(CC(=O)O)C(=O)O] |
| 310 | 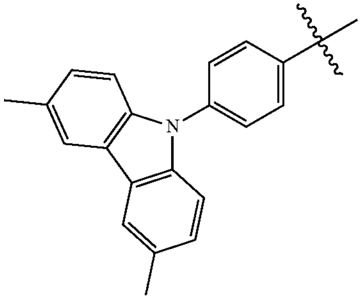 [SMILES: *c1ccc(-n2c3ccc(C)cc3c3cc(C)ccc32)cc1] | Z1 | H | H | 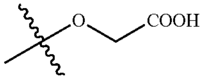 [SMILES: *OCC(=O)O] |
| 311 | 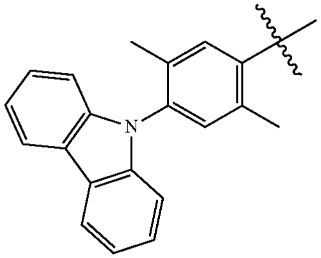 [SMILES: *c1cc(C)c(-n2c3ccccc3c3ccccc32)cc1C] | Z1 | H | H | 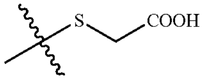 [SMILES: *SCC(=O)O] |

-continued
| | | | | | |
|---|---|---|---|---|---|
| 312 | 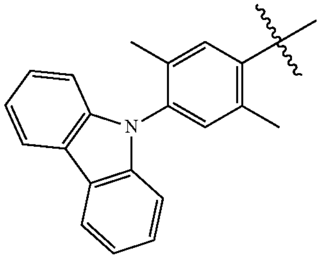 [SMILES: *c1cc(C)c(-n2c3ccccc3c3ccccc32)cc1C] | Z1 | 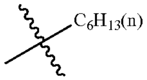 | H | 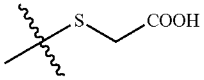 |
| 313 | 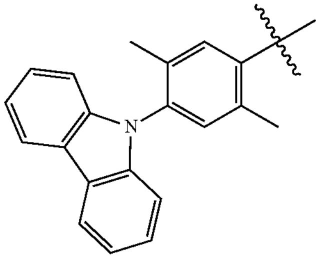 [SMILES: *c1cc(C)c(-n2c3ccccc3c3ccccc32)cc1C] | Z1 | H | H | 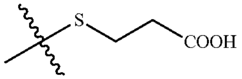 [SMILES: *SCCC(=O)O] |
| 314 | 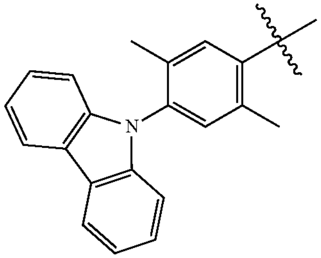 [SMILES: *c1cc(C)c(-n2c3ccccc3c3ccccc32)cc1C] | Z1 | H | H | 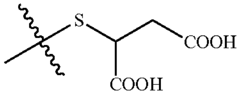 [SMILES: *SC(CC(=O)O)C(=O)O] |
| 315 | 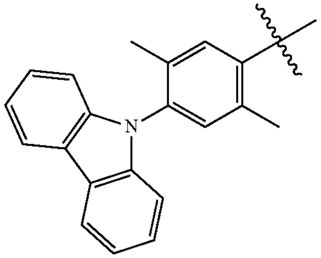 [SMILES: *c1cc(C)c(-n2c3ccccc3c3ccccc32)cc1C] | Z1 | H | H | 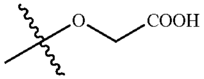 [SMILES: *OCC(=O)O] |

-continued
| | | | | | |
|---|---|---|---|---|---|
| 316 | 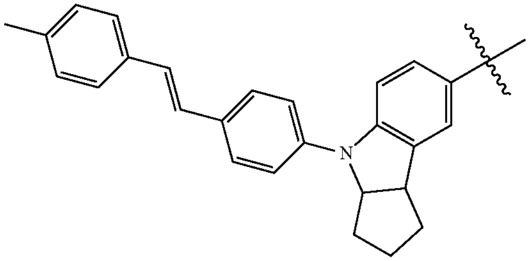 [SMILES: *c1ccc2c(c1)C1CCCC1N2c1ccc(/C=C/c2ccc(C)cc2)cc1] | Z1 | H | H | 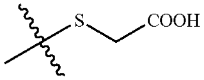 |
| 317 | 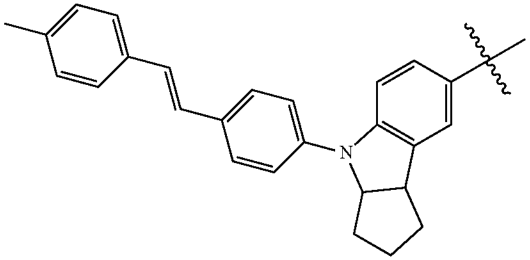 [SMILES: *c1ccc2c(c1)C1CCCC1N2c1ccc(/C=C/c2ccc(C)cc2)cc1] | Z1 | 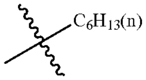 | H | 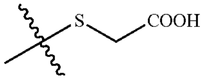 [SMILES: *SCC(=O)O] |
| 318 | 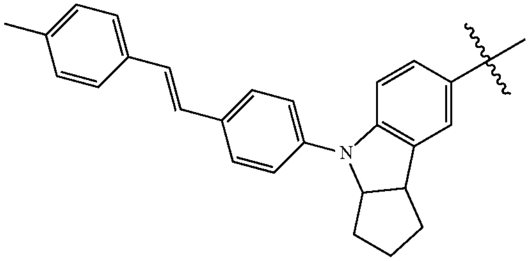 [SMILES: *c1ccc2c(c1)C1CCCC1N2c1ccc(/C=C/c2ccc(C)cc2)cc1] | Z1 | H | H | 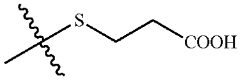 [SMILES: *SCCC(=O)O] |
| 319 | 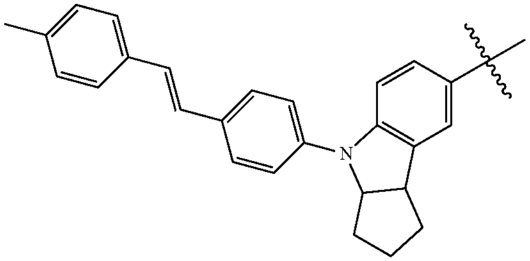 [SMILES: *c1ccc2c(c1)C1CCCC1N2c1ccc(/C=C/c2ccc(C)cc2)cc1] | Z1 | H | H | 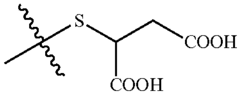 |

-continued
| | | | | | |
|---|---|---|---|---|---|
| 320 | 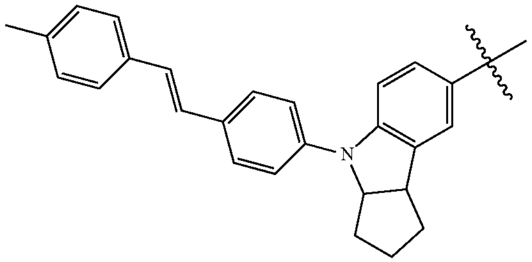 [SMILES: *c1ccc2c(c1)C1CCCC1N2c1ccc(/C=C/c2ccc(C)cc2)cc1] | Z1 | H | H | 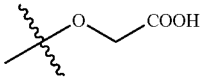 |
| 321 | 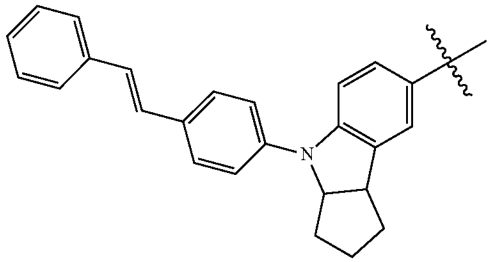 [SMILES: *c1ccc2c(c1)C1CCCC1N2c1ccc(/C=C/c2ccccc2)cc1] | Z1 | H | H | 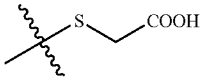 |
| 322 | 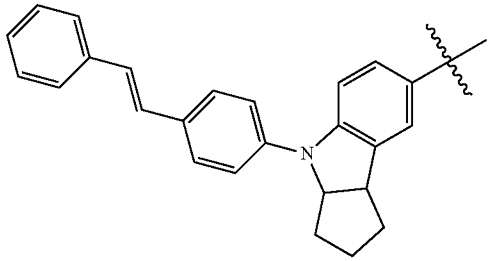 [SMILES: *c1ccc2c(c1)C1CCCC1N2c1ccc(/C=C/c2ccccc2)cc1] | Z1 | 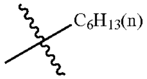 | H | 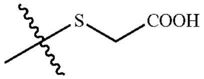 [SMILES: *SCC(=O)O] |
| 323 | 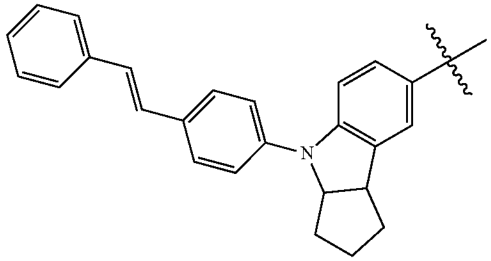 [SMILES: *c1ccc2c(c1)C1CCCC1N2c1ccc(/C=C/c2ccccc2)cc1] | Z1 | H | H | 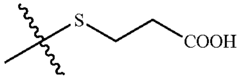 [SMILES: *SCCC(=O)O] |

-continued
| | | | | | |
|---|---|---|---|---|---|
| 324 | 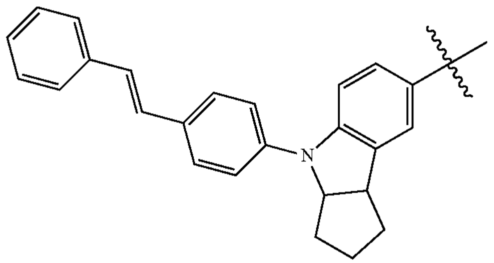 [SMILES: *c1ccc2c(c1)C1CCCC1N2c1ccc(/C=C/c2ccccc2)cc1] | Z1 | H | H | 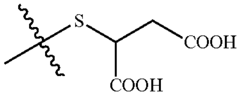 [SMILES: *SC(CC(=O)O)C(=O)O] |
| 325 | 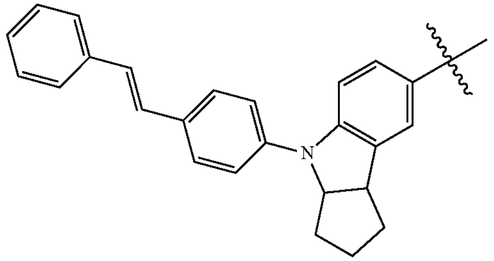 [SMILES: *c1ccc2c(c1)C1CCCC1N2c1ccc(/C=C/c2ccccc2)cc1] | Z1 | H | H | 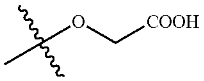 [SMILES: *OCC(=O)O] |
| 326 | 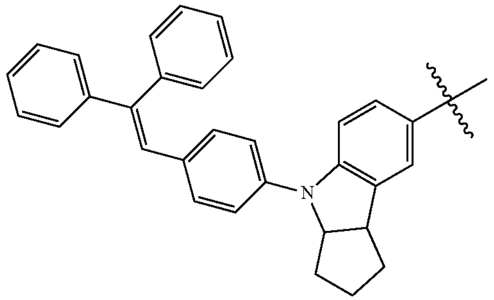 [SMILES: *c1ccc2c(c1)C1CCCC1N2c1ccc(C=C(c2ccccc2)c2ccccc2)cc1] | Z1 | H | H | 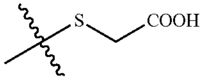 |

-continued
| | | | | | |
|---|---|---|---|---|---|
| 327 | 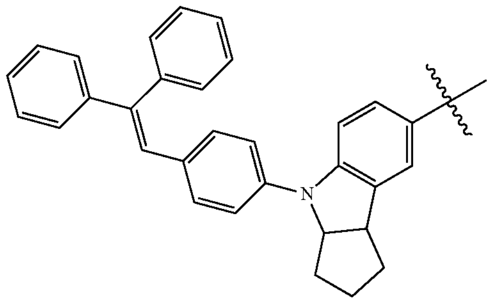 [SMILES: *c1ccc2c(c1)C1CCCC1N2c1ccc(C=C(c2ccccc2)c2ccccc2)cc1] | Z1 | 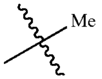 | H | 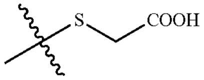 |
| 328 | 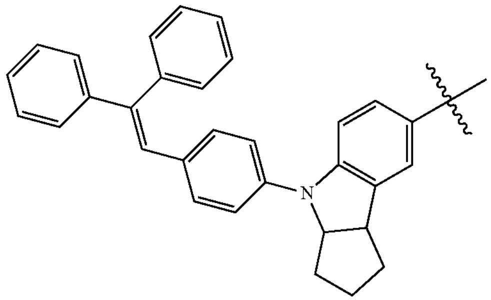 [SMILES: *c1ccc2c(c1)C1CCCC1N2c1ccc(C=C(c2ccccc2)c2ccccc2)cc1] | Z1 | H | 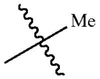 | 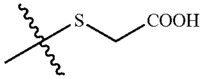 [SMILES: *SCC(=O)O] |
| 329 | 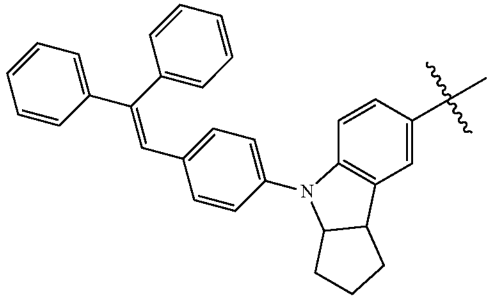 [SMILES: *c1ccc2c(c1)C1CCCC1N2c1ccc(C=C(c2ccccc2)c2ccccc2)cc1] | Z1 | 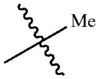 | 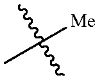 | 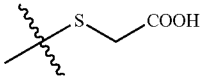 [SMILES: *SCC(=O)O] |

-continued
| | | | | | |
|---|---|---|---|---|---|
| 330 | 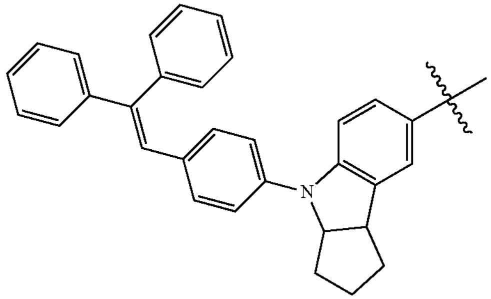 [SMILES: *c1ccc2c(c1)C1CCCC1N2c1ccc(C=C(c2ccccc2)c2ccccc2)cc1] | Z1 | 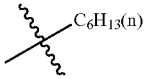 | H | 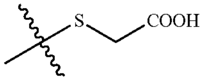 [SMILES: *SCC(=O)O] |
| 331 | 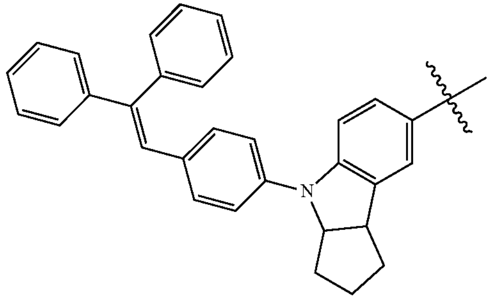 [SMILES: *c1ccc2c(c1)C1CCCC1N2c1ccc(C=C(c2ccccc2)c2ccccc2)cc1] | Z1 | H | H | 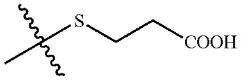 [SMILES: *SCCC(=O)O] |
| 332 | 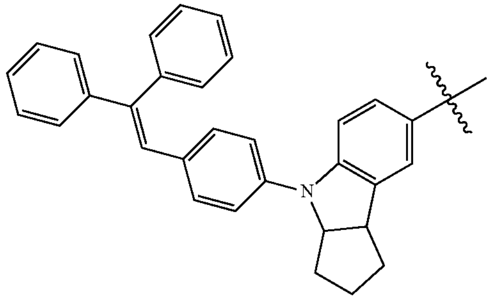 [SMILES: *c1ccc2c(c1)C1CCCC1N2c1ccc(C=C(c2ccccc2)c2ccccc2)cc1] | Z1 | H | H | 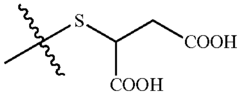 [SMILES: *SC(CC(=O)O)C(=O)O] |

-continued
| | | | | | |
|---|---|---|---|---|---|
| 333 | 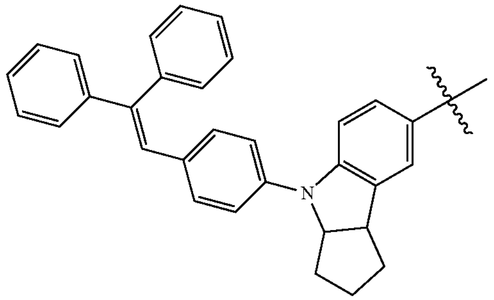 [SMILES: *c1ccc2c(c1)C1CCCC1N2c1ccc(C=C(c2ccccc2)c2ccccc2)cc1] | Z1 | H | H | 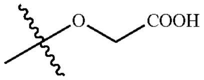 |
| 334 | 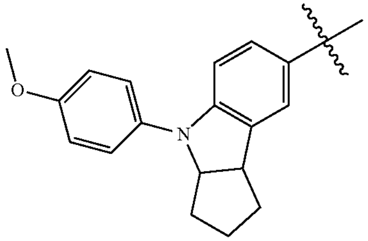 [SMILES: *c1ccc2c(c1)C1CCCC1N2c1ccc(OC)cc1] | Z1 | H | H | 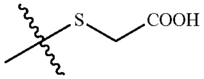 |
| 335 | 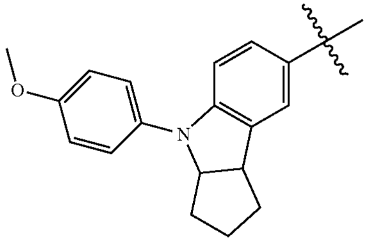 [SMILES: *c1ccc2c(c1)C1CCCC1N2c1ccc(OC)cc1] | Z1 | 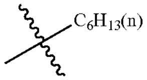 | H | 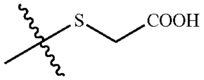 |
| 336 | 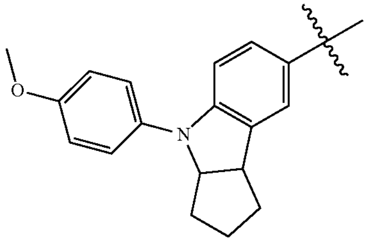 [SMILES: *c1ccc2c(c1)C1CCCC1N2c1ccc(OC)cc1] | Z1 | H | H | 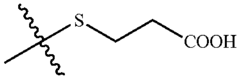 [SMILES: *SCCC(=O)O] |

-continued
| | | | | | |
|---|---|---|---|---|---|
| 337 | 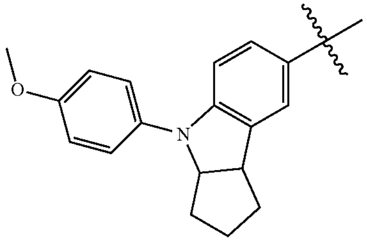 [SMILES: *c1ccc2c(c1)C1CCCC1N2c1ccc(OC)cc1] | Z1 | H | H | 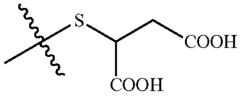 [SMILES: *SC(CC(=O)O)C(=O)O] |
| 338 | 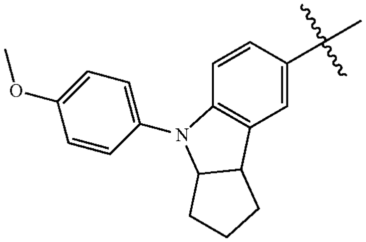 [SMILES: *c1ccc2c(c1)C1CCCC1N2c1ccc(OC)cc1] | Z1 | H | H | 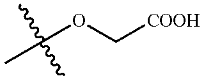 |
| 339 | 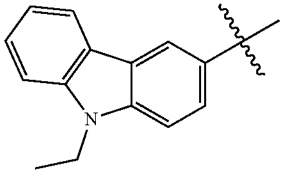 [SMILES: *c1ccc2c(c1)c1ccccc1n2CC] | Z1 | H | H | 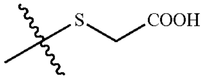 |
| 340 | 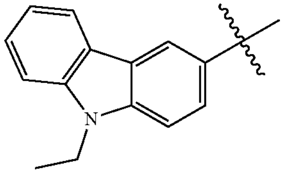 [SMILES: *c1ccc2c(c1)c1ccccc1n2CC] | Z1 | 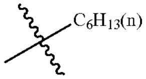 | H | 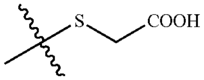 |
| 341 | 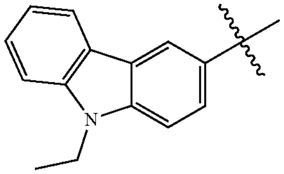 [SMILES: *c1ccc2c(c1)c1ccccc1n2CC] | Z1 | H | H | 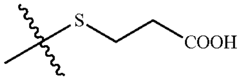 [SMILES: *SCCC(=O)O] |

-continued
| | | | | | |
|---|---|---|---|---|---|
| 342 | 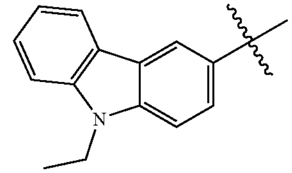 [SMILES: *c1ccc2c(c1)c1ccccc1n2CC] | Z1 | H | H | 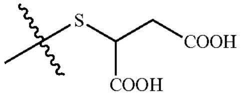 [SMILES: *SC(CC(=O)O)C(=O)O] |
| 343 | 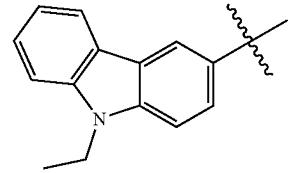 [SMILES: *c1ccc2c(c1)c1ccccc1n2CC] | Z1 | H | H | 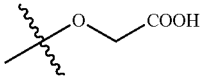 [SMILES: *OCC(=O)O] |
| 344 | 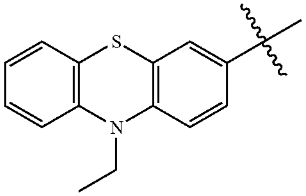 [SMILES: *c1ccc2c(c1)Sc1ccccc1N2CC] | Z1 | H | H | 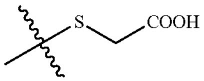 [SMILES: *SCC(=O)O] |
| 345 | 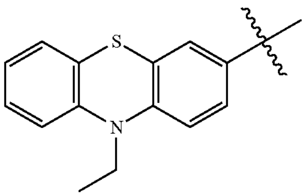 [SMILES: *c1ccc2c(c1)Sc1ccccc1N2CC] | Z1 | 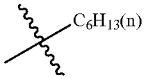 | H | 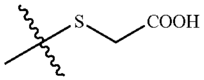 |
| 346 | 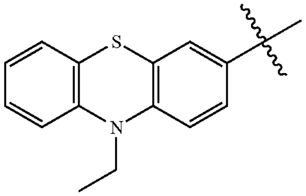 [SMILES: *c1ccc2c(c1)Sc1ccccc1N2CC] | Z1 | H | H | 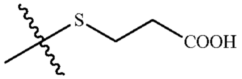 [SMILES: *SCCC(=O)O] |

-continued
| | | | | | |
|---|---|---|---|---|---|
| 347 | 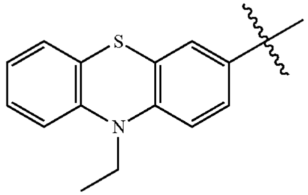 [SMILES: *c1ccc2c(c1)Sc1ccccc1N2CC] | Z1 | H | H | 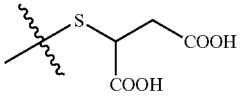 [SMILES: *SC(CC(=O)O)C(=O)O] |
| 348 | 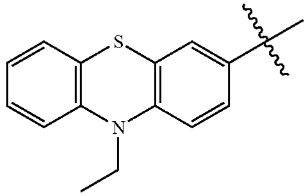 [SMILES: *c1ccc2c(c1)Sc1ccccc1N2CC] | Z1 | H | H | 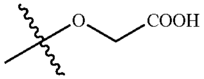 [SMILES: *OCC(=O)O] |
| 349 | 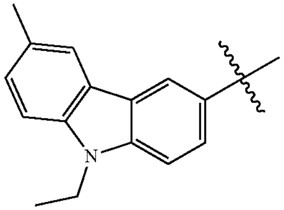 [SMILES: *c1ccc2c(c1)c1cc(C)ccc1n2CC] | Z1 | H | H | 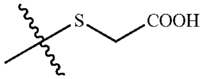 [SMILES: *SCC(=O)O] |
| 350 | 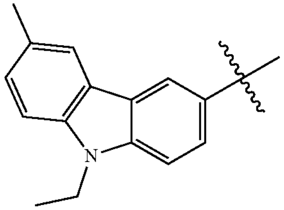 [SMILES: *c1ccc2c(c1)c1cc(C)ccc1n2CC] | Z1 | 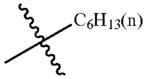 | H | 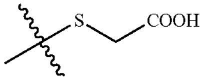 [SMILES: *SCC(=O)O] |
| 351 | 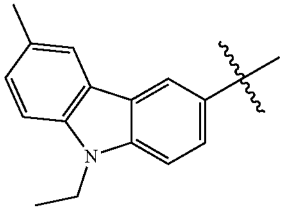 [SMILES: *c1ccc2c(c1)c1cc(C)ccc1n2CC] | Z1 | H | H | 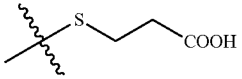 |

-continued
| | | | | | |
|---|---|---|---|---|---|
| 352 | 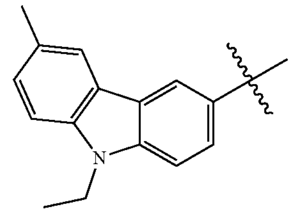 [SMILES: *c1ccc2c(c1)c1cc(C)ccc1n2CC] | Z1 | H | H | 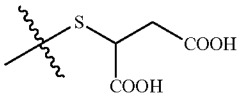 [SMILES: *SC(CC(=O)O)C(=O)O] |
| 353 | 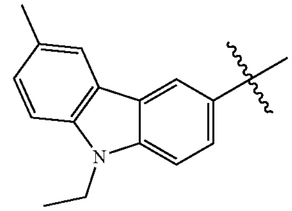 [SMILES: *c1ccc2c(c1)c1cc(C)ccc1n2CC] | Z1 | H | H | 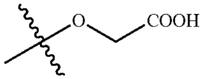 |
| 354 | 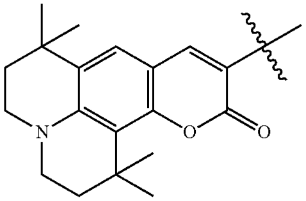 [SMILES: *c1cc2cc3c4c(c2oc1=O)C(C)(C)CCN4CCC3(C)C] | Z1 | H | H | 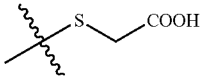 [SMILES: *SCC(=O)O] |
| 355 | 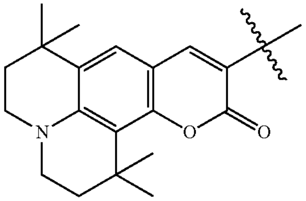 | Z1 | 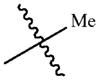 | H | 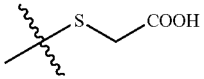 [SMILES: *SCC(=O)O] |
| 356 | 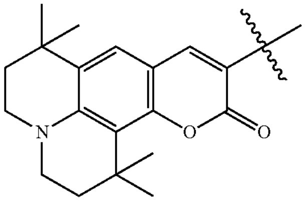 [SMILES: *c1cc2cc3c4c(c2oc1=O)C(C)(C)CCN4CCC3(C)C] | Z1 | H | 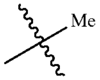 | 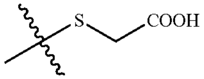 [SMILES: *SCC(=O)O] |

-continued
| | | | | | |
|---|---|---|---|---|---|
| 357 | 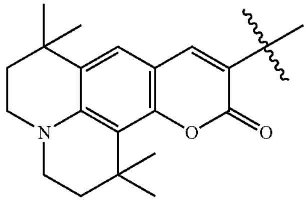 [SMILES: *c1cc2cc3c4c(c2oc1=O)C(C)(C)CCN4CCC3(C)C] | Z1 | 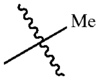 | 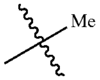 | 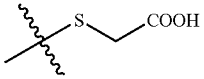 |
| 358 | 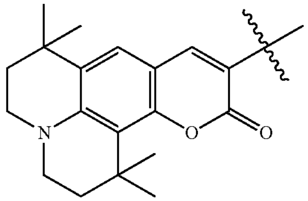 [SMILES: *c1cc2cc3c4c(c2oc1=O)C(C)(C)CCN4CCC3(C)C] | Z1 | 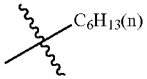 | H | 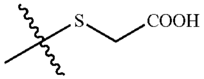 [SMILES: *SCC(=O)O] |
| 359 | 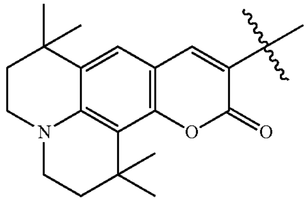 [SMILES: *c1cc2cc3c4c(c2oc1=O)C(C)(C)CCN4CCC3(C)C] | Z1 | 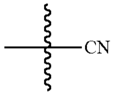 | H | 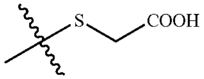 [SMILES: *SCC(=O)O] |
| 360 | 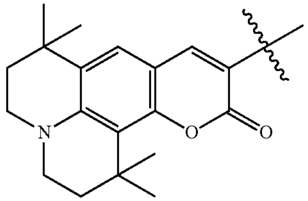 [SMILES: *c1cc2cc3c4c(c2oc1=O)C(C)(C)CCN4CCC3(C)C] | Z1 | H | H | 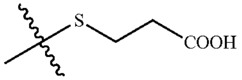 [SMILES: *SCCC(=O)O] |
| 361 | 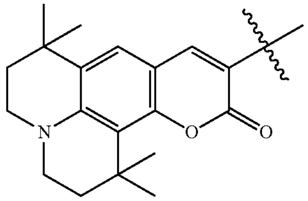 [SMILES: *c1cc2cc3c4c(c2oc1=O)C(C)(C)CCN4CCC3(C)C] | Z1 | H | H | 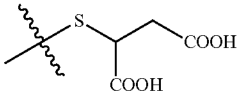 |

-continued
| | | | | | |
|---|---|---|---|---|---|
| 362 | 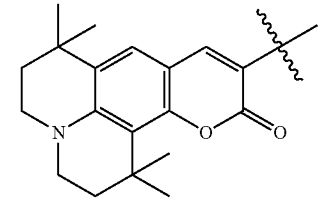 [SMILES: *c1cc2cc3c4c(c2oc1=O)C(C)(C)CCN4CCC3(C)C] | Z1 | H | H | 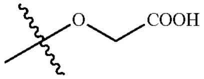 |
| 363 | 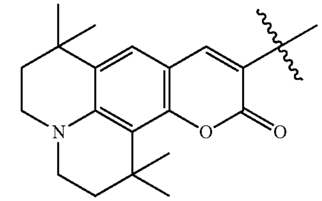 [SMILES: *c1cc2cc3c4c(c2oc1=O)C(C)(C)CCN4CCC3(C)C] | Z7 | H | H | 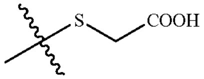 |
| 364 | 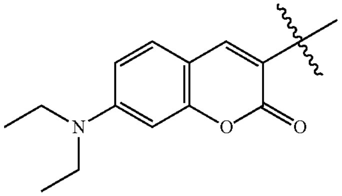 [SMILES: *c1cc2ccc(N(CC)CC)cc2oc1=O] | Z1 | H | H | 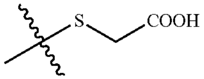 |
| 365 | 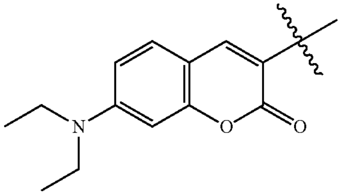 [SMILES: *c1cc2ccc(N(CC)CC)cc2oc1=O] | Z1 | 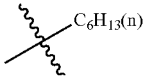 | H | 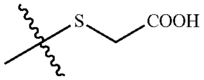 |
| 366 | 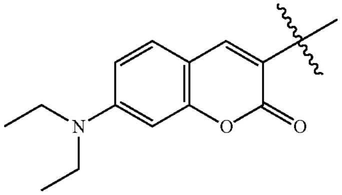 [SMILES: *c1cc2ccc(N(CC)CC)cc2oc1=O] | Z1 | H | H | 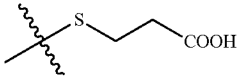 [SMILES: *SCCC(=O)O] |

-continued
| | | | | | |
|---|---|---|---|---|---|
| 367 | 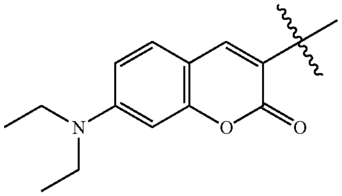 [SMILES: *c1cc2ccc(N(CC)CC)cc2oc1=O] | Z1 | H | H | 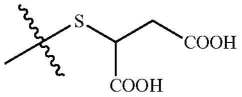 [SMILES: *SC(CC(=O)O)C(=O)O] |
| 368 | 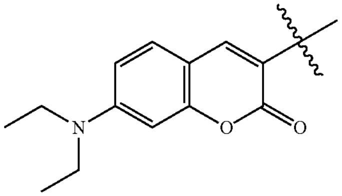 [SMILES: *c1cc2ccc(N(CC)CC)cc2oc1=O] | Z1 | H | H | 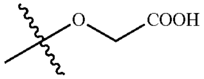 |
| 369 | 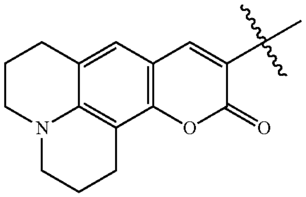 [SMILES: *c1cc2cc3c4c(c2oc1=O)CCCN4CCC3] | Z1 | H | H | 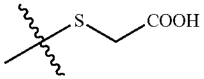 |
| 370 | 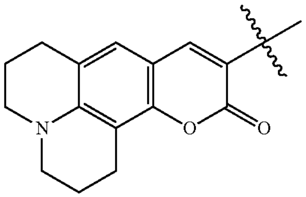 [SMILES: *c1cc2cc3c4c(c2oc1=O)CCCN4CCC3] | Z1 | 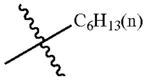 | H | 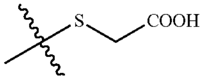 [SMILES: *SCC(=O)O] |
| 371 | 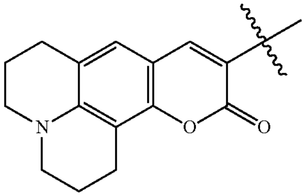 [SMILES: *c1cc2cc3c4c(c2oc1=O)CCCN4CCC3] | Z1 | H | H | 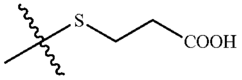 [SMILES: *SCCC(=O)O] |

-continued
| | | | | | |
|---|---|---|---|---|---|
| 372 | 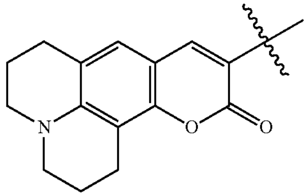 [SMILES: *c1cc2cc3c4c(c2oc1=O)CCCN4CCC3] | Z1 | H | H | 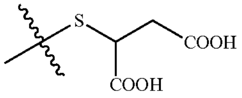 [SMILES: *SC(CC(=O)O)C(=O)O] |
| 373 | 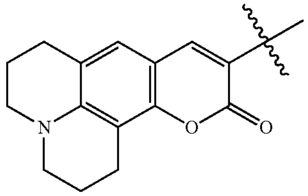 [SMILES: *c1cc2cc3c4c(c2oc1=O)CCCN4CCC3] | Z1 | H | H | 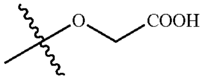 [SMILES: *OCC(=O)O] |

The compounds represented by Formulas (1) to (5) (hereafter the may be called as the dyes of the present invention) can be synthesized with a conventional preparation method. In particular, they can be synthesized with the methods disclosed in JP-A Nos. 7-5709 and 7-5706.
SYNTHETIC EXAMPLE
Synthetic Example 1
Preparation of Dye 1
Dye 1 was prepared by the following scheme.
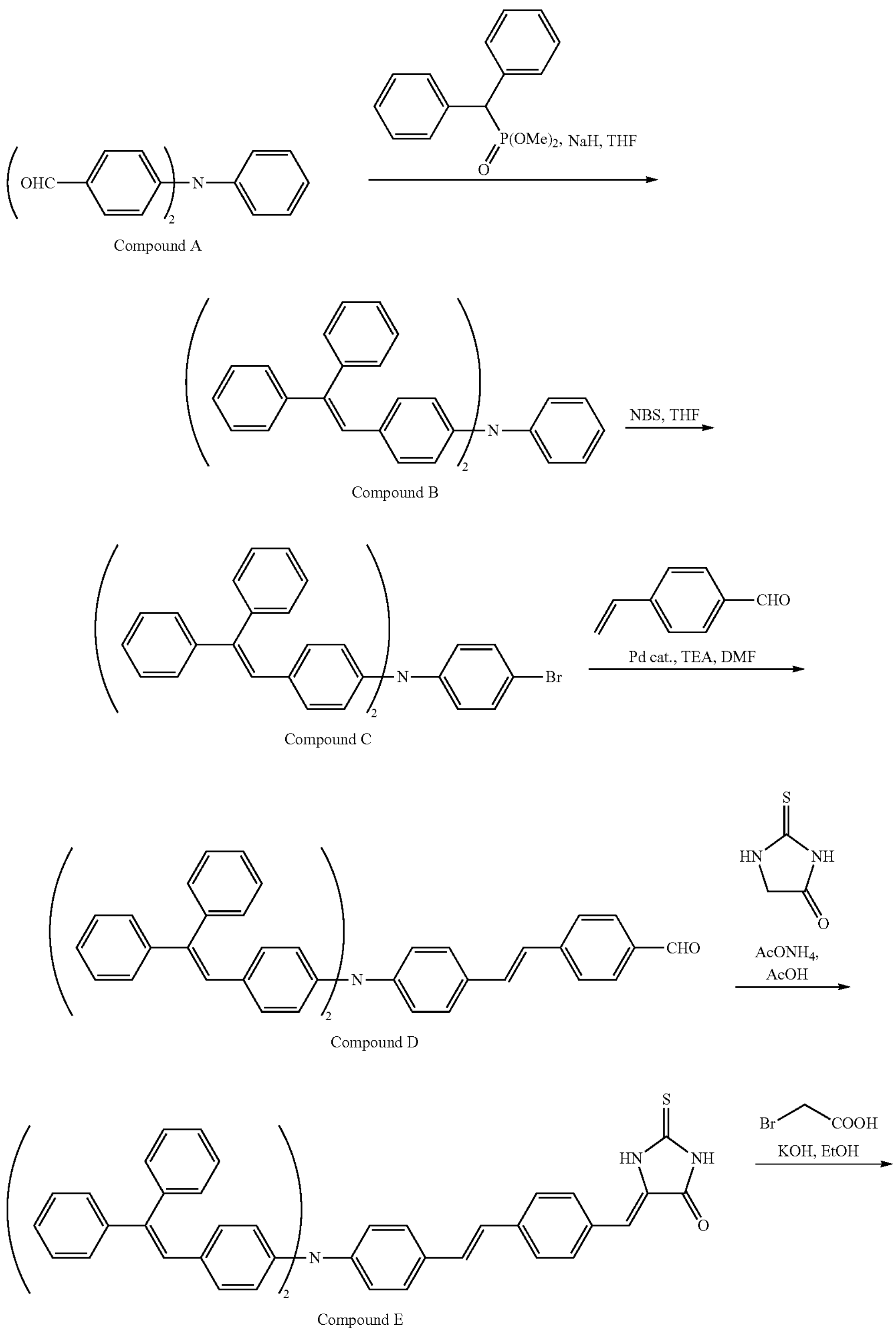

-continued

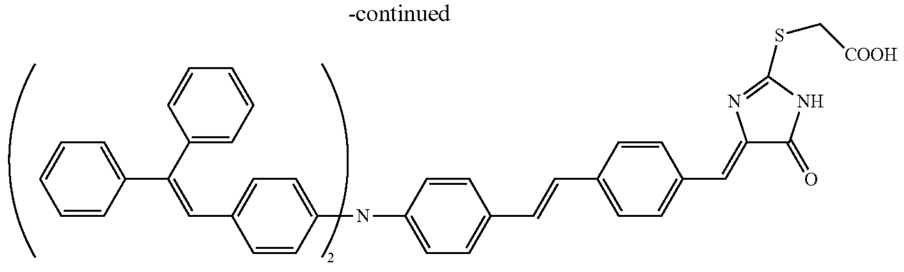

Dye 1

One molar equivalent of Compound A was added to a THF solution containing 2.5 molar equivalents of dimethylbenzhydryl phosphonate and 3 molar equivalents of sodium hydride. Then the mixture was stirred at 70° C. for 1 hour. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound B.

To a THF solution containing one molar equivalent of Compound B cooled at 0° C. was added 1.05 molar equivalents of N-bromosuccinimide and then the mixture was stirred for 30 minutes. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound C.

To a DMF solution containing one molar equivalent of Compound C was added 1.2 molar equivalents of 4-vinylbenzaldehyde, 0.05 molar equivalents of trans-Di-mu-acetatobis [(2-(di-o-tolyl phosphino)benzyl)]dipalladium (II) and 1.5 molar equivalents of triethylamine. Then the mixture was stirred at 50° C. for 12 hours. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound D.

One molar equivalent of Compound D, 1.2 molar equivalents of thiohydantoin and 3 molar equivalents of ammonium acetate were added to acetic acid. Then the mixture was stirred at 120° C. for 1 hour.

After adding water to the reaction solution, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound E.

To an ethanol solution containing one molar equivalent of Compound E were added 1.05 molar equivalents of bromoacetic acid and 3 molar equivalents of potassium hydroxide. Then the mixture was stirred at 70° C. for 1 hour. After the reaction solution was concentrated to dry with a rotary evaporator, water and ethyl acetate were added to the reaction product. The organic phase was eliminated with a separation funnel. To the aqueous phase was added an excessive amount of hydrochloric acid of 1 mol/l. After stirring for 5 minutes, ethyl acetate was added to extract the reaction product followed by washing with water. After drying the ethyl acetate solution with magnesium sulfate, the solution was concentrated to dry with a rotary evaporator. The obtained raw product was treated with silica column chromatography to yield Dye 1.

The structure of Dye 1 was confirmed with a nuclear magnetic resonance spectrum and a mass spectrum.

Synthetic Example 2

Preparation of Dye 82

Dye 82 was prepared by the following scheme.

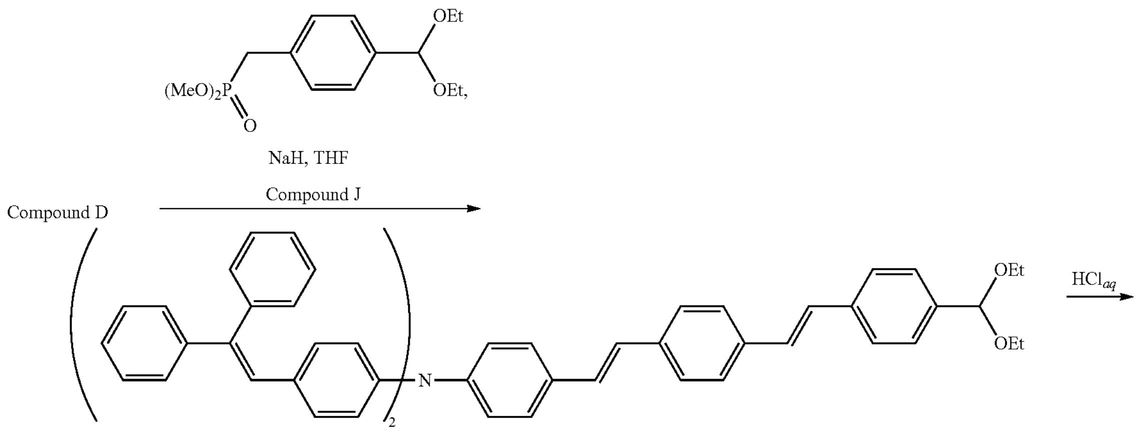

Compund F

-continued

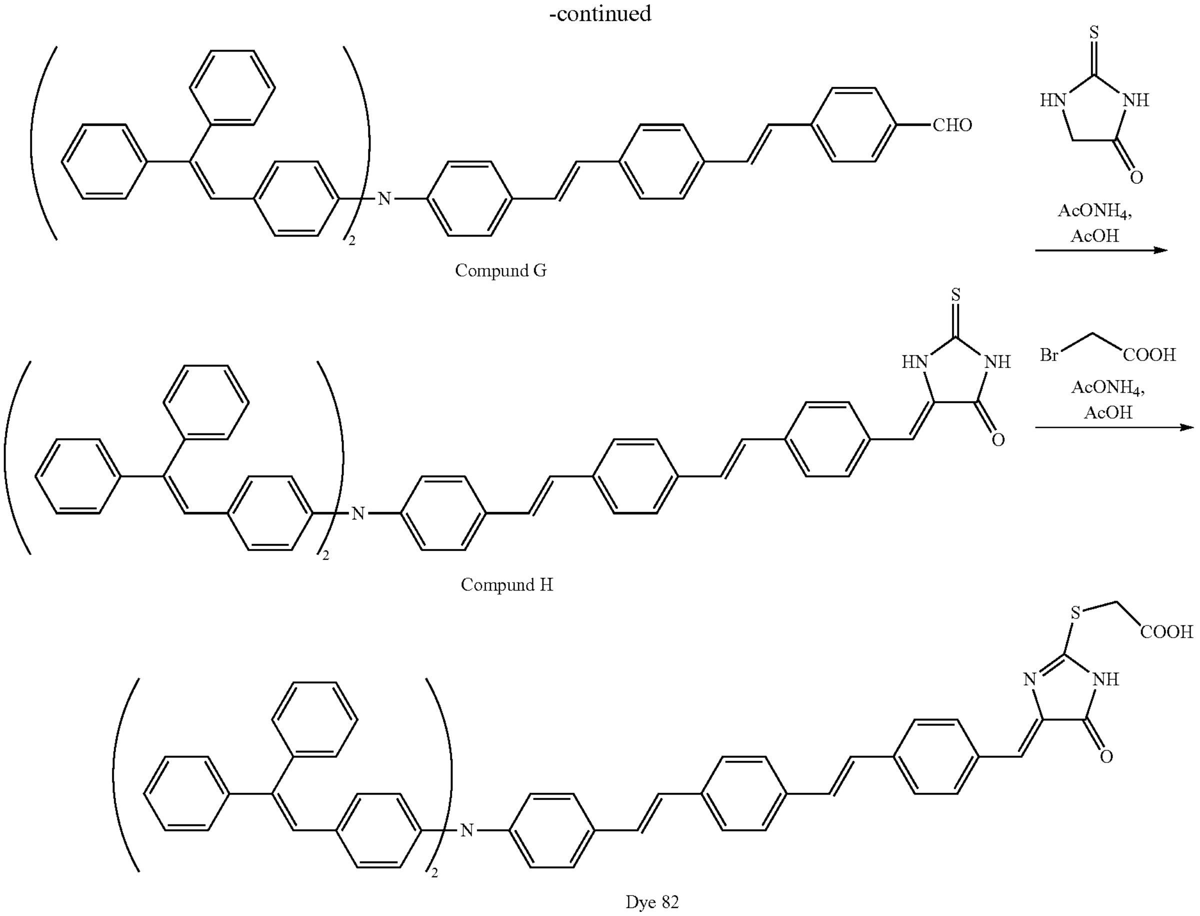

One molar equivalent of Compound D was added to a THF solution containing 1.5 molar equivalents of Compound J and 2 molar equivalents of sodium hydride. Then the mixture was stirred at 70° C. for 1 hour. After adding water to the reaction mixture, the reaction product was extracted with ethyl acetate followed by washing with water. After drying the ethyl acetate solution with magnesium sulfate, the solution was concentrated to thy with a rotary evaporator. The obtained raw product was treated with silica column chromatography to yield Compound F.

To a THF solution containing one molar equivalent of Compound F was added an excessive amount of hydrochloric acid of 1 mol/l. Then the mixture was stirred at room temperature for 30 minute. After adding water to the reaction mixture, the reaction product was extracted with ethyl acetate followed by washing with water. After drying the ethyl acetate solution with magnesium sulfate, the solution was concentrated to dry with a rotary evaporator. The obtained raw product was treated with silica column chromatography to yield Compound G.

One molar equivalent of Compound G, 1.2 molar equivalents of thiohydantoin and 3 molar equivalents of ammonium acetate were added to acetic acid. Then the mixture was stirred at 120° C. for 2.5 hour.

After adding water to the reaction solution, the reaction product was extracted with ethyl acetate followed by washing with water. After drying the ethyl acetate solution with magnesium sulfate, the solution was concentrated to thy with a rotary evaporator. The obtained raw product was treated with silica column chromatography to yield Compound H.

To an ethanol solution containing one molar equivalent of Compound H were added 1.05 molar equivalents of bromoacetic acid and 3 molar equivalents of potassium hydroxide. Then the mixture was stirred at 70° C. for 1 hour. After the reaction solution was concentrated to dry with a rotary evaporator, water and ethyl acetate were added to the reaction product. The organic phase was eliminated with a separation funnel. To the aqueous phase was added an excessive amount of hydrochloric acid of 1 mol/l. After stirring for 5 minutes, ethyl acetate was added to extract the reaction product followed by washing with water. After drying the ethyl acetate solution with magnesium sulfate, the solution was concentrated to dry with a rotary evaporator. The obtained raw product was treated with silica column chromatography to yield Dye 82.

The structure of Dye 82 was confirmed with a nuclear magnetic resonance spectrum and a mass spectrum.

The other dyes of the present invention can be prepared in the same manner as preparation of Dye 1 and Dye 82.

By making a semiconductor support the dye of the present invention thus prepared, sensitization can be performed. As a result, it becomes possible to obtain the effects of the present invention. Here, "making a semiconductor support the dye" means to allow to adsorb the dye to a surface of a semiconductor. When the semiconductor has a porous structure, there are various embodiments such as filling up the porous structure of the semiconductor with the above-mentioned dye.

The total amount of supported dye of the present invention per 1 $m^2$ is preferably from 0.01 to 100 milimols, it is more preferably from 0.1 to 50 milimols, and it is specifically preferably from 0.5 to 20 milimols.

When performing a sensitization treatment using the dye of the present invention, a dye may be used singly or a plurality of dyes may be used in combination. Moreover, it can be used by mixing with other compounds. Examples of the other compounds which can be mixed are described in, for example, U.S. Pat. Nos. 4,684,537, 4,927,721, 5,084,365, 5,350,644, 5,463,057, and 5,525,440; JP-A Nos. 7-249790, and 2000-150007.

Especially when the application of the photoelectric conversion element of the present invention is a solar cell which will be mentioned later, it is desirable to mix and use two or more kinds of dyes in which absorption wavelengths differ so that the wavelength band of photoelectric conversion element may be expanded as much as possible and natural sunlight can be used effectively.

In order to make a semiconductor support the dye of the present invention, it is common to use the way of immersing a well dried semiconductor for a long period of time in a suitable solvents (ethanol etc.) in which the dye is dissolved.

When using together two or more sorts of dyes of the present invention, or using other dyes together and carrying out a sensitization treatment, it is possible to prepare and use the mixed solution of the dyes. Further, it is possible to prepare separate solutions for each dye, and the semiconductor can be immersed in each solution in order, and the dyes can be supported to the semiconductor. By using the method in which separate dye solutions are prepared, and the sensitization is immersed in each solution in order, the effects of the present invention can be acquired regardless the order of incorporating a dye to a semiconductor. Moreover, it is possible to produce a sensitized semiconductor by mixing the particles of the semiconductor to which the above-mentioned dyestuff was made to stick independently.

Moreover, the details of a sensitization process of the semiconductor of the present invention will be described specifically in the later portion where the photoelectric conversion element is described.

Moreover, in the case of a semiconductor having a high porous ratio, it is preferable to complete adsorption treatment of a dye to the semiconductor before water or water vapor stick to the void on the semiconductor film and inside of the semiconductor film.

Next, a photoelectric conversion element of the present invention will be described.

[Photoelectric Conversion Element]

The photoelectric conversion element of the present invention contains a conductive support having thereon: a semiconductor layer composed of a semiconductor which supports a dye of the present invention; an electric transport layer; and a pair of opposite electrodes. In the following, the semiconductor, the electrolyte and the opposite electrodes will be described successively.

<<Semiconductor>>

Usable examples of the semiconductor employed for a photoelectrode include an elemental substance such as silicon or germanium; a compound containing an element in Groups 3-5 and Groups 13-15 of the periodic table (referred to also as the element periodic table); a metal chalcogenide such as oxide, sulfide, or selenide; and a metal nitride.

Preferable examples of a metal chalcogenide include: an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and a telluride of cadmium. Examples of other compound-semiconductors include: a phosphide of zinc, gallium, indium, or cadmium; a selenide of gallium-arsenic or copper-indium; a sulfide of copper-indium; and a nitride of titanium.

Specific examples include: $TiO_2$, $SnO_2$, $Fe_2O_3$, $WO_3$, ZnO, $Nb_2O_5$, CdS, ZnS, PbS, $Bi_2S_3$, CdSe, CdTe, GaP, Inp, GaAs, $CuInS_2$, $CuInSe_2$, $Ti_3N_4$ and so forth. Of these, $TiO_2$, ZnO, $SnO_2$, $Fe_2O_3$, $WO_3$, $Nb_2O_5$, CdS and PbS are preferably usable, $TiO_2$ and $Nb_2O_5$ are more preferably usable, and $TiO_2$ is most preferably usable.

As a semiconductor employed for a semiconductor layer, the above-described plural semiconductors may be used in combination. For example, several kinds of the above-described metal oxide or metal sulfide may be used in combination, and 20% by weight of titanium nitride ($Ti_3N_4$) may be mixed in titanium oxide semiconductor to be used. The zinc oxide/tin oxide composite described in J. Chem. Soc., Chem. Commun., 15 (1999) may also be applied. In this case, when a component other than metal oxide or metal sulfide is added as a semiconductor, a content of such the addition component is preferably 30% by weight with respect to the metal oxide or metal sulfide semiconductor.

A semiconductor utilized for the present invention may be subjected to a surface treatment employing an organic base. Preferable examples of the foregoing organic base include diarylamine, triarylamine, pyridine, 4-t-butylpyridine, polyvinylpyridine, quinoline, piperidine and amidine. Among them, pyridine, 4-t-butylpyridine and polyvinylpyridine are preferable.

When the above-described organic base is liquid, it can be used as it is. When the organic base is solid, a solution dissolved in an organic solvent is prepared, and a surface treatment can be conducted by immersing a semiconductor of the present invention in liquid amine or an amine solution.

<<Conductive Support>>

A conductive material such as a metal, or a composite material having a structure in which a conductive substance is provided on a nonconductive material like a glass plate or a plastic film can be utilized for a conductive support employed for a photoelectric conversion element and a solar cell of the present invention. Examples of the material used for the conductive support include: a metal such as platinum, gold, silver, copper, aluminum, rhodium and indium; a conductive metal oxide such as indium-tin oxide composite oxide and fluorine-doped tin oxide; and carbon. The thickness of the conductive support is not specifically limited, however, the thickness is preferably from 0.3-5 mm.

It is preferable that the conductive support is substantially transparent. The term “substantially transparent” means that transmittance is at least 10%, preferably at least 50%, and more preferably at least 80%. In order to obtain a transparent conductive support, a conductive layer made of conductive metal oxide is preferably provided on the surface of a glass plate or a plastic film. When the transparent conductive support is employed, light should enter from the support side.

The conductive support preferably has a surface resistance of 50 $\Omega/cm^2$ or less and more preferably has a surface resistance of 10 $\Omega/cm^2$ or less.

<<Preparation of Semiconductor Layer>>

A method of preparing a semiconductor layer of the present invention will be described.

When a semiconductor in the semiconductor layer of the present invention is in the form of a particle, the semiconductor is preferably prepared by coating or spraying particles onto a conductive support. Further, when the semiconductor of the present invention is in the form of a film, and is not supported on the conductive support, the semiconductor is preferably attached onto the conductive support to prepare the semiconductor layer.

As a preferable embodiment of a semiconductor layer of the present invention, there is provided a method of forming via calcination employing semiconductor particles on the above-described conductive support.

When a semiconductor of the present invention is prepared via calcination, the semiconductor is preferably subjected to a sensitization (adsorption, filling in a porous layer, and so forth) treatment employing a sensitizing dye after calcination. After the calcination, specifically, the adsorption treatment of the dye compound to the semiconductor is preferably done without delay before water is adsorbed to the semiconductor.

Next, a method of forming a photoelectrode via calcination employing semiconductor particles, which is preferably utilized in the present invention, will be described in detail.

(Preparation of Semiconductor Powder-Containing Coating Solution)

First, a semiconductor powder-containing coating solution is prepared. The primary particle diameter of this semiconductor powder is preferably as fine as possible. The semiconductor powder preferably has a primary particle diameter of 1-5,000 nm, and more preferably has a primary particle diameter of 2-50 nm. The coating solution containing the semiconductor powder can be prepared by dispersing the semiconductor powder in a solvent. The semiconductor powder dispersed in the solvent is dispersed in the form of the primary particle. The solvent is not specifically limited as long as it can disperse the semiconductor powder.

As the foregoing solvent, water, an organic solvent, and a mixture of water and an organic solvent are included. As the organic solvent, the following solvents are usable: alcohol such as methanol, or ethanol; ketone such as methyl ethyl ketone, acetone, or acetylacetone; and hydrocarbon such as hexane, or cyclohexane. A surfactant and a viscosity controlling agent (polyhydric alcohol such as polyethylene glycol) can be added into a coating solution, if desired. The content of the semiconductor powder in the solvent is preferably 0.1-70% by weight, and more preferably 0.1-30% by weight.

(Coating of Semiconductor Powder-Containing Coating Solution and Calcination Treatment of Formed Semiconductor Layer)

The semiconductor powder-containing coating solution obtained as described above is coated or sprayed onto the conductive support, followed by drying, and then heated in air or inactive gas to form a semiconductor layer (referred to also as a semiconductor film) on the conductive support.

The layer formed via coating the semiconductor powder-containing coating solution onto the conductive support, followed by drying is composed of an aggregate of semiconductor particles, and the particle diameter corresponds to the primary particle diameter of the utilized semiconductor powder.

The semiconductor particle layer formed on a conductive layer of the conductive support as described above is subjected to a calcination treatment in order to increase mechanical strength and to produce a semiconductor layer firmly attached to a substrate, since the semiconductor particle layer exhibits bonding force with the conductive support, as well as bonding force between particles, and also exhibits weak mechanical strength.

In the present invention, this semiconductor layer may have any structure, but a porous structure layer (referred to also as a porous layer possessing vacant spaces) is preferable.

The semiconductor layer of the present invention preferably has a porosity of 10% by volume or less, more preferably has a porosity of 8% by volume or less, and most preferably has a porosity of 0.01-5% by volume. In addition, the porosity of the semiconductor layer means a through-hole porosity in the direction of thickness of a dielectric, and it can be measured by a commercially available device such as a mercury porosimeter (Shimadzu Pore Analyzer 9220 type).

A semiconductor layer as a calcined film having a porous structure preferably has a thickness of at least 10 nm, and more preferably has a thickness of 200-30,000 nm.

A calcination temperature of 1,000° C. or less is preferable, a calcination temperature of 200-800° C. is more preferable, and a calcination temperature of 300-800° C. is still more preferable in view of acquisition of a calcined film having the above-described porosity by suitably preparing real surface area of the calcined film during calcination treatment.

Further, a ratio of the real surface area to the apparent surface area can be controlled by a diameter and specific surface area of the semiconductor particle, the calcination temperature and so forth. After conducting a heat treatment, chemical plating employing an aqueous solution of titanium tetrachloride or electrochemical plating employing an aqueous solution of titanium trichloride may be conducted in order to increase the surface area of a semiconductor particle and purity in the vicinity of the semiconductor particle, and to increase an electron injection efficiency from a dye to a semiconductor particle.

(Sensitization Treatment of Semiconductor)

The sensitization treatment of the semiconductor is carried out by immersing a substrate burned with the foregoing semiconductor into a solution prepared after dissolving a sensitizing dye in a suitable solvent as described before. In this case, bubbles in the layer are preferably removed by conducting a reduced pressure treatment or a heat treatment for a substrate on which a semiconductor layer (referred to also as a semiconductor film) is formed via calcination. Through such the treatment, a sensitizing dye can easily be penetrated deeply into the inside of the semiconductor layer (semiconductor film), and such the treatment is specifically preferable when the semiconductor layer (semiconductor film) possesses a porous structure film.

The solvent to dissolve the foregoing sensitizing dye in the present invention is not specifically limited as long as the solvent can dissolve the foregoing compound, and neither dissolve the semiconductor nor react with the semiconductor. However, the solvent is preferably subjected to deaeration and purification via distillation to prevent penetration of moisture and gas dissolved in the solvent into the semiconductor layer so as to avoid the sensitization treatment such as adsorption of the foregoing compound.

Examples of preferably usable solvents to dissolve the foregoing compound include: a nitrile based compound such as acetonitrile; an alcohol based solvent such as methanol, ethanol, or n-propanol; a ketone type solvent such as acetone, or methyl ethyl ketone; an ether based solvent such as diethyl ether, diisopropyl ether, tetrahydrofuran, or 1,4-dioxane; and a halogenated hydrocarbon solvent such as methylene chloride, or 1,1,2-trichloroethane. A plurality of solvents may be mixed. Specifically preferred are: acetonitrile, a mixed solvent of acetonitrile and methanol, methanol, ethanol, acetone, methyl ethyl ketone, tetrahydrofuran, and methylene chloride.

(Temperature and Time for Sensitization Treatment)

As to time to immerse a substrate on which the semiconductor layer is formed via calcination in a solution containing a sensitizing dye of the present invention, it is preferable to sufficiently sensitize the semiconductor by sufficiently making progress of adsorption by penetrating deeply into the semiconductor layer (semiconductor film). The time is preferably 3-48 hours, and more preferably 4-24 hours at 25° C. in order to inhibit that decomposed products prepared via decomposition of a sensitizing dye in a solution obstruct adsorption of the sensitizing dye formed by decomposition of the dye in the solvent. This effect is remarkable when the semiconductor film is specifically a porous structure film. However, the above-indicated immersion time is a value at 25° C. and it is not always applied when the temperature is varied.

During the immersion, a solution containing a sensitizing dye employed in the present invention may be heated up to the temperature of no boiling, as long as the foregoing sensitizing dye is not decomposed. The temperature range is preferably 10-100° C., and more preferably 25-80° C., as long as the solution is not boiled in the foregoing temperature range.

<<Charge Transport Layer>>

A charge transport layer used in the present invention will be described.

A charge transport layer is a layer which bears the function to reduce the oxidized dye promptly and to transport the positive hole which is injected at the interface with the dye to a counter electrode.

The charge transport layer concerning the present invention is composed of a dispersion of a redox electrolyte or a p type compound semiconductor (charge transport agent) which is a positive hole transport material, as a main ingredient.

As the redox electrolyte, $I^-/I_3^-$ system, $Br^-/Br_3^-$ system and quinone/hydroquinone system are cited. Such the redox electrolyte can be obtained by a commonly known method, and the electrolyte of $I^-/I_3^-$ system, for example, can be obtained by mixing an ammonium salt of iodine and iodine. The electrolyte layer is composed of the dispersion of such the redox electrolyte. When such the dispersion is a solution, the dispersion is called a liquid electrolyte; when one being a solid at room temperature is dispersed in a polymer, it is called a solid polymer electrolyte; and when it is dispersed in a material in the form of a gel, it is called a gel electrolyte. When the liquid electrolyte is employed as a liquid electrolyte, an electrochemically inactive substance is used as the solvent such as acetonitrile, propylene carbonate, ethylene carbonate and so forth. Examples of the solid polymer electrolyte are disclosed in Japanese Patent O.P.I. Publication No. 2001-160427, and examples of the gel electrolyte are disclosed in "Hyomen Kagaku (Surface Science)" Vol. 21, No. 5, pages 288-293.

As a charge transport agent, it is desirable that the charge transport agent has a large band gap in order not to prevent absorption by the dye. The band gap of the charge transport agent used in the present invention is preferably 2 eV or more, and it is more preferably 2.5 eV or more. Moreover, the ionization potential of the charge transport agent needs to be smaller than the ionization potential of a dye adsorbed electrode in order to reduce a positive hole of the dye. Although the preferable range of the ionization potential of the charge transport agent used for a charge transport layer will differ with the dye to be used, in general, it is preferably from 4.5 eV to 5.5 eV, and more preferably it is from 4.7 eV to 5.3 eV.

As a charge transport agent, an aromatic amine derivative excellent in the transport capacity of a positive hole is desirable. For this reason, photoelectric conversion efficiency can be raised more by constituting a charge transport layer mainly from an aromatic amine derivative.

Especially, as an aromatic amine derivative, it is preferable to use a triphenyldiamine derivative. A triphenyldiamine derivative is specifically excellent in the transport capacity of a positive hole among the aromatic amine derivatives. Moreover, any of a monomer, an oligomer, a prepolymer, and a polymer may be used for such an aromatic amine derivative, and it may be used by mixing these compounds. A monomer, an oligomer, and a prepolymer have relatively low molecular weight, therefore, their solubility to solvent, such as an organic solvent, is expected to be high. For this reason, when a charge transport layer is formed with a coating method, there is an advantage that charge transporting layer material can be prepared more easily. Among these, as an oligomer, it is preferable to use a dimer or a trimmer.

Specific examples of an aromatic tertiary amine compound and a styrylamine compound include: N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4"-tris[N-(3-methylphenyl)-N-phenylamino]triphenylamine (MDTDATA), in which three of triphenylamine units are bonded in a star burst form, described in JP-A No. 4-308688.

Furthermore, the polymer which is introduced the above-described materials into the polymer chain, or into the backbone of the polymer can also be used.

As a charge transport agent other than an aromatic amine derivative, there can be cited, for example, a thiophene derivative, a pyrrole derivative, and a stilbene derivative.

Although examples of a charge transport agent are shown below, the present invention is not limited to these.

D-1
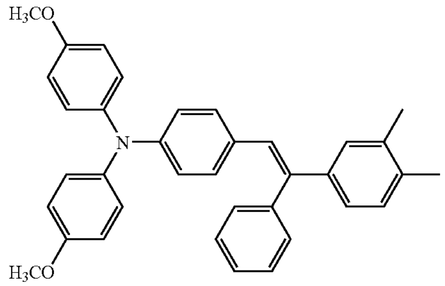
D-2
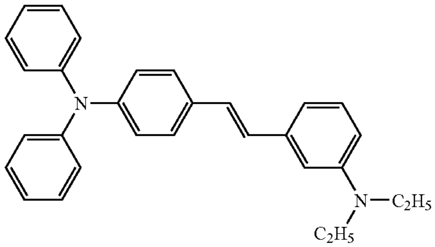
D-3
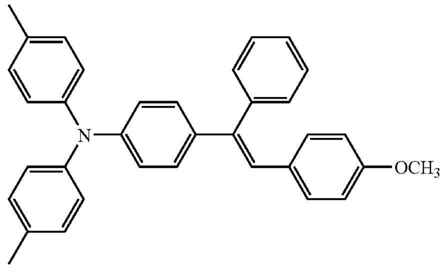
D-4
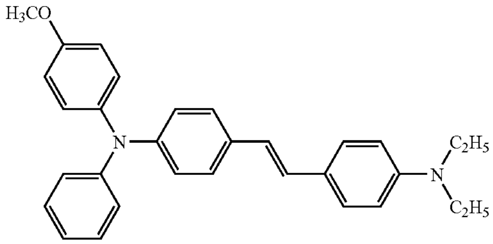
D-5
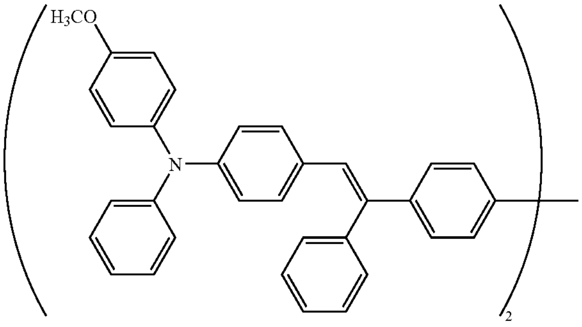
D-6
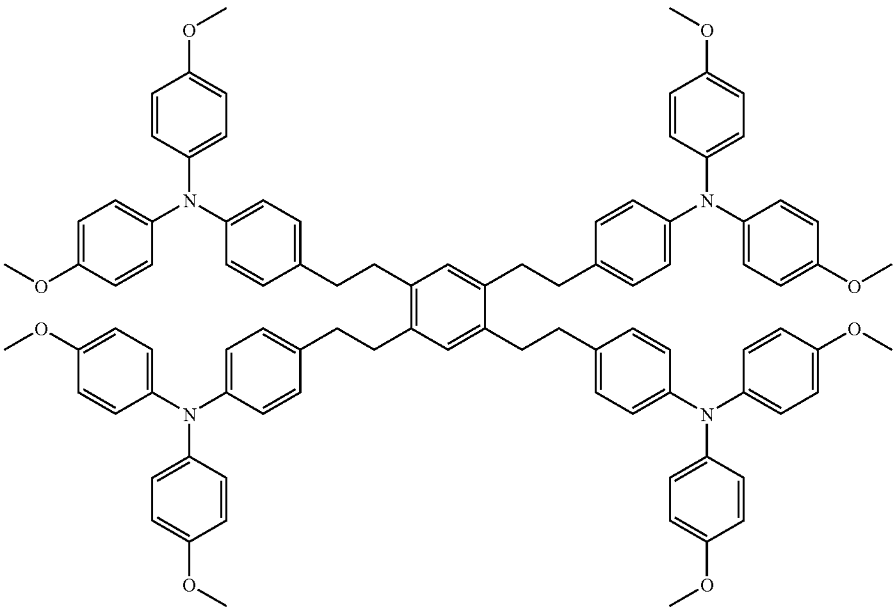

-continued
D-7
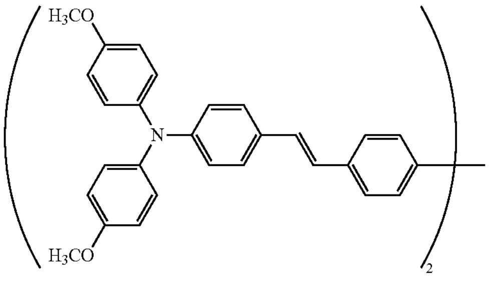
D-8
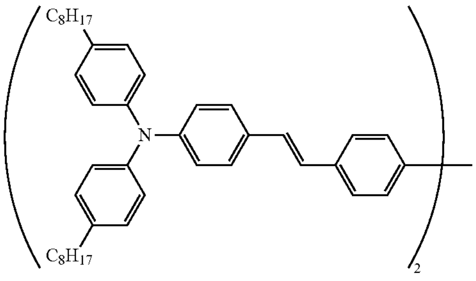
D-9
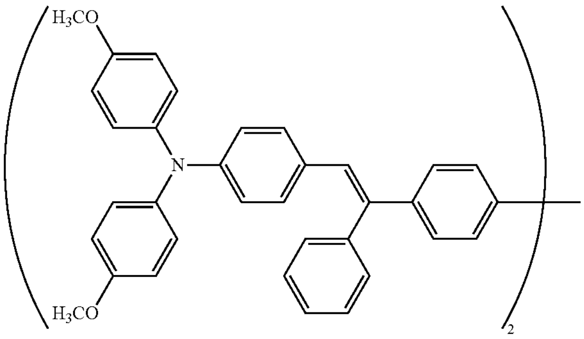
D-10
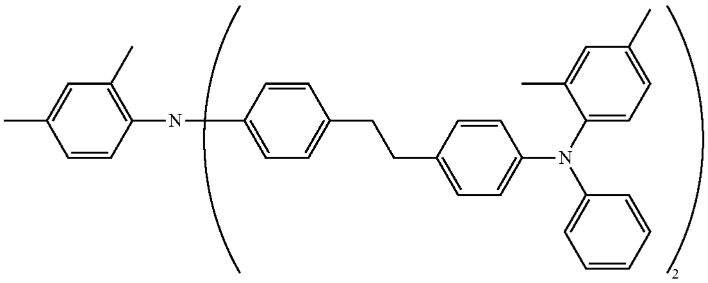
D-11
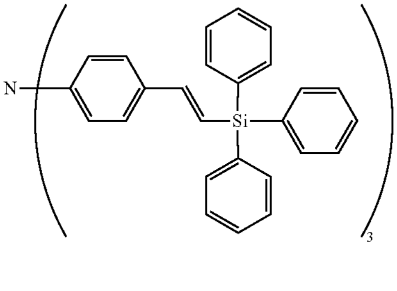
D-12
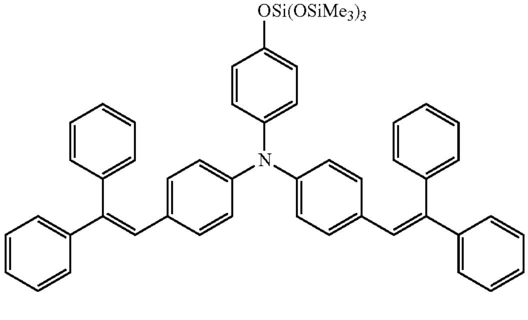

-continued

D-13

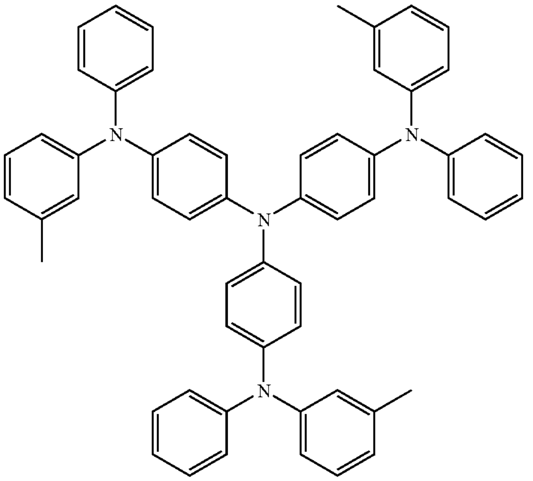

D-14

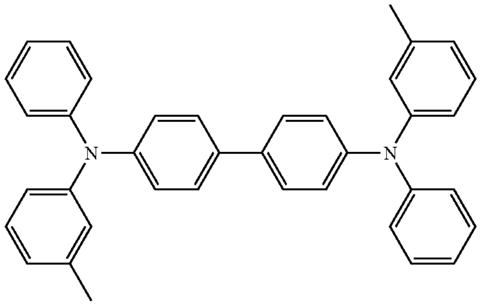

D-15

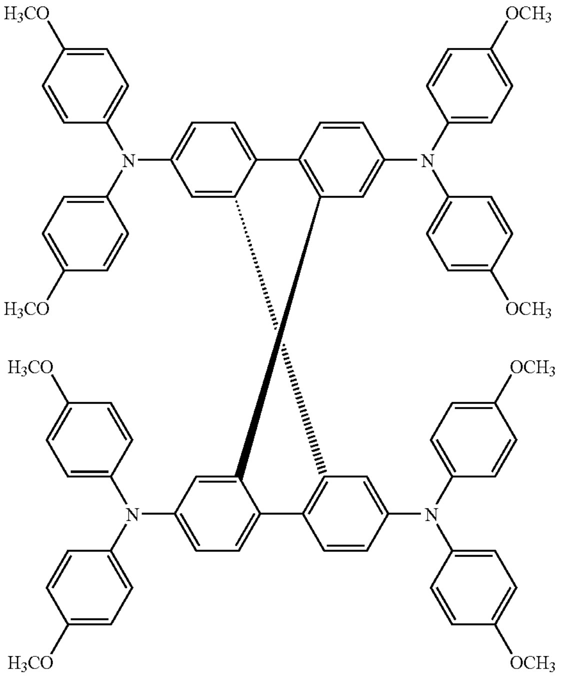

<<Opposite Electrode>>

The opposite electrode employed in the present invention will be described.

Any conductive material is optionally usable for the opposite electrode, but preferable is one exhibiting catalytic ability to perform oxidation of a redox ion of $I_3^-$ and reducing reaction of another ion at sufficient speed. As such the electrode, a platinum electrode, those subjected to platinum plating or platinum evaporation on the surface of a conductive material, rhodium metal, ruthenium metal, ruthenium oxide, carbon and so forth are cited.

[Solar Cell]

A solar cell of the present invention will be described.

As an embodiment of a photoelectric conversion element in the present invention, the solar cell of the present invention is designed to be optimized for circuit design to solar light, and possesses a structure capable of performing optimum photoelectric conversion when solar light is utilized as a light source. That is, the solar cell possesses a structure in which a dye-sensitized semiconductor can be exposed to solar light. When a solar cell of the present invention is prepared, the foregoing photoelectrode, charge transport layer and opposite electrodes are stored in a case and sealed, or they are entirely sealed with a resin.

When the solar cell of the present invention is exposed to solar light or electromagnetic waves identical to solar light, the foregoing sensitizing dye carried by a semiconductor absorbs exposure light or exposure electromagnetic waves, and is exited. Electrons are generated via excitation, generated electrons are moved to the semiconductor and subsequently to the opposite electrode via a conductive support to reduce a redox electrolyte in a charge transfer layer. On the other hand, a sensitizing dye of the present invention by which electrons are moved to the semiconductor becomes an oxidized body, but electrons are supplied from the opposite electrode via the redox electrolyte in the electrolyte layer to conduct reducing, and returned to the original state. The redox electrolyte in the charge transfer layer is simultaneously oxidized so as to be returned to a state where it is reduced again by electrons supplied from the opposite electrode. Since electrons can be moved by such the mechanism, a solar cell of the present invention can be constituted by using a photoelectric conversion element.

EXAMPLE

The present invention will be described with reference to examples, but the present invention is not limited to these examples.

(Preparation of Photoelectric Conversion Element 1)

A titanium oxide paste (anatase type having a primary average particle diameter of 18 nm, observed with a microscope, and dispersed in polyethylene glycol) was coated onto a fluorine-doped tin oxide conductive glass substrate (herein after, referred to also as FTO) by a screen printing method (printing area of $5 \times 5\ mm^2$). The coating and drying (at 120° C. for 3 minutes) each were made three times. Then, the paste was heated at 200° C. for 10 minutes and subsequently at 500° C. for 15 minutes to obtain a titanium oxide thin film having a thickness of 15 μm. Further, on this thin film was coated another titanium oxide paste (anatase type having a primary average particle diameter of 400 nm, observed with a microscope, and dispersed in polyethylene glycol) in the same manner as described above to obtain a titanium oxide thin film having a thickness of 5 μm.

Dye 1 of the present invention was dissolved in a mixed solvent of acetonitrile and t-butyl alcohol (1:1) to prepare a $5 \times 10^{-4}$ mol/l of dye solution. The FTO glass substrate on which titanium oxide paste was coated and heated was immersed in this solution at room temperature for 3 hours to conduct an adsorption treatment of the dye to prepare an oxide semiconductor electrode.

As a charge transfer layer (an electrolytic solution), an acetonitrile solution containing 0.6 mol/l of 1-methyl-3-butylimidazolium iodide, 0.1 mol/l of guanidine thiocyanate, 0.05 mol/l of iodine and 0.5 mol/l of 4-(t-butyl) pyridine was used. By using the glass on which were provided with the previously prepared oxide semiconductor electrode, and vapor deposited platinum and chrome as an opposite electrode, Photoelectric conversion element 1 was prepared as a clamp cell (a cell using a clamp as a fixing means) so that the thickness of the charge transfer layer became 20 μm.

(Preparation of Photoelectric Conversion Elements 2 to 35)

Photoelectric conversion elements 2 to 35 were prepared in the same manner as preparation of Photoelectric conversion element 1, except that Dye 1 was replaced with the dye of the present invention shown in Table 1.

(Preparation of Photoelectric Conversion Element 36)

Photoelectric conversion element 36 was prepared in the same manner as preparation of Photoelectric conversion element 1, except that the $5 \times 10^{-4}$ mol/l solution of Dye 1 in the mixed solvent of acetonitrile and t-butyl alcohol (1:1) was replaced with a mixed dye solution of $5 \times 10^{-4}$ mol/l. The mixed dye solution was prepared by mixing 1:1 ratio of a solution of Dye 183 dissolved in the mixed solvent of acetonitrile and t-butyl alcohol (1:1) to be $5 \times 10^{-4}$ mol/l solution, and a solution of Dye 401 dissolved in the mixed solvent of acetonitrile and t-butyl alcohol (1:1) to be $5 \times 10^{-4}$ mol/l solution.

Dye 401

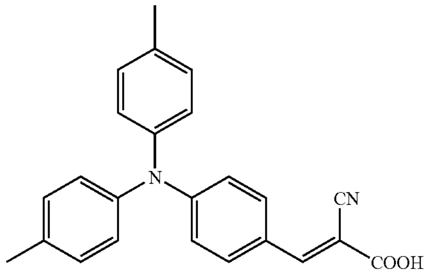

(Preparation of Photoelectric Conversion Element 37)

Photoelectric conversion element 37 was prepared in the same manner as preparation of Photoelectric conversion element 1, except that the $5 \times 10^{-4}$ mol/l solution of Dye 1 in the mixed solvent of acetonitrile and t-butyl alcohol (1:1) was replaced with a mixed dye solution of $5 \times 10^{-4}$ mol/l. The mixed dye solution was prepared by mixing 1:1 ratio of a solution of Dye 27 dissolved in the mixed solvent of acetonitrile and t-butyl alcohol (1:1) to be $5 \times 10^{-4}$ mol/l solution, and a solution of Dye 220 dissolved in the mixed solvent of acetonitrile and t-butyl alcohol (1:1) to be $5 \times 10^{-4}$ mol/l solution.

(Preparation of Photoelectric Conversion Elements 38 and 39)

Photoelectric conversion elements 38 and 39 were prepared in the same manner as preparation of Photoelectric conversion element 1, except that Dye 1 was replaced with Comparative dyes 501 and 502, and the charge transport layer was formed using a 3-methoxypropionitrile solution containing 0.6 mol/l of 1-methyl-3-butylimidazolium iodide, 0.1 mol/l of lithium iodide, 0.05 mol/l of iodine and 0.5 mol/l of 4-(t-butyl)pyridine.

Dye 501

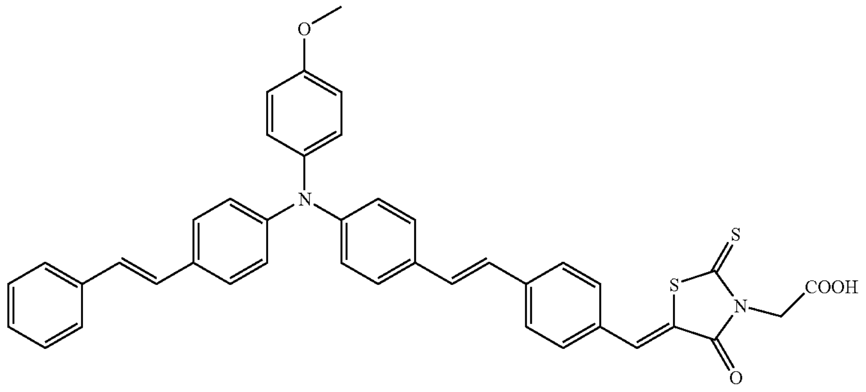

Dye 502

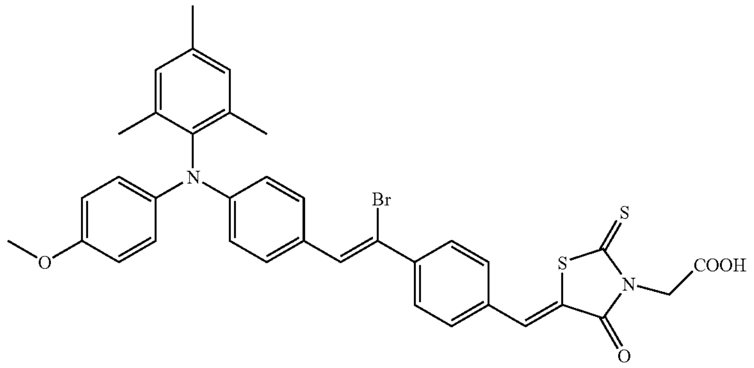

A titanium oxide paste (anatase type having a primary average particle diameter of 18 nm, observe with a microscope, and dispersed in polyethylene glycol) was coated onto a fluorine-doped tin oxide conductive glass substrate (herein after, referred to also as FTO) by a screen printing method (printing area of 5×5 mm$^2$). The coated paste was heated at 200° C. for 10 minutes and subsequently at 450° C. for 15 minutes to obtain a titanium oxide thin film having a thickness of 1.5 μm.

Dye 183 of the present invention was dissolved in a mixed solvent of acetonitrile and t-butyl alcohol (1:1) to prepare a 5x10$^{-4}$ mol/l of dye solution. The FTO glass substrate on which titanium oxide paste was coated and heated was immersed in this solution at room temperature for 3 hours to conduct an adsorption treatment of the dye to prepare a semiconductor electrode.

The following coating solution for forming a hole transport layer was prepared. To a mixed solvent of chlorobenzene and acetonitrile (19:1) were dissolved a hole transport material of an aromatic amine derivative 2,2',7,7'-tetrakis(N,N'-di(4-methoxyphenyl)amine)-9,9'-spirobifluorene (Spiro-OMeTAD) to become 0.17 mol/l; a hole doping agent of $N(PhBr)_3SbCl_6$ to become 0.33 mmol/l; $Li[(CF_3SO_2)_2N]$ to become 15 mmol/l, and t-butylpyridine to become 50 mmol/l. Thus prepared coating solution for hole transport layer was coated by a spin coating method on the above-described semiconductor layer which had been adsorbed and bonded the photosensitizing dye to obtain a charge transport layer having a thickness of 10 μm. Further, gold having a thickness of 90 nm was deposited with a vacuum vapor deposition method to form an opposite electrode. Thus, Photoelectric conversion element 40 was prepared. The rotation speed of the aforesaid coating by the spin coating method was set to be 1,000 rpm.

(Preparation of Photoelectric Conversion Element 41)

Photoelectric conversion element 41 was prepared in the same manner as preparation of Photoelectric conversion element 40, except that the dye was replaced with Dye 501.

The evaluation of the prepared photoelectric conversion elements was done by irradiating with an artificial sunlight produced though a xenon lamp fitted with an AM filter (AM-1.5) with 100 mW/cm$^2$ and 10 mW/cm$^2$ using Solar simulator (made by Eiko Seiki Co., Ltd.). The evaluation was made by measuring an electric current-voltage property at room temperature using an I-V tester to obtain Short-circuit current density (Jsc), Open-circuit voltage (Voc), and Fill factor (F.F.). Photoelectric conversion efficiency (η(%)) was obtained using these values.

The evaluation results are shown in Table 1.

TABLE 1

| Photoelectric conversion element No. | Dye | Amount of light (100 mW) Open-circuit voltage (mV) | Short-circuit current density (mA/cm²) | Photoelectric conversion efficiency (%) | Amount of light (10 mW) Open-circuit voltage (mV) | Short-circuit current density (mA/cm²) | Photoelectric conversion efficiency (%) | Remarks |
|---|---|---|---|---|---|---|---|---|
| 1 | 1 | 710 | 13.8 | 6.2 | 690 | 1.52 | 6.8 | Inv. |
| 2 | 3 | 700 | 14.1 | 5.9 | 690 | 1.55 | 6.5 | Inv. |
| 3 | 5 | 680 | 15.1 | 6.0 | 660 | 1.66 | 6.6 | Inv. |
| 4 | 8 | 730 | 12.1 | 6.0 | 720 | 1.33 | 6.6 | Inv. |
| 5 | 20 | 650 | 12.0 | 4.9 | 650 | 1.32 | 5.4 | Inv. |
| 6 | 22 | 720 | 14.2 | 6.6 | 700 | 1.56 | 7.3 | Inv. |
| 7 | 29 | 720 | 13.9 | 6.4 | 710 | 1.53 | 7.0 | Inv. |
| 8 | 61 | 700 | 13.8 | 6.0 | 700 | 1.52 | 6.6 | Inv. |
| 9 | 82 | 690 | 14.1 | 6.2 | 690 | 1.55 | 6.8 | Inv. |
| 10 | 110 | 680 | 13.8 | 5.8 | 670 | 1.52 | 6.4 | Inv. |
| 11 | 114 | 710 | 11.1 | 4.9 | 700 | 1.22 | 5.4 | Inv. |
| 12 | 135 | 680 | 10.0 | 4.7 | 670 | 1.10 | 5.2 | Inv. |
| 13 | 148 | 690 | 8.9 | 3.2 | 690 | 1.07 | 3.8 | Inv. |
| 14 | 161 | 740 | 9.2 | 3.9 | 720 | 1.10 | 4.7 | Inv. |
| 15 | 172 | 690 | 10.1 | 3.7 | 680 | 1.21 | 4.4 | Inv. |
| 16 | 183 | 690 | 15.3 | 7.2 | 670 | 1.68 | 7.9 | Inv. |
| 17 | 193 | 600 | 7.0 | 3.0 | 600 | 0.84 | 3.6 | Inv. |
| 18 | 202 | 670 | 9.2 | 4.4 | 660 | 1.01 | 4.8 | Inv. |
| 19 | 221 | 690 | 10.0 | 4.6 | 670 | 1.10 | 5.1 | Inv. |
| 20 | 224 | 690 | 9.3 | 4.3 | 690 | 1.02 | 4.7 | Inv. |
| 21 | 231 | 710 | 10.3 | 4.9 | 700 | 1.13 | 5.4 | Inv. |
| 22 | 235 | 760 | 11.8 | 6.1 | 750 | 1.30 | 6.7 | Inv. |
| 23 | 247 | 730 | 12.6 | 6.3 | 730 | 1.39 | 6.9 | Inv. |
| 24 | 257 | 750 | 14.1 | 6.9 | 740 | 1.55 | 7.6 | Inv. |
| 25 | 265 | 700 | 9.9 | 4.8 | 680 | 1.09 | 5.3 | Inv. |
| 26 | 276 | 650 | 7.2 | 3.1 | 650 | 0.86 | 3.7 | Inv. |
| 27 | 280 | 630 | 6.9 | 3.0 | 620 | 0.83 | 3.6 | Inv. |
| 28 | 289 | 680 | 8.9 | 4.3 | 680 | 0.98 | 4.7 | Inv. |
| 29 | 295 | 670 | 8.8 | 4.5 | 670 | 0.97 | 5.0 | Inv. |
| 30 | 304 | 690 | 9.1 | 4.6 | 670 | 1.00 | 5.1 | Inv. |
| 31 | 321 | 690 | 9.0 | 4.3 | 680 | 0.99 | 4.7 | Inv. |
| 32 | 326 | 700 | 11.0 | 4.9 | 700 | 1.21 | 5.4 | Inv. |
| 33 | 334 | 690 | 10.2 | 4.8 | 670 | 1.12 | 5.3 | Inv. |
| 34 | 363 | 660 | 8.2 | 3.9 | 660 | 0.98 | 4.7 | Inv. |
| 35 | 365 | 670 | 7.8 | 3.9 | 660 | 0.94 | 4.7 | Inv. |
| 36 | 183/401 | 710 | 14.9 | 7.1 | 700 | 1.64 | 7.8 | Inv. |
| 37 | 27/220 | 720 | 12.0 | 6.1 | 700 | 1.32 | 6.7 | Inv. |
| 38 | 501 | 670 | 7.2 | 2.9 | 650 | 0.72 | 2.9 | Comp. |
| 39 | 502 | 660 | 7.2 | 2.8 | 650 | 0.72 | 2.8 | Comp. |
| 40 | 183 | 730 | 8.1 | 3.0 | 720 | 0.81 | 3.6 | Inv. |
| 41 | 501 | 690 | 5.2 | 1.5 | 670 | 0.57 | 1.7 | Comp. |

Inv.: Invention,
Comp.: Comparison

From the results shown in Table 1, the samples of the present invention exhibited excellent photoelectric conversion efficiencies both at a strong irradiation condition (100 mW/cm$^2$) and at a weak irradiation condition (10 mW/cm$^2$). In addition, it was found the followings. Photoelectric conversion element 7 incorporating Dye 29 which has an imidazolone structure and a stilbene structure exhibited improvement in Short-circuit current density, Open-circuit voltage and Photoelectric conversion efficiency compared with Photoelectric conversion element 38 incorporating Dye 501 which has a rhodanine structure. One of the reasons for Photoelectric conversion element 7 to have achieved a high conversion efficiency is considered as follows: Dye 29 has a longer absorption wavelength in an amount of 32 nm compared with Dye 501; and when Dye 29 was adsorbed to an oxide semiconductor, the aggregate of the dye was developed by the strong intermolecular interaction by the aryl group, and/or the olefin group with the imidazolone structure as an acceptor part, thereby the absorption wavelength of the dye was extended. Moreover, improvement in conversion efficiency was found also in Photoelectric conversion elements 36 and 37 using two kinds of dyes. And, Photoelectric conversion element 40 exhibited improvement in Short-circuit current density, Open-circuit voltage and Photoelectric conversion efficiency compared with Photoelectric conversion element 41.

It was found that the other Photoelectric conversion elements of the present invention similarly showed longer absorption wavelength. This is considered to be a main reason of achieving high conversion efficiency.

What is claimed is:

1. A photoelectric conversion element comprising a pair of opposite electrodes having therebetween:

a semiconductor layer containing a sensitizing dye which is supported by a semiconductor; and a charge transport layer, wherein the sensitizing dye is a compound represented by Formula (1), Formula (1)

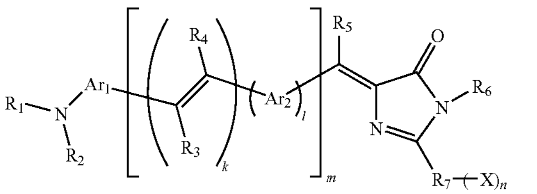

wherein $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that $k+l \geqq 1$, and that when at least one of k and l is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; $R_7$ is a group substituted with X and derived from an alkyl, alkenyl, alkynyl, alkoxy, alkylthio, alkylseleno, amino, aryl or heterocyclic group, provided that $R_7$ may have a substituent other than X; X is an acid group; n is an integer of 1 or more, provided that when $n \geqq 2$; and a plurality of Xs may be the same or different, provided that a cis form and a trans form of a pair of $R_3$ and $R_4$, and a pair of $R_5$ and N in an imidazolone ring with respect to each carbon to carbon double bond are included in Formula (1).

2. The photoelectric conversion element of claim 1, wherein the compound represented by Formula (1) is further represented by Formula (2), Formula (2)

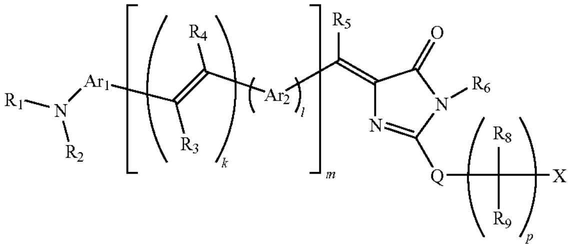

wherein $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that $k+l \geqq 1$, and that when at least one of k and l is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; Q is a sulfur atom, an oxygen atom or a selenium atom; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different; and X is an acid group, provided that a cis form and a trans form of a pair of $R_3$ and $R_4$, and a pair of $R_5$ and N in an imidazolone ring with respect to each carbon to carbon double bond are included in Formula (2).

3. The photoelectric conversion element of claim 2, wherein the compound represented by Formula (2) is further represented by Formula (3), Formula (3)

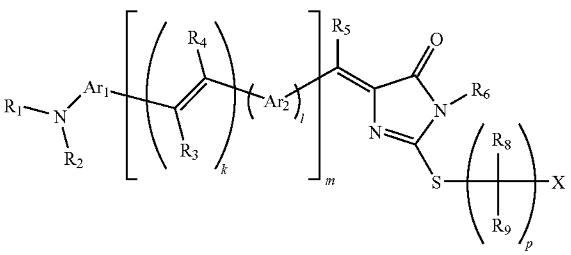

wherein $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that $k+l \geqq 1$, and that when at least one of k and l is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_6$ is a hydrogen atom or a substituted or unsubstituted alkyl, alkenyl, alkynyl, aryl or heterocyclic group; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different; and X is an acid group, provided that a cis form and a trans form of a pair of $R_3$ and $R_4$, and a pair of $R_5$ and N in an imidazolone ring with respect to each carbon to carbon double bond are included in Formula (3).

4. The photoelectric conversion element of claim 3, wherein the compound represented by Formula (3) is further represented by Formula (4), Formula (4)

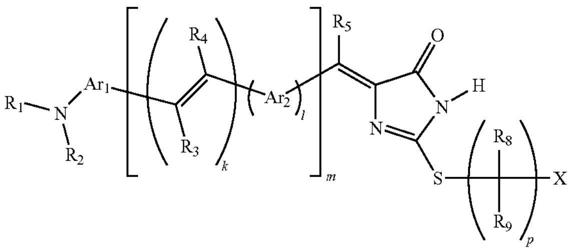

wherein $Ar_1$ and $Ar_2$ are each independently a substituted or unsubstituted arylene or heterocyclic group; $R_1$ and $R_2$ are each independently a substituted or unsubstituted alkyl, alkenyl, alkynyl, aryl or heterocyclic group, provided that $R_1$, $R_2$ and $Ar_1$ may be combined to form a ring; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; k and l are each independently an integer of 0 or more, provided that $k+l \geqq 1$, and that when at least one of k and l is 2 or more, a plurality of $R_3$s, $R_4$s and $Ar_2$s may be the same or different; m is an integer of 1 or more, and when $m \geqq 2$, a plurality of $R_3$s, $R_4$s and $Ar_2$s may be the same or different; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different; and X is an acid group, provided that a cis form and a trans form of a pair of $R_3$ and $R_4$, and a pair of $R_5$ and N in an imidazolone ring with respect to each carbon to carbon double bond are included in Formula (4).

5. The photoelectric conversion element of claim 4, wherein the compound represented by Formula (4) is further represented by Formula (5), Formula (5)

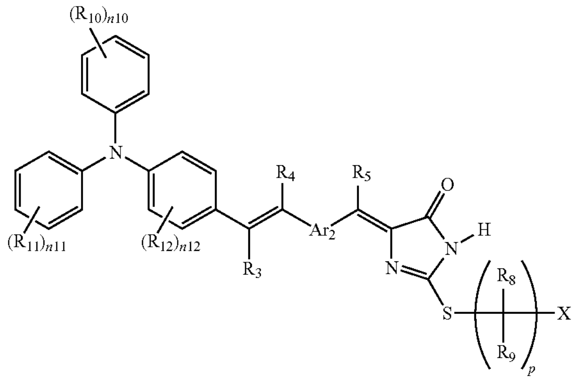

wherein $R_{10}$, $R_{11}$ and $R_{12}$ are each independently a hydrogen atom, a halogen atom, a substituted or unsubstituted alkyl, alkenyl, alkynyl, alkoxy, alkylthio, alkylseleno, amino, aryl or heterocyclic group; n10 and n11 are each independently an integer of 1 to 5, and n12 is an integer of 1 to 4, provided that when $n10 \geqq 2$, $n11 \geqq 2$, and $n12 \geqq 2$, a plurality of $R_{10}$s, $R_{11}$s and $R_{12}$s may be the same or different; $Ar_2$ is a substituted or unsubstituted arylene or heterocyclic group; $R_3$, $R_4$ and $R_5$ are each independently a hydrogen atom, a halogen atom, a cyano group, a substituted or unsubstituted alkyl, alkenyl, alkynyl, alkoxy, amino, aryl or heterocyclic group; $R_8$ and $R_9$ are each independently a hydrogen atom, a halogen atom, a hydroxyl group, a thiol group, a cyano group, a substituted or unsubstituted alkyl, alkenyl, alkynyl, alkoxy, amino, aryl or heterocyclic group, provide that $R_8$ and $R_9$ may be combined to form a ring; p is an integer of 0 or more, provided that when $p \geqq 2$, a plurality of $R_8$s and $R_9$s may be the same or different; and X is an acid group, provided that a cis form and a trans form of a pair of $R_3$ and $R_4$, and a pair of $R_5$ and N in an imidazolone ring with respect to each carbon to carbon double bond are included in Formula (5).

6. The photoelectric conversion element of claim 1, wherein the semiconductor layer contains a plurality of compounds represented by Formula (1).

7. The photoelectric conversion element of claim 1, wherein the semiconductor contained in the semiconductor layer is titanium oxide.

8. A solar cell comprising the photoelectric conversion element of claim 1.

* * * * *